(12) United States Patent
Lee et al.

(10) Patent No.: US 11,203,607 B2
(45) Date of Patent: Dec. 21, 2021

(54) ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

(71) Applicant: Samsung Electronics Co., Ltd., Suwon-si (KR)

(72) Inventors: Jiyoun Lee, Anyang-si (KR); Bumwoo Park, Hwaseong-si (KR); Sunyoung Lee, Seoul (KR); Jungin Lee, Seoul (KR); Kyuyoung Hwang, Anyang-si (KR); Yoonhyun Kwak, Seoul (KR); Whail Choi, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 253 days.

(21) Appl. No.: 16/139,700

(22) Filed: Sep. 24, 2018

(65) Prior Publication Data
US 2019/0100545 A1 Apr. 4, 2019

(30) Foreign Application Priority Data
Sep. 29, 2017 (KR) .......................... 10-2017-0127763

(51) Int. Cl.
*C07F 15/00* (2006.01)
*C07F 1/12* (2006.01)
(Continued)

(52) U.S. Cl.
CPC ............ *C07F 15/0086* (2013.01); *C07F 1/12* (2013.01); *C07F 15/006* (2013.01);
(Continued)

(58) Field of Classification Search
None
See application file for complete search history.

(56) References Cited

U.S. PATENT DOCUMENTS 9,306,178 B2   4/2016   Che et al.
10,147,893 B2  12/2018  Lee et al.
(Continued)

FOREIGN PATENT DOCUMENTS

CN   106939024 A       7/2017
EP     3205659 A1 *   8/2017
(Continued)

*Primary Examiner* — Jay Yang
(74) *Attorney, Agent, or Firm* — Cantor Colburn LLP

(57) ABSTRACT

An organometallic compound represented by Formula 1:

Formula 1

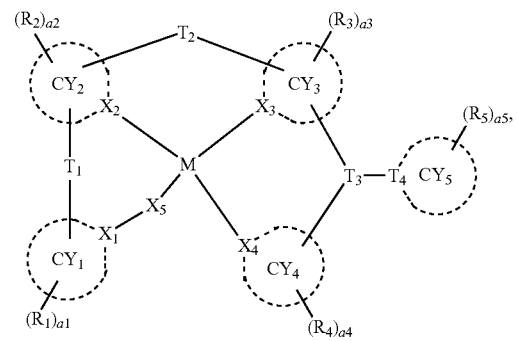

wherein, in Formula 1, groups and variables are the same as described in the specification.

13 Claims, 1 Drawing Sheet

(51) Int. Cl.
 *H01L 51/00* (2006.01)
 *H01L 51/50* (2006.01)
(52) U.S. Cl.
 CPC ...... *H01L 51/0087* (2013.01); *H01L 51/0091* (2013.01); *H01L 51/5012* (2013.01); *H01L 51/5092* (2013.01); *H01L 51/5096* (2013.01); H01L 51/0081 (2013.01); H01L 51/5016 (2013.01); H01L 51/5056 (2013.01); H01L 51/5072 (2013.01)

(56) References Cited

U.S. PATENT DOCUMENTS

| | | |
|---|---|---|
| 2006/0134461 A1 | 6/2006 | Huo et al. |
| 2015/0115250 A1 | 4/2015 | Ma et al. |
| 2016/0181551 A1* | 6/2016 | Che .................. C07D 401/12 546/4 |

FOREIGN PATENT DOCUMENTS

| | | |
|---|---|---|
| KR | 1020130043459 A | 4/2013 |
| KR | 1020130043460 A | 4/2013 |
| KR | 1020150050383 A | 5/2015 |
| KR | 1020160121369 A | 10/2016 |

* cited by examiner

ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

CROSS-REFERENCE TO RELATED APPLICATION

This application claims priority to Korean Patent Application No. 10-2017-0127763, filed on Sep. 29, 2017, in the Korean Intellectual Property Office, and all the benefits accruing therefrom under 35 U.S.C. § 119, the content of which is incorporated herein in its entirety by reference.

BACKGROUND

1. Field

One or more embodiments relate to an organometallic compound, an organic light-emitting device including the organometallic compound, and a diagnostic composition including the organometallic compound.

2. Description of the Related Art

Organic light-emitting devices (OLEDs) are self-emission devices, which have superior characteristics in terms of a viewing angle, a response time, a brightness, a driving voltage, and a response speed, and which produce full-color images.

A typical organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Meanwhile, luminescent compounds may be used to monitor, sense, or detect a variety of biological materials including cells and proteins. An example of the luminescent compounds includes a phosphorescent luminescent compound.

Various types of organic light emitting devices are known. However, there still remains a need in OLEDs having low driving voltage, high efficiency, high brightness, and long lifespan.

SUMMARY

Aspects of the present disclosure provide an organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments.

An aspect of the present disclosure provides an organometallic compound represented by Formula 1:

Formula 1

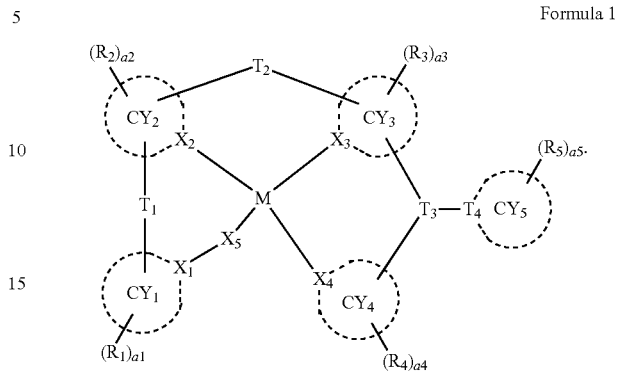

In Formula 1, M may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), $X_1$ to $X_4$ may each independently be C or N, $X_5$ may be O, S, B(R'), N(R'), P(R'), C(R')(R''), Si(R')(R''), Ge(R')(R''), C(=O), B(R')(R''), N(R')(R''), or P(R')(R''), two bonds selected from a bond between $X_2$ and M, a bond between $X_3$ and M, and a bond between $X_4$ and M may each be a coordinate bond, and the other thereof may be a covalent bond, a bond between $X_5$ and M may be a covalent bond, rings $CY_1$ to $CY_5$ may each independently be selected from a $C_5$-$C_{30}$ carbocyclic group and a $C_1$-$C_{30}$ heterocyclic group, a moiety represented by

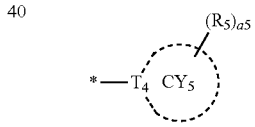

in Formula 1 may have an asymmetric structure with respect to an axis linking $T_3$ and $T_4$ in Formula 1, $T_1$ may be selected from a single bond, a double bond, *—N[(L$_{61}$)$_{a61}$—(R$_{61}$)]—*', *—B(R$_{61}$)—*', *—P(R$_{61}$)—*', *—C(R$_{61}$)(R$_{62}$)—*', *—Si(R$_{61}$)(R$_{62}$)—*', *—Ge(R$_{61}$)(R$_{62}$)—*', *—S—*', *—Se—*', *—O—*', *—C(=O)—*', *—S(=O)—*', *—S(=O)$_2$-*', *—C(R$_{61}$)=*', *=C(R$_{61}$)—*', *—C(R$_{61}$)=C(R$_{62}$)—*', *—C(=S)—*', and *—C≡C—*', $T_2$ may be selected from a single bond, a double bond, *—N[(L$_{63}$)$_{a63}$—(R$_{63}$)]—*', *—B(R$_{63}$)—*', *—P(R$_{63}$)—*', *—C(R$_{63}$)(R$_{64}$)—*', *—Si(R$_{63}$)(R$_{64}$)—*', *—Ge(R$_{63}$)(R$_{64}$)—*', *—S—*', *—Se—*', *—O—*', *—C(=O)—*', *—S(=O)—*', *—S(=O)$_2$-*', *—C(R$_{63}$)=*', *=C(R$_{63}$)—*', *—C(R$_{63}$)=C(R$_{64}$)—*, *—C(=S)—*', and *—C≡C—*', $T_3$ may be N, B, or P, $T_4$ may be C, N, B, or P, $L_{61}$ and $L_{63}$ may each independently be selected from a single bond, a substituted or unsubstituted $C_5$-$C_{30}$ carbocyclic group, and a substituted or unsubstituted $C_1$-$C_{30}$ heterocyclic group, a61 and a63 may each independently be an integer from 1 to 3, wherein, when a61 is two or more, two or more groups $L_{61}$ may be identical to or different from each other, when a63 is two or more, two or more groups $L_{63}$ may be identical to or different from each other, $R_{61}$ and $R_{62}$ may optionally be linked via a single bond, a double bond, or a first linking group to form a substituted or unsubstituted $C_5$-$C_{30}$ carbocyclic group or a substituted or unsubstituted $C_1$-$C_{30}$ heterocyclic group, and $R_{63}$ and $R_{64}$ may optionally be linked via a single bond, a double bond, or a first linking group to form a substituted or unsubstituted $C_5$-$C_{30}$ carbocyclic group or a substituted or unsubstituted $C_1$-$C_{30}$ heterocyclic group, $R_1$ to $R_5$, $R_{61}$ to $R_{64}$, R', and R" may each independently be selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), wherein $R_2$ and $R_3$ are not linked with each other, $R_3$ and $R_5$ are not linked with each other, and $R_4$ and $R_5$ are not linked with each other, a1 to a5 may each independently be an integer from 0 to 20, two of a plurality of neighboring groups $R_1$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_2$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_3$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_4$ may optionally be linked to form a substituted or unsubstituted $C_5$-$C_{30}$ carbocyclic group or a substituted or unsubstituted $C_1$-$C_{30}$ heterocyclic group, $R_1$ and $R_2$ may optionally be linked to form a substituted or unsubstituted $C_5$-$C_{30}$ carbocyclic group or a substituted or unsubstituted $C_1$-$C_{30}$ heterocyclic group,

* and *' each indicate a binding site to a neighboring atom, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkylheteroaryl group, the substituted monovalent non-aromatic condensed polycyclic group, and the substituted monovalent non-aromatic condensed heteropolycyclic group may be selected from:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(=O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, and a monovalent non-aromatic condensed heteropolycyclic group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, and a monovalent non-aromatic condensed heteropolycyclic group.

Another aspect of the present disclosure provides an organic light-emitting device including:

a first electrode;

a second electrode; and an organic layer disposed between the first electrode and the second electrode, wherein the organic layer includes an emission layer, and wherein the organic layer includes at least one organometallic compound.

The organometallic compound in the organic layer may act as a dopant.

Another aspect of the present disclosure provides a diagnostic composition including at least one organometallic compound represented by Formula 1.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
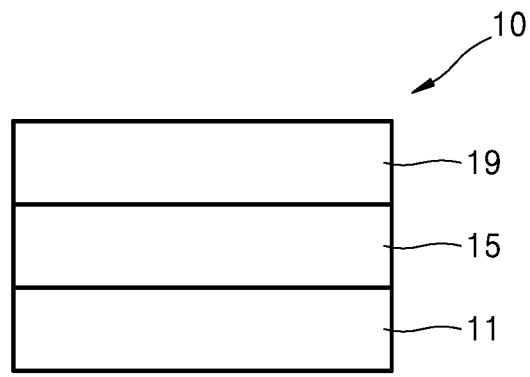
FIG. 1 is a schematic view of an organic light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In an embodiment, an organometallic compound is provided. The organometallic compound according to an embodiment is represented by Formula 1 below:

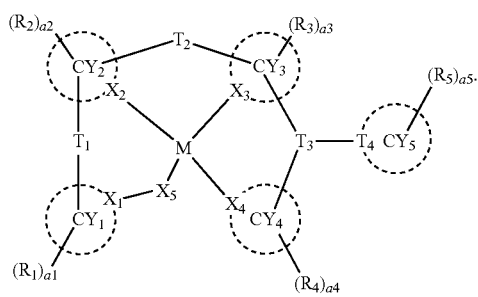

Formula 1

M in Formula 1 may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au).

For example, M may be Pt, Pd, or Au, but embodiments of the present disclosure are not limited thereto.

$X_1$ to $X_4$ in Formula 1 may each independently be C or N.

For example, $X_1$ may be C.

In an embodiment, in Formula 1,
i) $X_2$ and $X_3$ may each be N, and $X_4$ may be C; or
ii) $X_2$ and $X_4$ may each be N, and $X_3$ may be C, but embodiments of the present disclosure are not limited thereto.

$X_5$ in Formula 1 may be O, S, B(R'), N(R'), P(R'), C(R')(R''), Si(R')(R''), Ge(R')(R''), C(=O), B(R')(R''), N(R')(R''), or P(R')(R'').

For example, $X_5$ may be O or S, but embodiments of the present disclosure are not limited thereto.

In Formula 1, two bonds selected from a bond between $X_2$ and M, a bond between $X_3$ and M, and a bond between $X_4$ and M may each be a coordinate bond, the other thereof may be a covalent bond, and a bond between $X_5$ and M may be a covalent bond. Therefore, the organometallic compound represented by Formula 1 may be electrically neutral.

For example, in Formula 1,
i) the bond between $X_2$ and M and the bond between $X_3$ and M may each be a coordinate bond, and the bond between $X_4$ and M may be a covalent bond; or
ii) the bond between $X_2$ and M and the bond between $X_4$ and M may each be a coordinate bond, and the bond between $X_3$ and M may be a covalent bond, but embodiments of the present disclosure are not limited thereto.

In Formula 1, ring $CY_1$ to ring $CY_5$ may each independently be selected from a $C_5$-$C_{30}$ carbocyclic group and a $C_1$-$C_{30}$ heterocyclic group.

For example, ring $CY_1$ to ring $CY_5$ may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborol group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-on group, a dibenzothiophene 5,5-dioxide group, an azaindole group, an azabenzoborol group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-on group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

In an embodiment, ring $CY_1$ to ring $CY_5$ may each independently be selected from i) a first ring, ii) a second ring, iii) a condensed ring condensed with two or more second rings, and iv) a condensed ring condensed with at least one first ring and at least one second ring.

The first ring may be selected from a cyclopentadiene group, a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group and a triazasilole group.

The second ring may be selected from an adamantane group, a norbornane group, a norbornene group, a cyclohexane group, a cyclohexene group, a benzene group, a pyridine group, a pyrimidine group, a pyrazine group, a pyridazine group, and a triazine group, but embodiments of the present disclosure are not limited thereto.

A moiety represented by

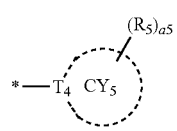

in Formula 1 has an asymmetric structure with respect to an axis connecting $T_3$ and $T_4$. For example, a moiety represented by

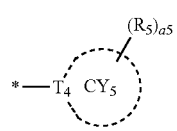

in Formula 1 may have an asymmetric structure with respect to an axis connecting $T_3$ and $T_4$ by having a ring $CY_5$ having an asymmetric structure with respect to an axis connecting $T_3$ and $T_4$. Alternatively, a moiety represented by

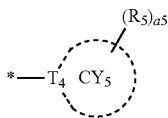

in Formula 1 may have i) a ring $CY_5$ having a symmetrical structure with respect to an axis connecting $T_3$ and $T_4$ and ii) at least one $R_5$ which makes a moiety represented by

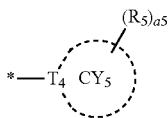

in Formula 1 an asymmetric structure with respect to an axis connecting $T_3$ and $T_4$, and thus, a moiety represented by

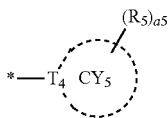

in Formula 1 may have an asymmetric structure with respect to an axis connecting $T_3$ and $T_4$.

For example, the moiety represented by

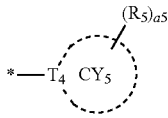

in Formula 1 does not have the following symmetrical structure:

Symmetrical Structure

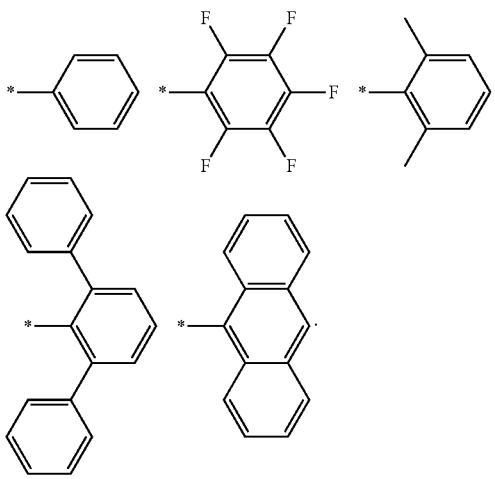

In Formula 1, $T_1$ may be selected from a single bond, a double bond, *—N[$(L_{61})_{a61}$—$(R_{61})$]—*', *—B($R_{61}$)—*', *—P($R_{61}$)—*', *—C($R_{61}$)($R_{62}$)—*', *—Si($R_{61}$)($R_{62}$)—*', *—Ge($R_{61}$)($R_{62}$)—*', *—S—*', *—Se—*', *—O—*', *—C(=O)—*', *—S(=O)—*', *—S(=O)$_2$—*', *—C($R_{61}$)=*', *=C($R_{61}$)—*', C($R_{61}$)=C($R_{62}$)—*', *—C(=S)—*', and *—C≡C—*', and $T_2$ may be selected from a single bond, a double bond, *—N[$(L_{63})_{a63}$—$(R_{63})$]—*', *—B($R_{63}$)—*', *—P($R_{63}$)—*', *—C($R_{63}$)($R_{64}$)—*', *—Si($R_{63}$)($R_{64}$)—*', *—Ge($R_{63}$)($R_{64}$)—*', *—S—*', *—Se—*', *—O—*', *—C(=O)—*', *—S(=O)—*', *—S(=O)$_2$—*', *—C($R_{63}$)=*', *=C($R_{63}$)—*', *—C($R_{63}$)=C($R_{64}$)—*', *—C(=S)—*',* and *—C≡C—*'.

$R_{61}$ and $R_{62}$ may optionally be linked via a single bond, a double bond, or a first linking group to form a substituted or unsubstituted $C_5$-$C_{30}$ carbocyclic group or a substituted or unsubstituted $C_1$-$C_{30}$ heterocyclic group, and $R_{63}$ and $R_{64}$ may optionally be linked via a single bond, a double bond, or a first linking group to form a substituted or unsubstituted $C_5$-$C_{30}$ carbocyclic group or a substituted or unsubstituted $C_1$-$C_{30}$ heterocyclic group. For example, the first linking group may be selected from *—N($R_9$)—*', *—B($R_9$)—*', *—P($R_9$)—*', *—C($R_9$)($R_{10}$)—*', *—Si($R_9$)($R_{10}$)—*', *—Ge($R_9$)($R_{10}$)—*', *—S—*', *—Se—*', *—O—*', *—C(=O)—*', *—S(=O)—*', *—S(=O)$_2$—*', *—C($R_9$)=*', *=C($R_9$)—*', *—C($R_9$)=C($R_{10}$)—*', *—C(=S)—*', and *—C≡C—*', $R_9$ and $R_{10}$ are the same as described in $R_1$, and * and *' each indicate a binding site to a neighboring atom.

For example, $T_1$ and $T_2$ may each be a single bond.

In Formula 1, $T_3$ may be N, B, or P, and $T_4$ may be C, N, B, or P.

For example, $T_3$ may be N, and $T_4$ may be C, but embodiments of the present disclosure are not limited thereto.

$L_{61}$ and $L_{63}$ may each independently be selected from a single bond, a substituted or unsubstituted $C_5$-$C_{30}$ carbocyclic group, and a substituted or unsubstituted $C_1$-$C_{30}$ heterocyclic group.

For example, $L_{61}$ and $L_{63}$ may each independently be selected from:

a single bond, a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, and a benzothiadiazole group; and a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, and a benzothiadiazole group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_{31}$ to $Q_{39}$ may each independently be selected from:
—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

a61 and a63 each indicate the number of groups $L_{61}$ and groups $L_{63}$, and may each independently be an integer from 1 to 3. When a61 is two or more, two or more groups $L_{61}$ may be identical to or different from each other, and when a63 is two or more, two or more groups $L_{63}$ may be identical to or different from each other.

$R_1$ to $R_5$, $R_{61}$ to $R_{64}$, R', and R" may each independently be selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), wherein $R_2$ and $R_3$ are not linked with each other, $R_3$ and $R_5$ are not linked with each other, and $R_4$ and $R_5$ are not linked with each other. $Q_1$ to $Q_9$ are the same as described above.

For example, $R_1$ to $R_5$, $R_{61}$ to $R_{64}$, R', and R" may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;

a cyclopentyl group, a cyclohexyl group, a cycloheptyl group, a cyclooctyl group, an adamantanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a $C_1$-$C_{20}$ alkylthiophenyl group, a furanyl group, a $C_1$-$C_{20}$ alkylfuranyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a $C_1$-$C_{20}$ alkylthiophenyl group, a furanyl group, a $C_1$-$C_{20}$ alkylfuranyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and
—N(Q$_1$)(Q$_2$), —Si(Q$_3$)(Q$_4$)(Q$_5$), —B(Q$_6$)(Q$_7$), and —P(=O)(Q$_8$)(Q$_9$), and Q$_1$ to Q$_9$ are the same as described above.

In an embodiment, R$_1$ to R$_5$, R$_{61}$ to R$_{64}$, R', and R" may each independently be selected from hydrogen, deuterium, —F, a cyano group, a nitro group, —SF$_5$, —CH$_3$, —CD$_3$, —CD$_2$H, —CDH$_2$, —CF$_3$, —CF$_2$H, —CFH$_2$, groups represented by Formulae 9-1 to 9-19, and groups represented by Formulae 10-1 to 10-226, and a moiety represented by

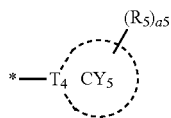

may be selected from groups represented by Formulae 10-14, 10-15, 10-18, 10-21, 10-22, 10-25, 10-28, 10-29, 10-32, 10-35, 10-36, 10-39, 10-42, 10-43, 10-46, 10-49, 10-50, 10-53, 10-56, 10-57, 10-60, 10-63, 10-64, 10-67, 10-70, 10-71, 10-74, 10-79 to 10-87, 10-91, 10-93 to 10-95, 10-98 to 10-101, 10-105, 10-107 to 10-138, 10-140 to 10-149, 10-152, 10-158 to 10-163, 10-166, and 10-169 to 10-226, but embodiments of the present disclosure are not limited thereto:

9-17 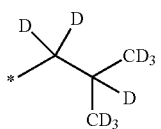
9-18 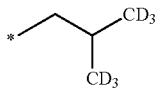
9-19 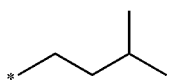
10-1 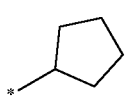
10-2 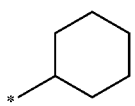
10-3 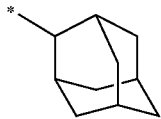
10-4 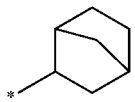
10-5 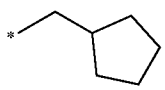
10-6 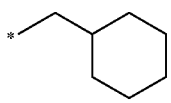
10-7 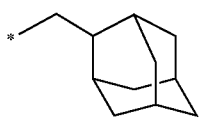
10-8 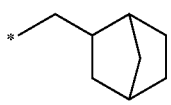
10-9 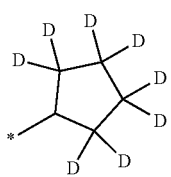
10-10 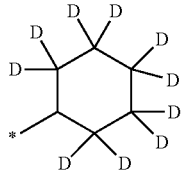
10-11 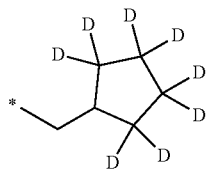
10-12 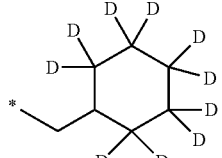
10-13 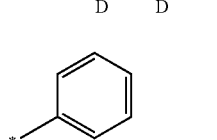
10-14 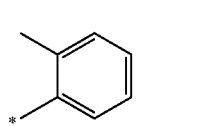
10-15 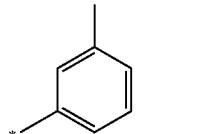
10-16 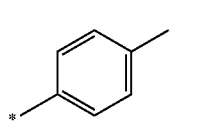
10-17 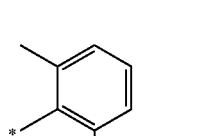
10-18 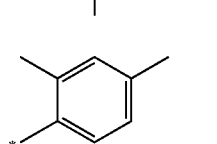
10-19 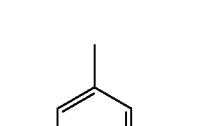

-continued
10-20 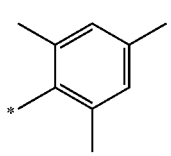
10-21 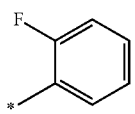
10-22 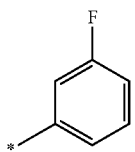
10-23 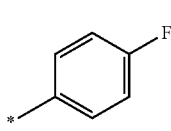
10-24 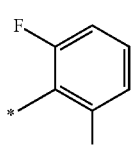
10-25 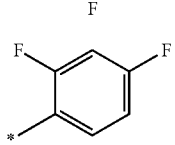
10-26 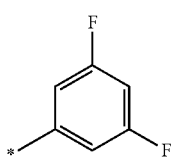
10-27 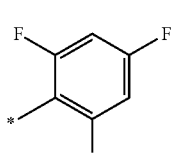
10-28 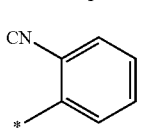
10-29 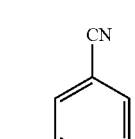
10-30 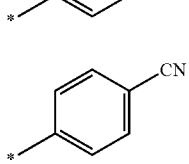
-continued
10-31 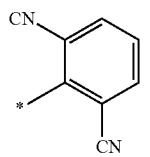
10-32 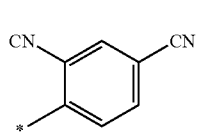
10-33 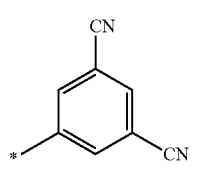
10-34 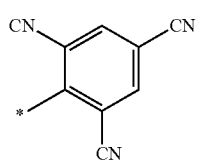
10-35 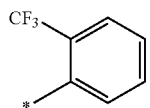
10-36 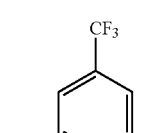
10-37 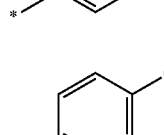
10-38 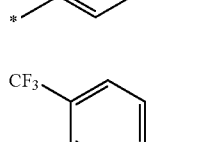
10-39 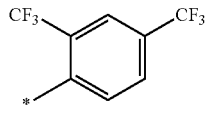
10-40

-continued
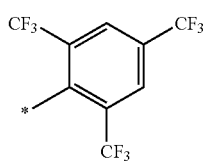
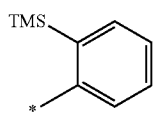
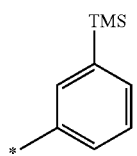
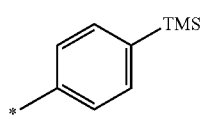
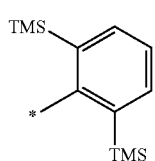
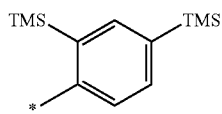
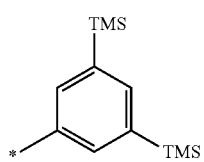
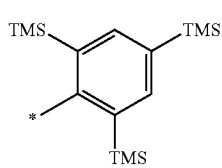
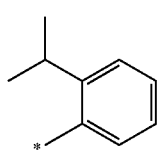
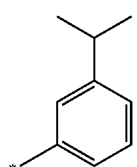
-continued
10-41
10-42
10-43
10-44
10-45
10-46
10-47
10-48
10-49
10-50
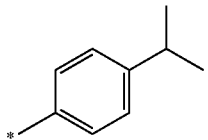
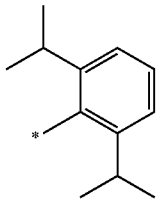
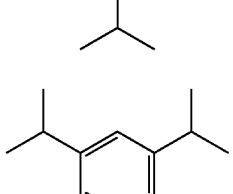
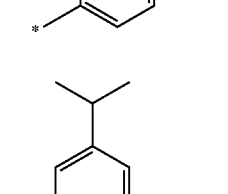
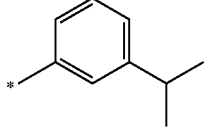
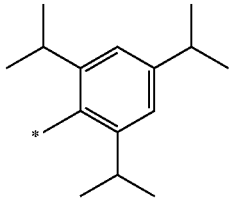
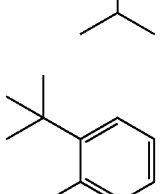
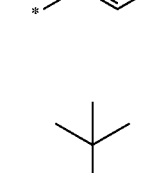
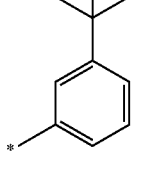
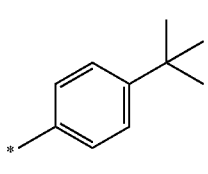
10-51
10-52
10-53
10-54
10-55
10-56
10-57
10-58

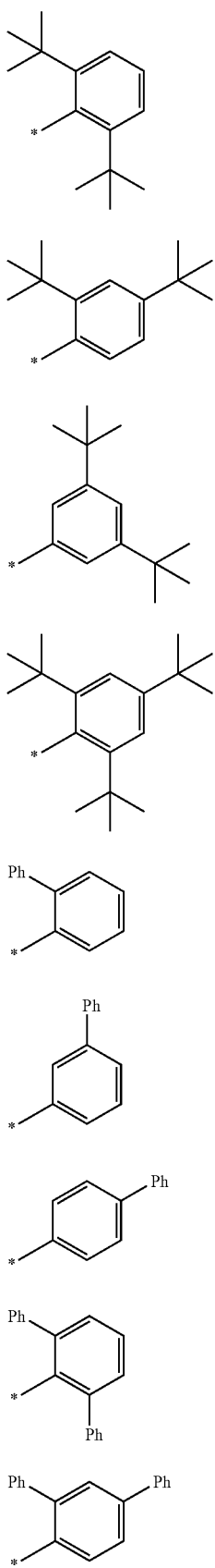
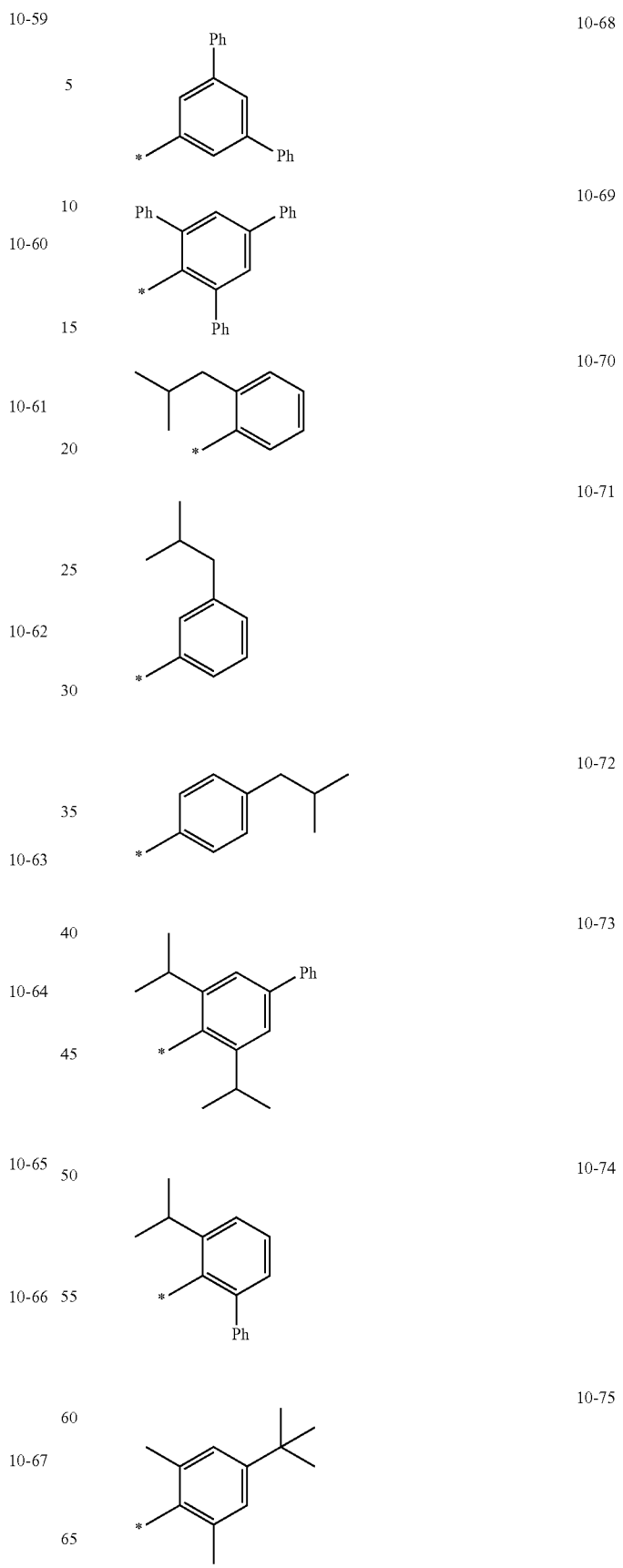

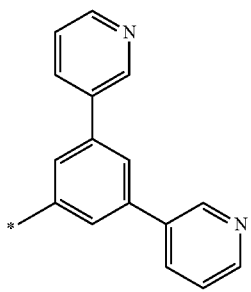
10-76
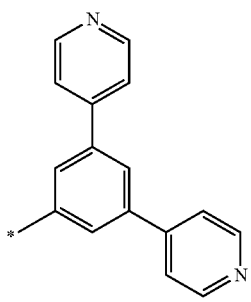
10-77
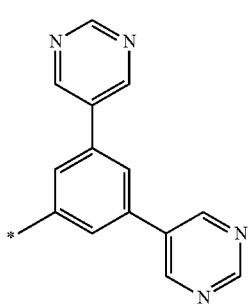
10-78
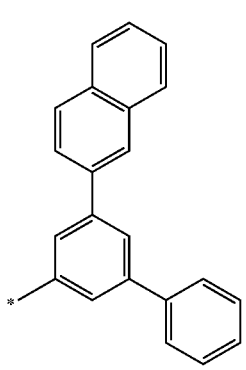
10-79
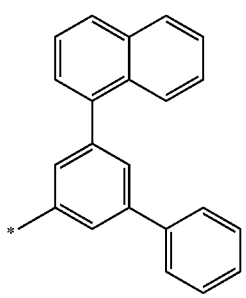
10-80
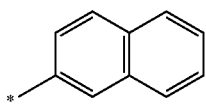
10-81
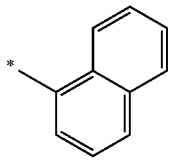
10-82
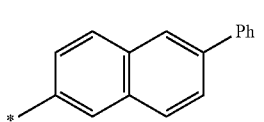
10-83
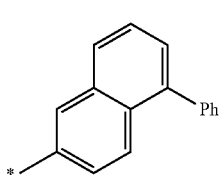
10-84
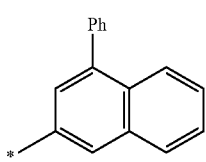
10-85
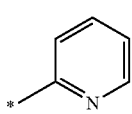
10-86
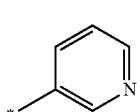
10-87
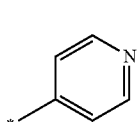
10-88
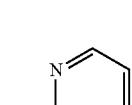
10-89
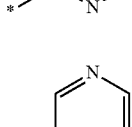
10-90
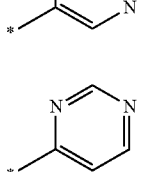
10-91

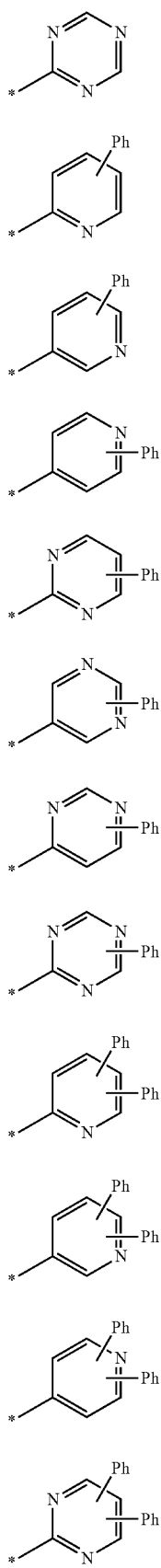
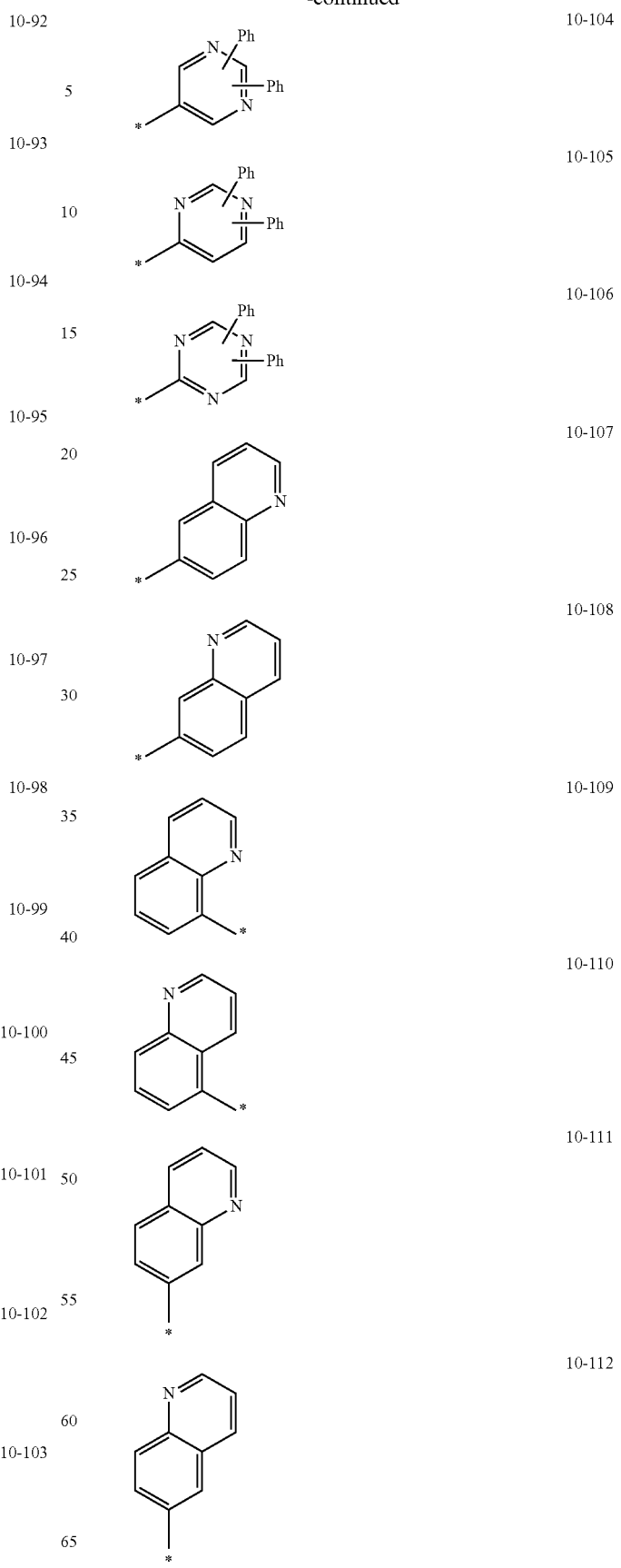

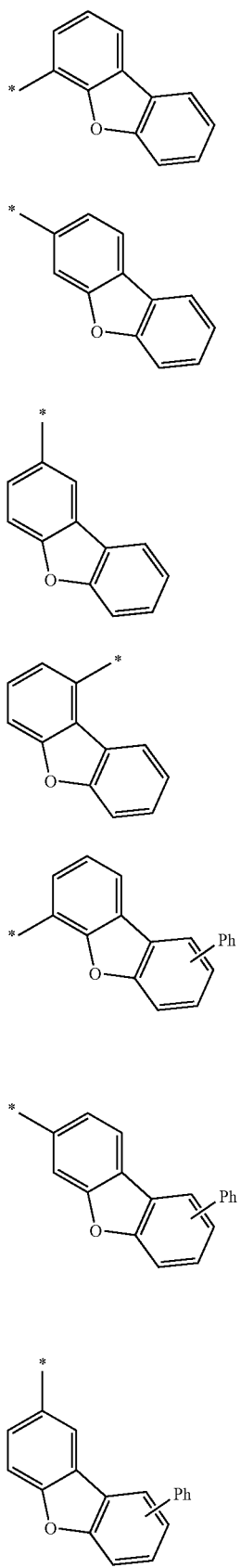
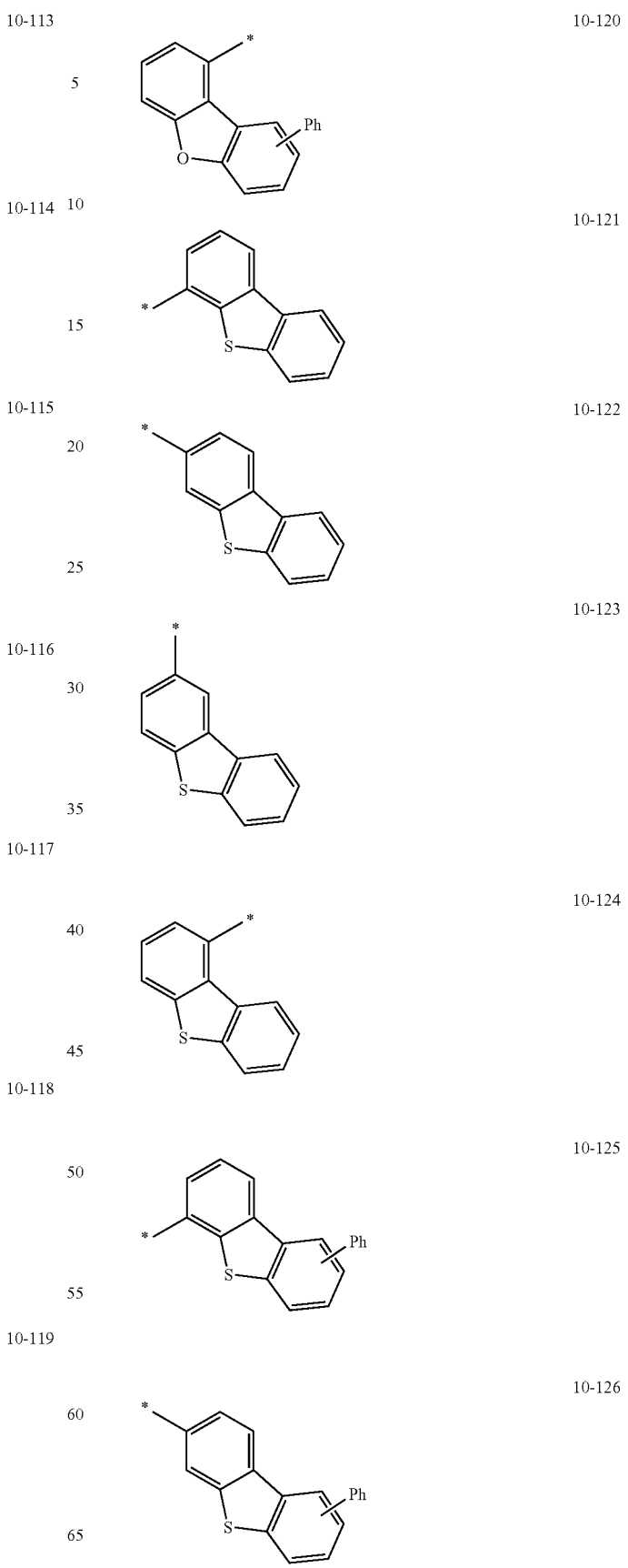

10-127 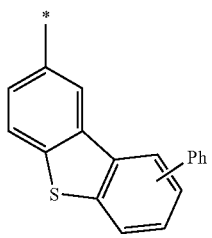
10-128 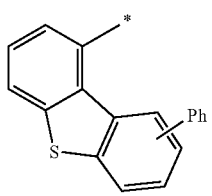
10-129 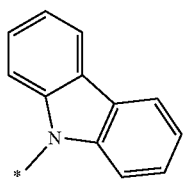
10-130 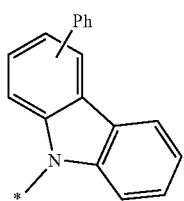
10-131 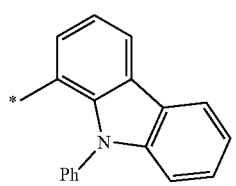
10-132 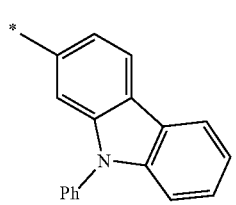
10-133 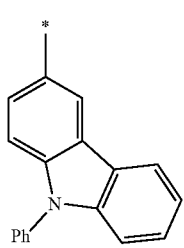
10-134 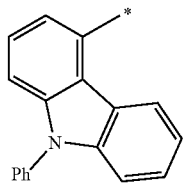
10-135 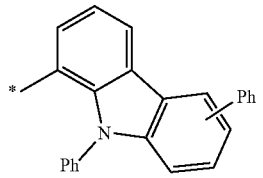
10-136 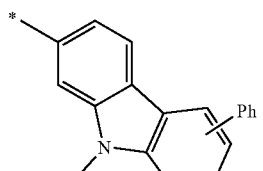
10-137 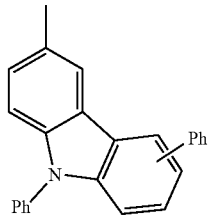
10-138 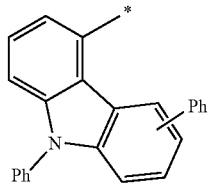
10-139 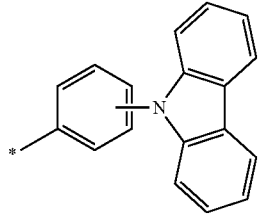
10-140 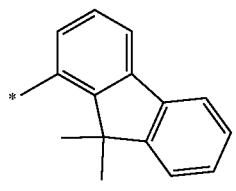

10-141 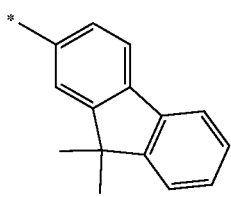
10-142 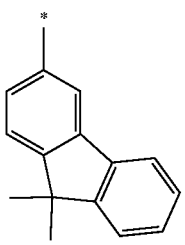
10-143 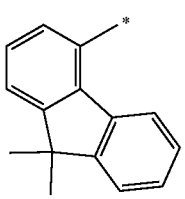
10-144 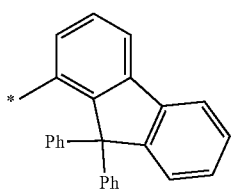
10-145 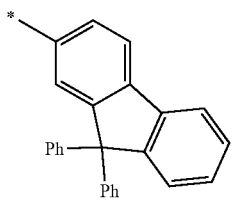
10-146 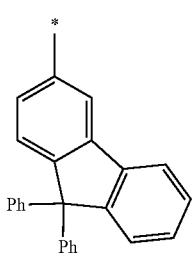
10-147 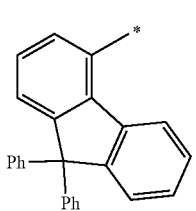
10-148 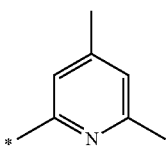
10-149 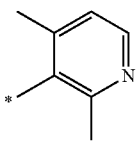
10-150 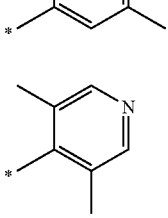
10-151 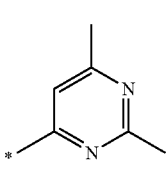
10-152 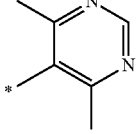
10-153 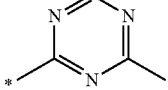
10-154 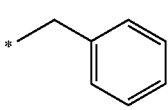
10-155 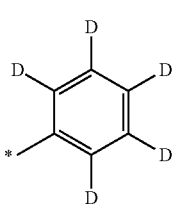
10-156 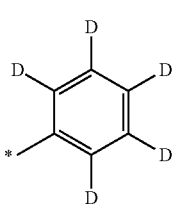

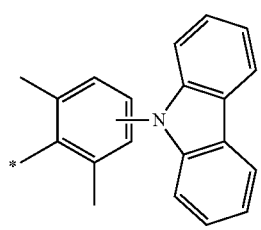
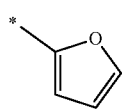 10-157
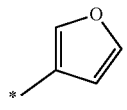 10-158
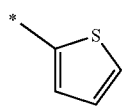 10-159
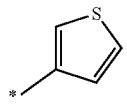 10-160
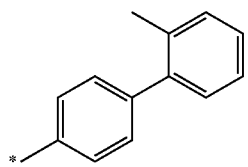 10-161
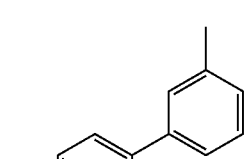 10-162
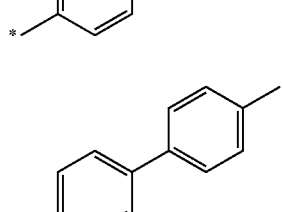 10-163
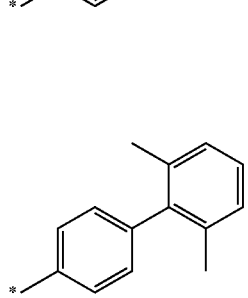 10-164
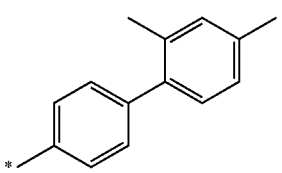 10-165
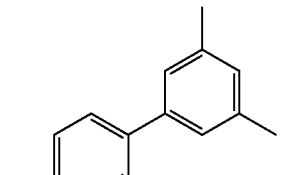 10-166
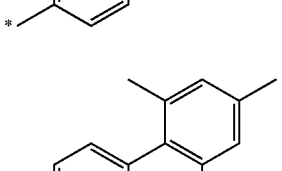 10-167
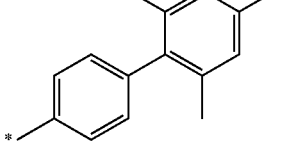 10-168
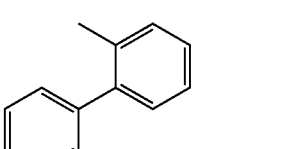 10-169
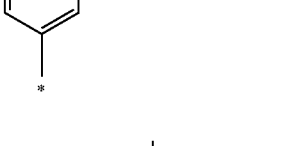 10-170
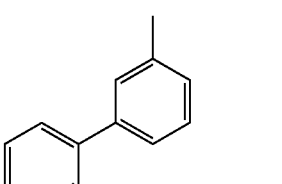 10-171
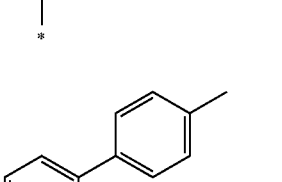 10-172
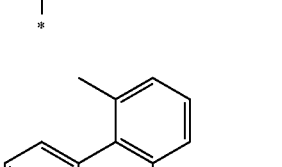

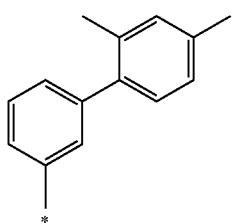
10-174
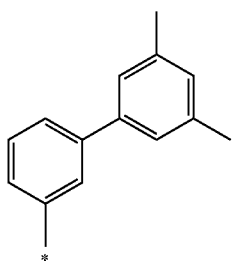
10-175
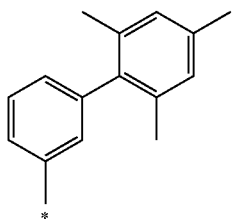
10-176
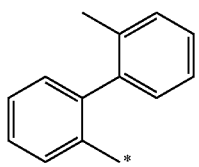
10-177
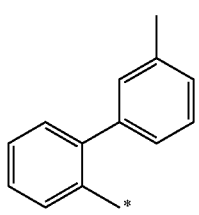
10-178
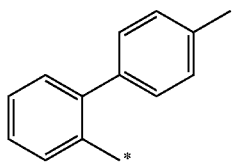
10-179
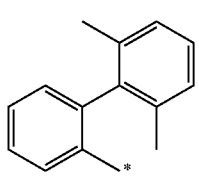
10-173
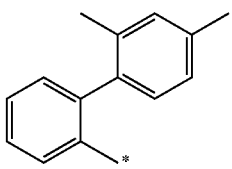
10-174
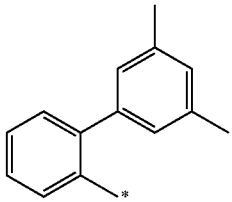
10-175
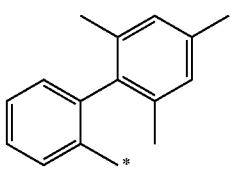
10-176
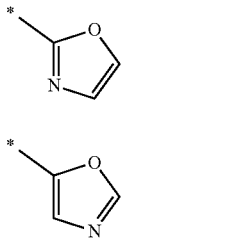
10-177
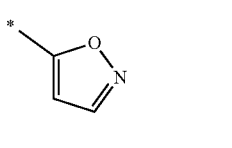
10-178
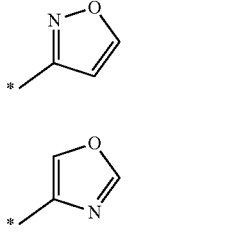
10-179
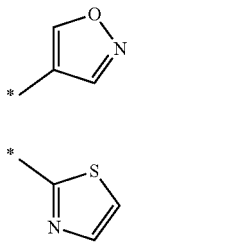
10-180
10-181
10-182
10-183
10-184
10-185
10-186
10-187
10-188
10-189
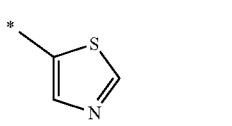
10-190

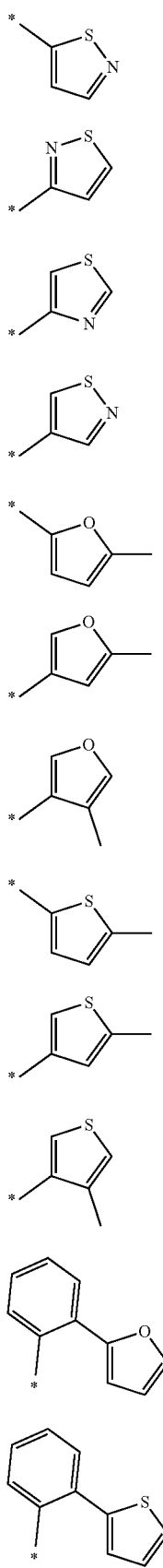
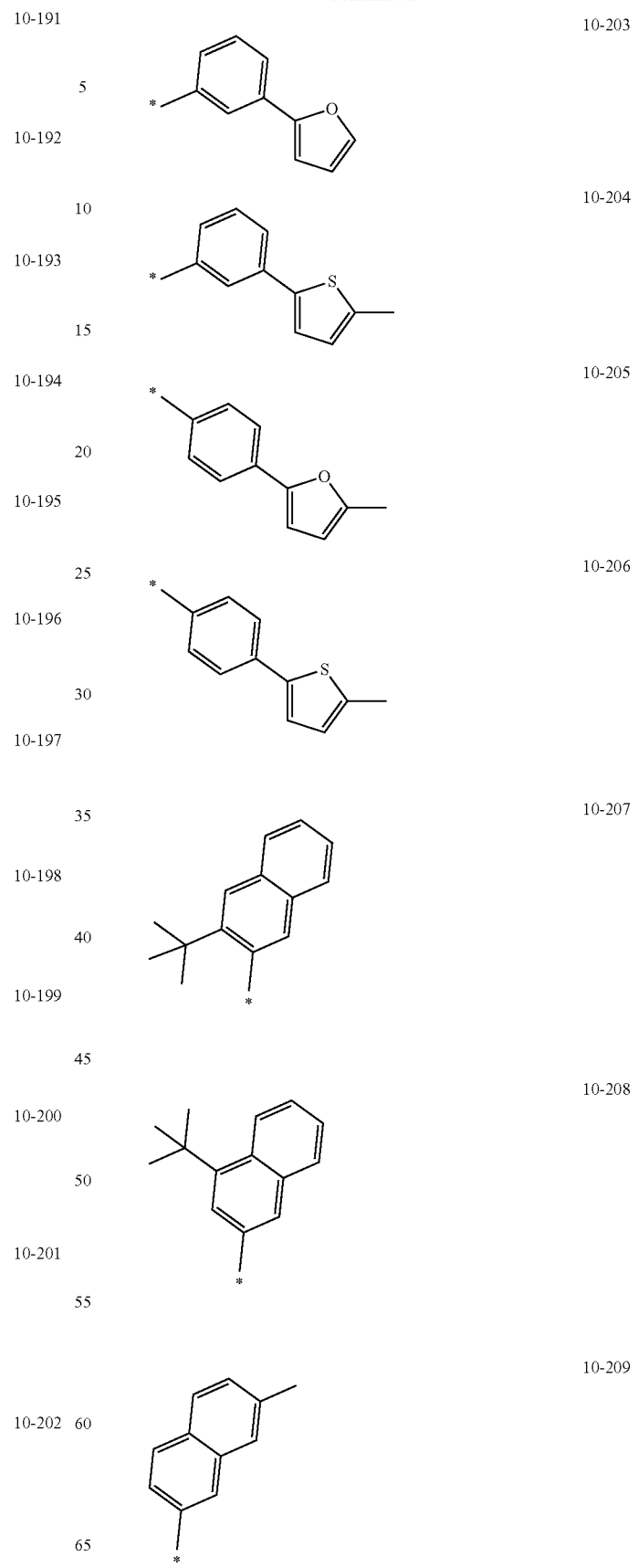

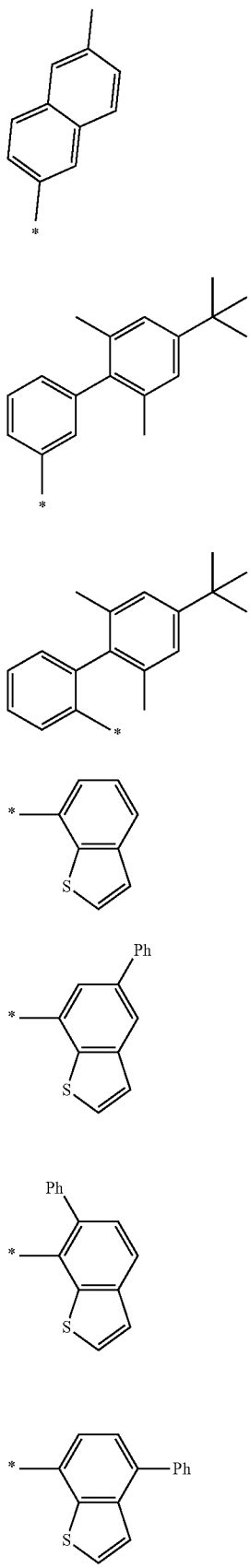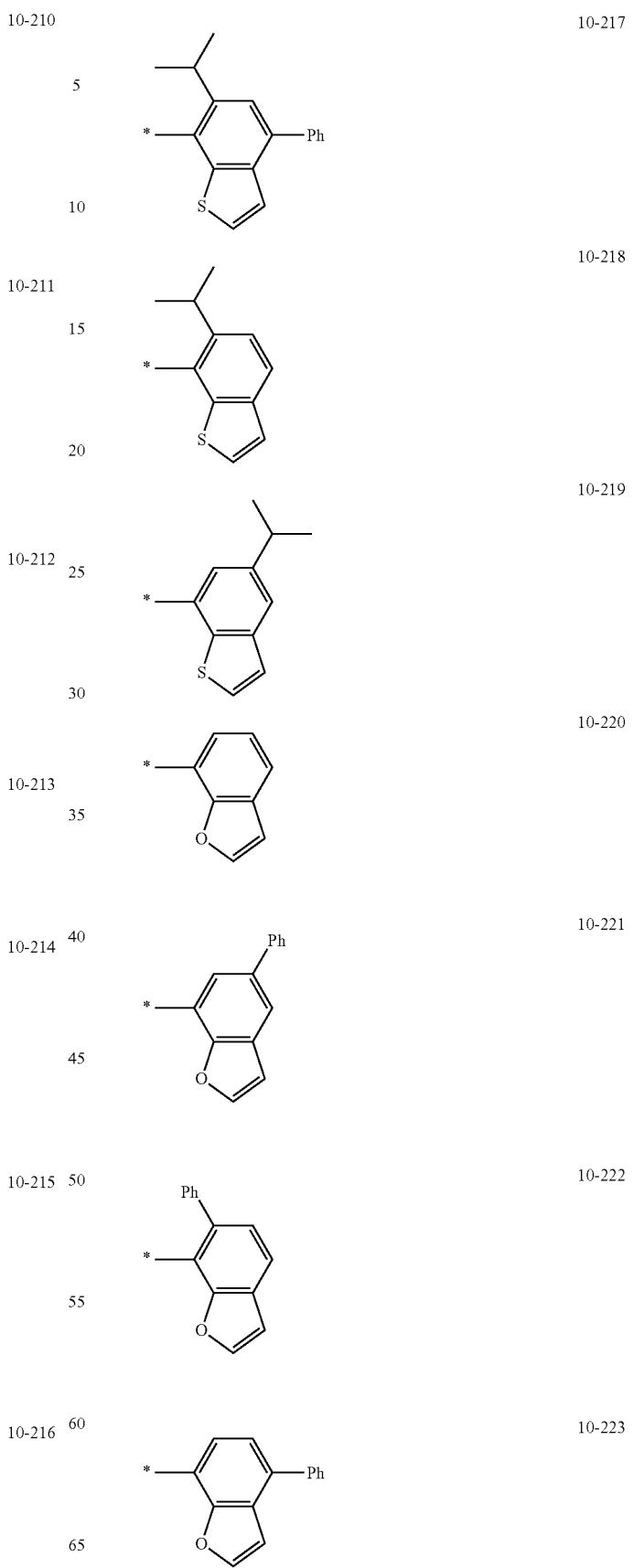

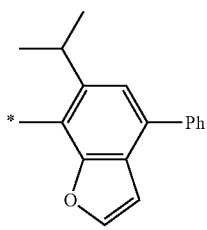
10-224

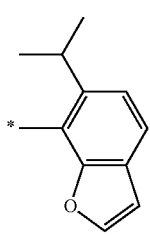
10-225

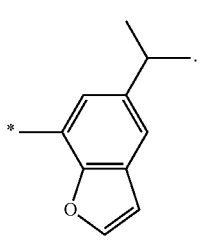
10-226

In Formulae 9-1 to 9-19 and 10-1 to 10-226, * indicates a binding site to a neighboring atom, "Ph" indicates a phenyl group, and "TMS" indicates a trimethylsilyl group.

a1 to a5 each indicate the number of groups $R_1$ to groups $R_5$ and may each independently be an integer from 0 to 20 (for example, an integer from 0 to 5). When a1 is two or more, two or more groups $R_1$ may be identical to or different from each other, when a2 is two or more, two or more groups $R_2$ may be identical to or different from each other, when a3 is two or more, two or more groups $R_3$ may be identical to or different from each other, when a4 is two or more, two or more groups $R_4$ may be identical to or different from each other, and when a5 is two or more, two or more groups $R_5$ may be identical to or different from each other.

In an embodiment, a moiety represented by

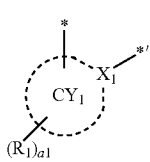

in Formula 1 may be represented by one of Formulae CY1-1 to CY1-25:

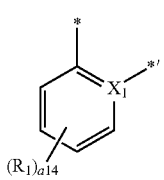
CY1-1

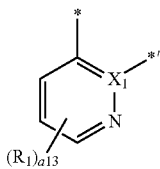
CY1-2

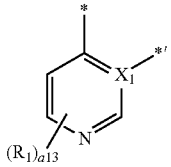
CY1-3

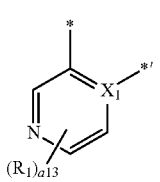
CY1-4

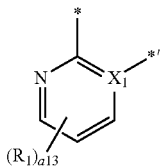
CY1-5

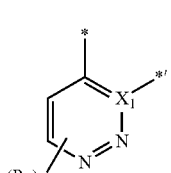
CY1-6

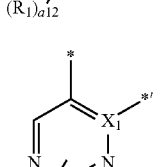
CY1-7

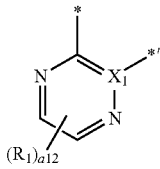
CY1-8

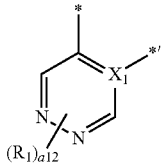
CY1-9

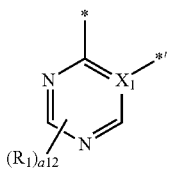
CY1-10

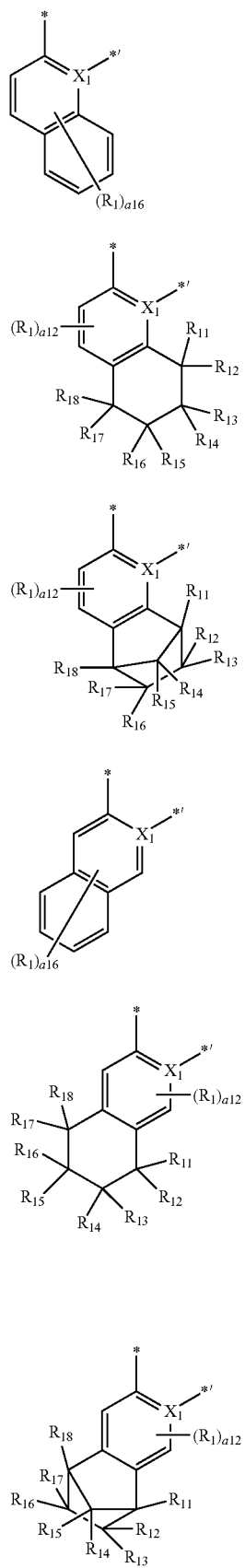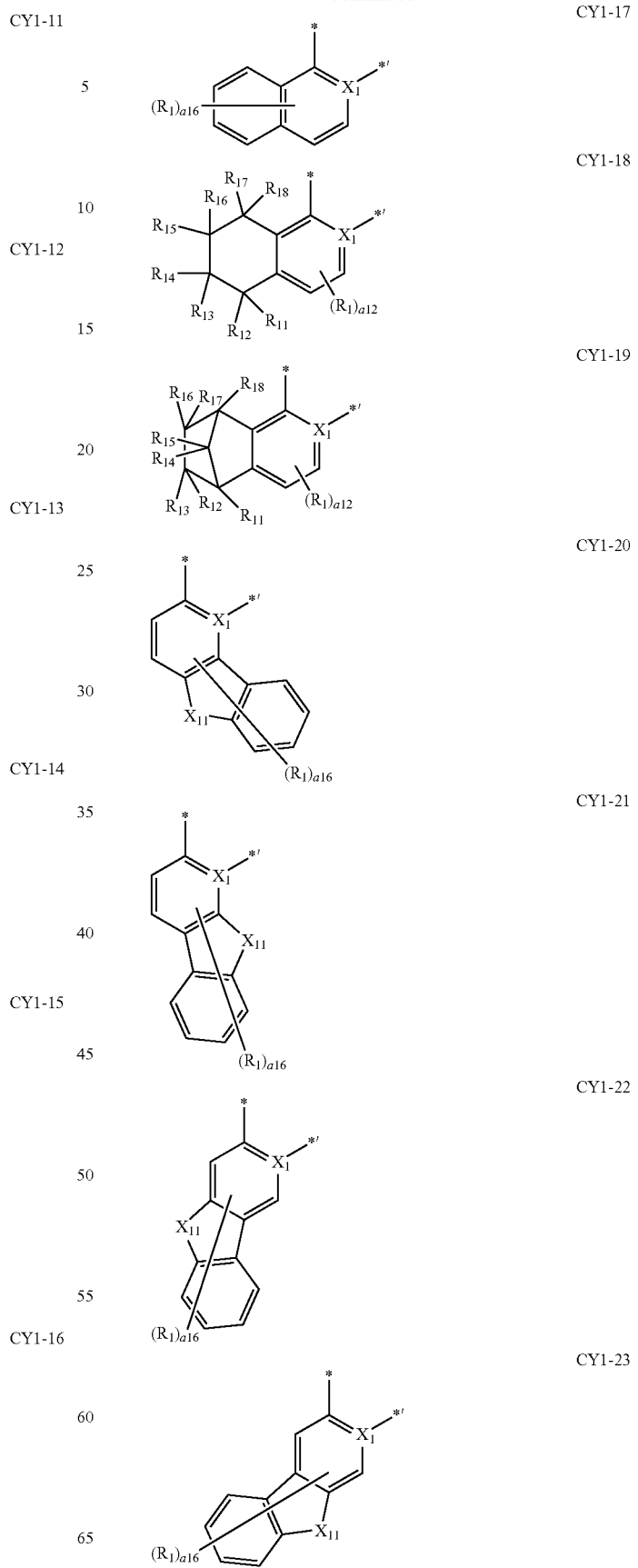

-continued

CY1-24
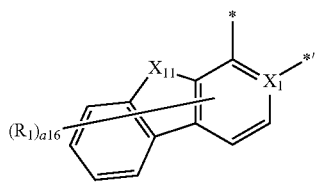

CY1-25
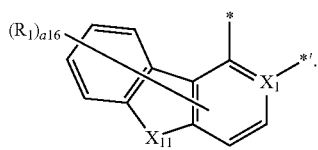

In Formulae CY1-1 to CY1-25, $X_1$ and $R_1$ are the same as described herein, $X_{11}$ may be $C(R_{11})(R_{12})$, $N(R_{11})$, O, S, or $Si(R_{11})(R_{12})$, $R_{11}$ to $R_{18}$ are the same as described above in connection with $R_1$, a16 may be an integer from 0 to 6, a14 may be an integer from 0 to 4, a13 may be an integer from 0 to 3, a12 may be an integer from 0 to 2,

*' indicates a binding site to $X_5$ or M in Formula 1, and

* indicates a binding site to $T_1$ in Formula 1.

In one or more embodiments, a group represented by

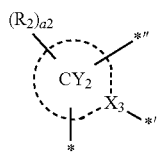

in Formula 1 may be selected from groups represented by Formulae CY2-1 to CY2-29:

CY2-1
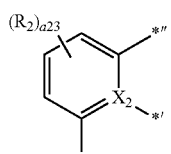

CY2-2
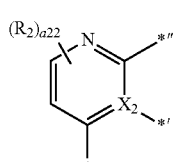

CY2-3
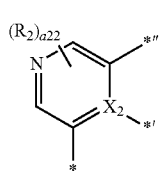

CY2-4
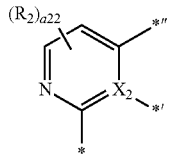

CY2-5
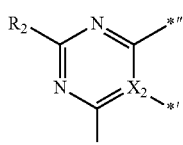

CY2-6
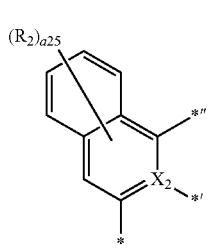

CY2-7
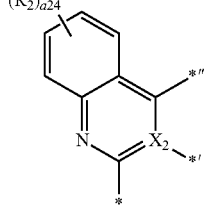

CY2-8
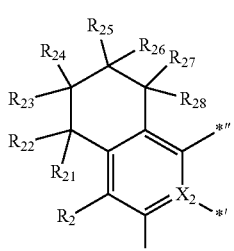

CY2-9
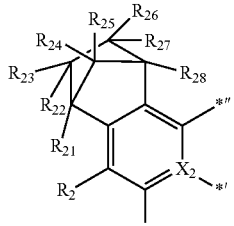

CY2-10
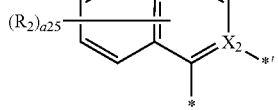

CY2-11
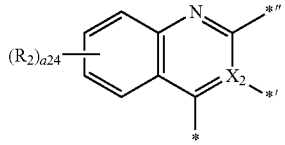

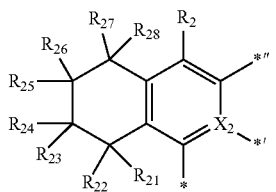 CY2-12
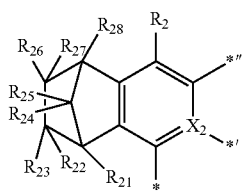 CY2-13
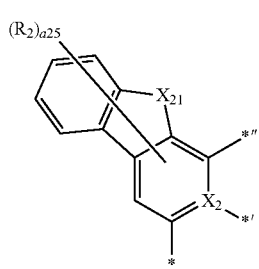 CY2-14
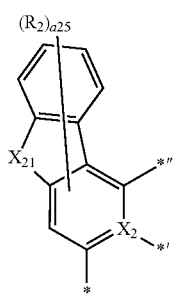 CY2-15
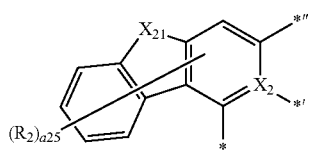 CY2-16
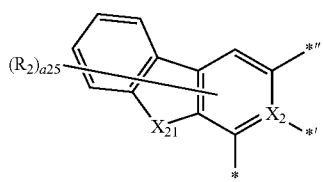 CY2-17
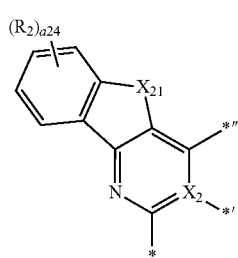 CY2-18
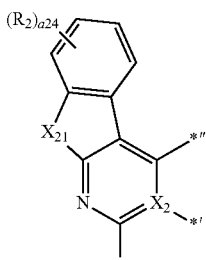 CY2-19
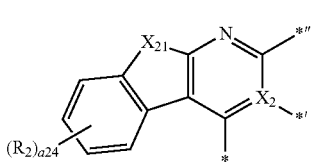 CY2-20
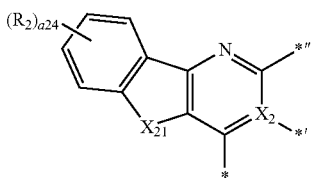 CY2-21
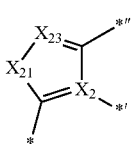 CY2-22
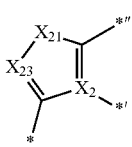 CY2-23
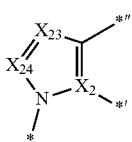 CY2-24
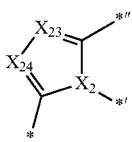 CY2-25
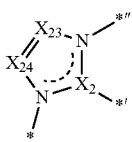 CY2-26
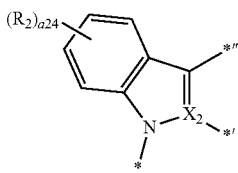 CY2-27

-continued

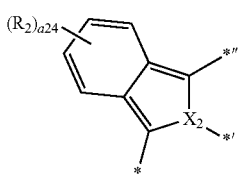
CY2-28

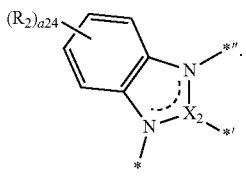
CY2-29

In Formulae CY2-1 to CY2-29,
$X_2$ and $R_2$ are the same as described herein,
$X_{21}$ may be $C(R_{21})(R_{22})$, $N(R_{21})$, O, S, or $Si(R_{21})(R_{22})$,
$X_{23}$ may be $C(R_{23})$ or N,
$X_{24}$ may be $C(R_{24})$ or N,
$R_{21}$ to $R_{28}$ are the same as described above in connection with $R_2$,
a25 may be an integer from 0 to 5,
a24 may be an integer from 0 to 4,
a23 may be an integer from 0 to 3,
a22 may be an integer from 0 to 2,
* indicates a binding site to $T_1$ in Formula 1,
*' indicates a binding site to M in Formula 1, and
*" indicates a binding site to $T_2$ in Formula 1.

In one or more embodiments, a group represented by

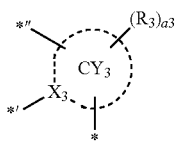

in Formula 1 may be selected from groups represented by Formulae CY3-1 to CY3-29:

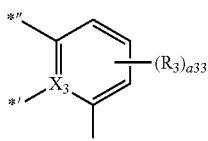
CY3-1

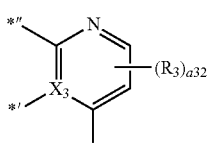
CY3-2

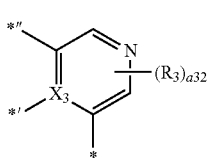
CY3-3

-continued

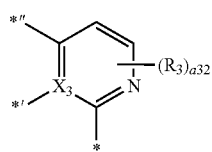
CY3-4

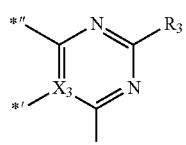
CY3-5

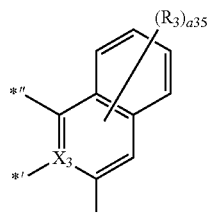
CY3-6

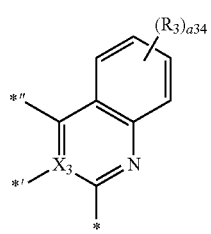
CY3-7

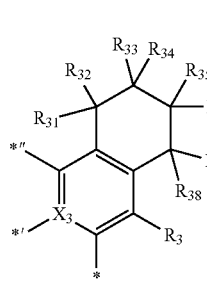
CY3-8

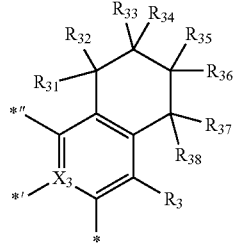
CY3-9

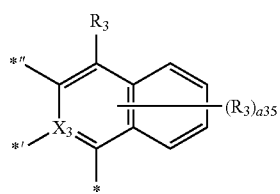
CY3-10

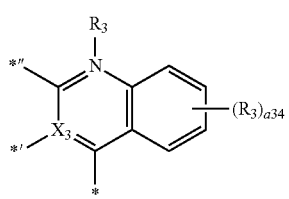
CY3-11
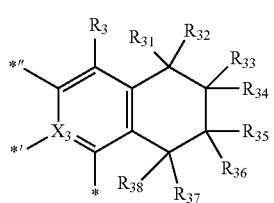
CY3-12
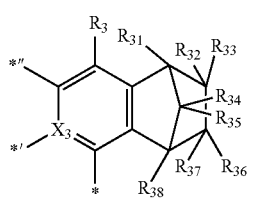
CY3-13
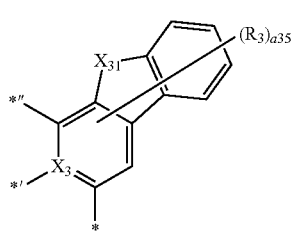
CY3-14
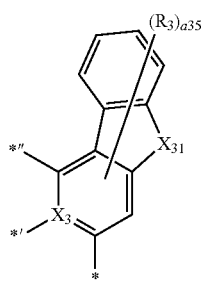
CY3-15
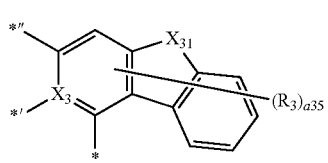
CY3-16
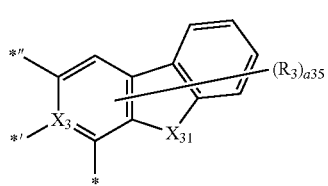
CY3-17
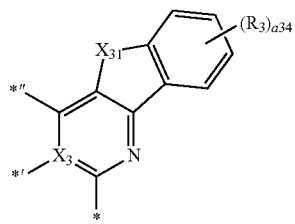
CY3-18
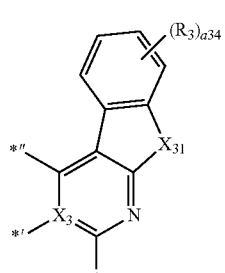
CY3-19
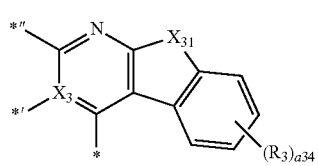
CY3-20
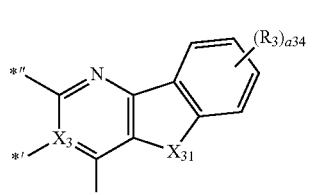
CY3-21
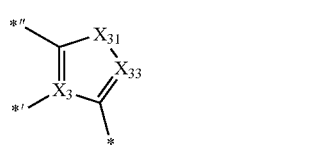
CY3-22
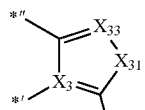
CY3-23
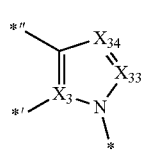
CY3-24
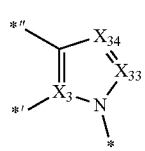
CY3-25
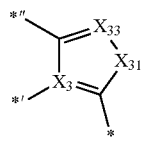
CY3-26

-continued

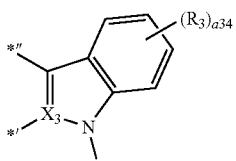
CY3-27

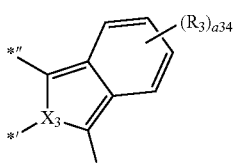
CY3-28

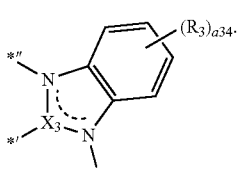
CY3-29

In Formulae CY3-1 to CY3-29,
$X_3$ and $R_3$ are the same as described herein,
$X_{31}$ may be $C(R_{31})(R_{32})$, $N(R_{31})$, O, S, or $Si(R_{31})(R_{32})$,
$X_{33}$ may be $C(R_{33})$ or N,
$X_{34}$ may be $C(R_{34})$ or N,
$R_{31}$ to $R_{38}$ are the same as described above in connection with $R_3$,
a35 may be an integer from 0 to 5,
a34 may be an integer from 0 to 4,
a33 may be an integer from 0 to 3,
a32 may be an integer from 0 to 2,
*''' indicates a binding site to $T_2$ in Formula 1,
*'' indicates a binding site to M in Formula 1, and
* indicates a binding site to $T_3$ in Formula 1.
In one or more embodiments, a group represented by

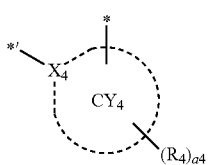

in Formula 1 may be selected from groups represented by Formulae CY4-1 to CY4-45:

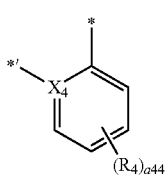
CY4-1

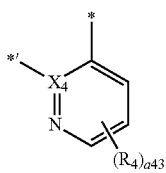
CY4-2

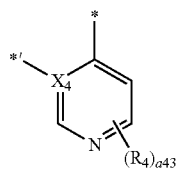
CY4-3

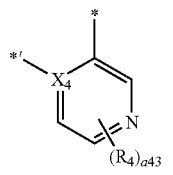
CY4-4

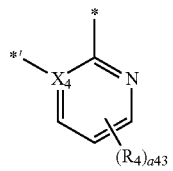
CY4-5

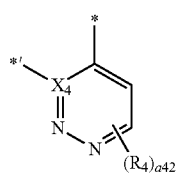
CY4-6

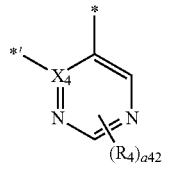
CY4-7

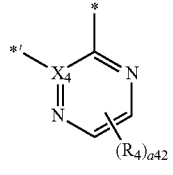
CY4-8

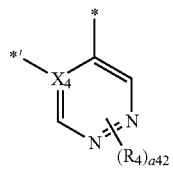
CY4-9

CY4-10

CY4-11 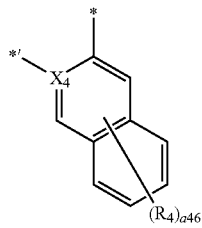
CY4-12 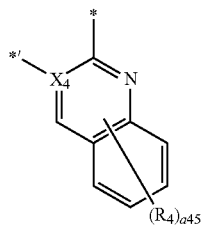
CY4-13 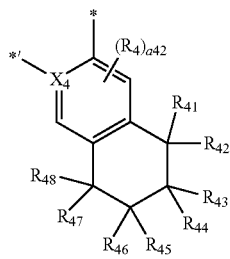
CY4-14 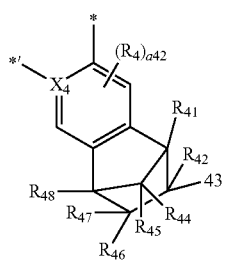
CY4-15 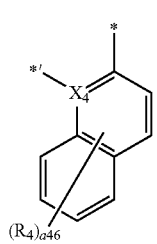
CY4-16 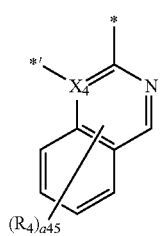
CY4-17 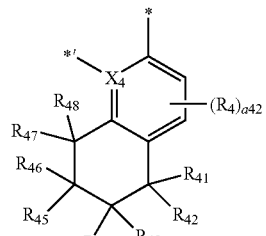
CY4-18 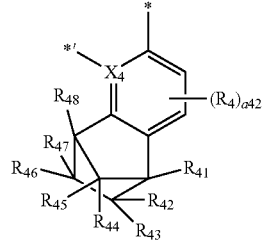
CY4-19 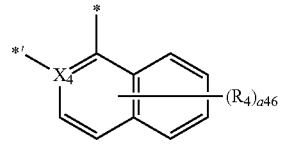
CY4-20 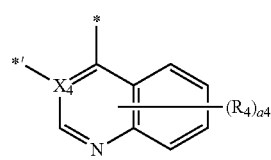
CY4-21 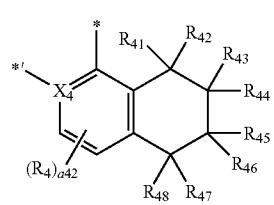
CY4-22 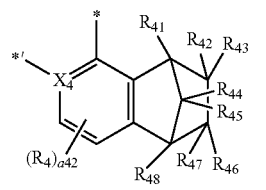
CY4-23 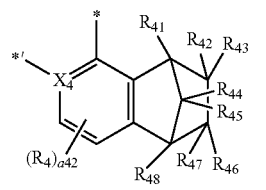

CY4-24
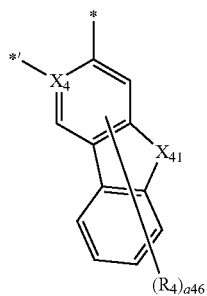
CY4-25
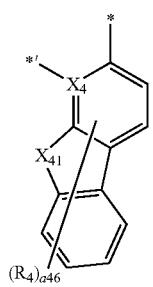
CY4-26
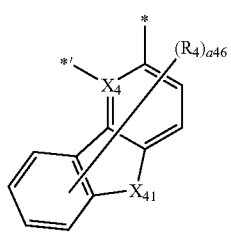
CY4-27
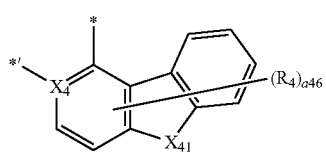
CY4-28
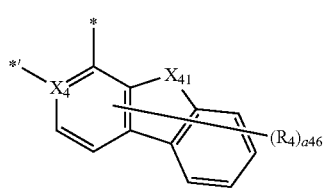
CY4-29
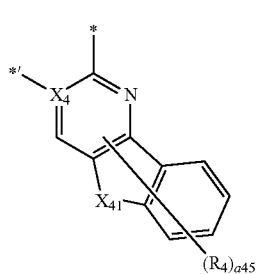
CY4-30
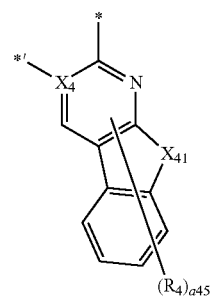
CY4-31
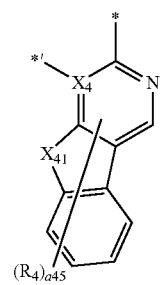
CY4-32
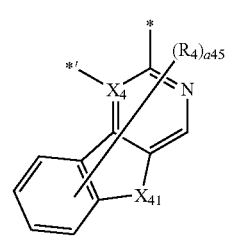
CY4-33
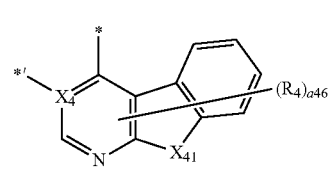
CY4-34
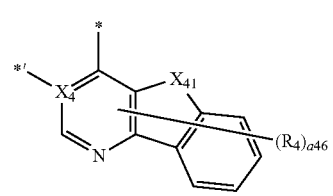
CY4-35
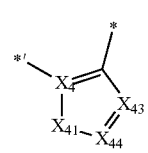
CY4-36
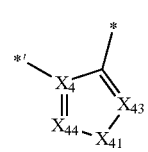
CY4-37
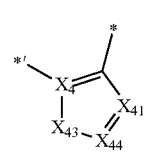

-continued

CY4-38
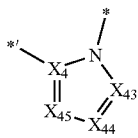

CY4-39
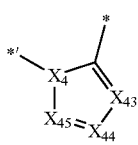

CY4-40
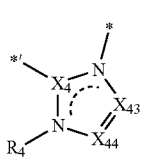

CY4-41
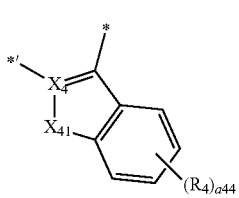

CY4-42
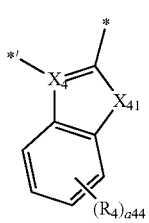

CY4-43
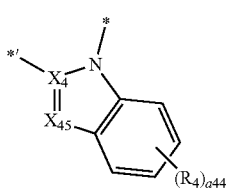

CY4-44
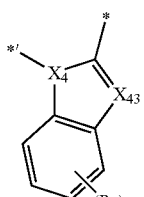

CY4-45
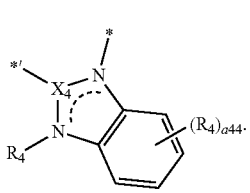

In Formulae CY4-1 to CY4-45,
$X_4$ and $R_4$ are the same as described herein,
$X_{41}$ may be $C(R_{41})(R_{42})$, $N(R_{41})$, O, S, or $Si(R_{41})(R_{42})$,
$X_{43}$ may be $C(R_{43})$ or N, $X_{44}$ may be $C(R_{44})$ or N,
$X_{45}$ may be $C(R_{45})$ or N,
$R_{41}$ to $R_{48}$ are the same as described above in connection with $R_4$,
a46 may be an integer from 0 to 6,
a45 may be an integer from 0 to 5,
a44 may be an integer from 0 to 4,
a43 may be an integer from 0 to 3,
a42 may be an integer from 0 to 2,
* indicates a binding site to $T_3$ in Formula 1, and
*′ indicates a binding site to M in Formula 1.

In one or more embodiments, in Formula 1,
a moiety represented by

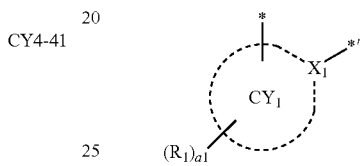

may be selected from the groups represented by Formulae CY1(1) to CY1(22),
a moiety represented by

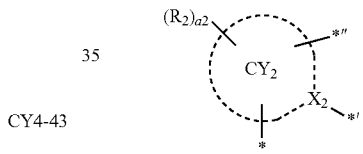

may be selected from the groups represented by Formulae CY2(1) to CY2(30),
a moiety represented by

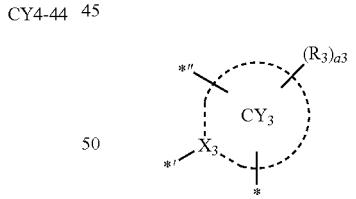

may be selected from the groups represented by Formulae CY3(1) to CY3(30),
a moiety represented by

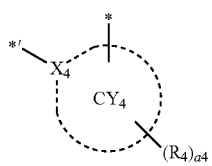

may be selected from the groups represented by Formulae CY4(1) to CY4(50), and/or
a moiety represented by
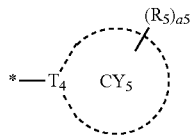
may be selected from the groups represented by Formulae CY5(1) to CY5(19):
CY1(1)
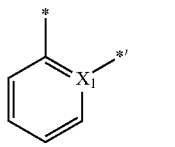
CY1(2)
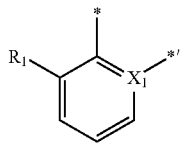
CY1(3)
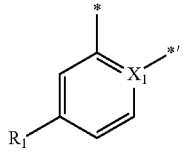
CY1(4)
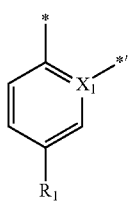
CY1(5)
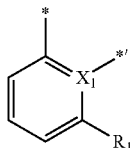
CY1(6)
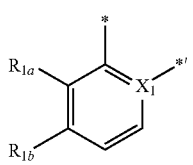
CY1(7)
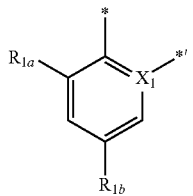
CY1(8)
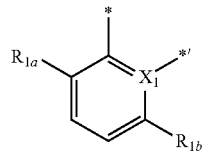
CY1(9)
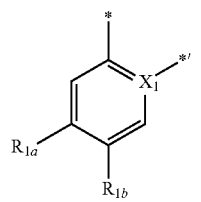
CY1(10)
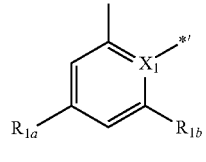
CY1(11)
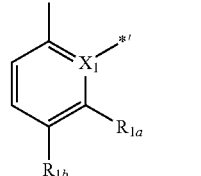
CY1(12)
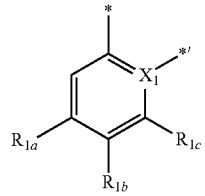
CY1(13)
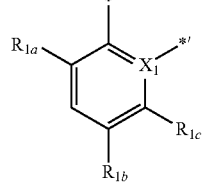
CY1(14)
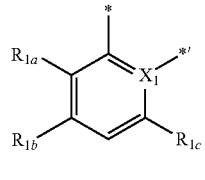
CY1(15)

-continued
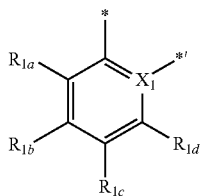
CY1(16)
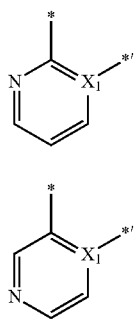
CY1(17)
CY1(18)
CY1(19)
CY1(20)
CY1(21)
CY1(22)
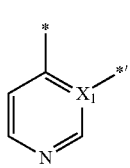
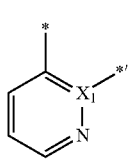
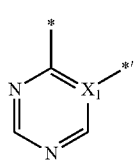
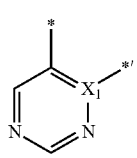
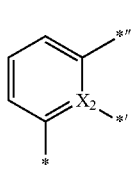
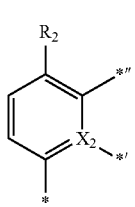
CY2(1)
CY2(2)
-continued
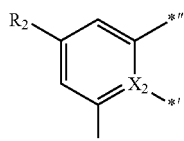
CY2(3)
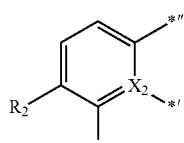
CY2(4)
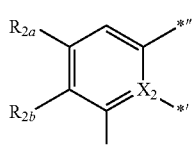
CY2(5)
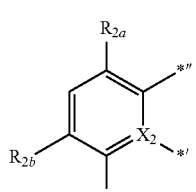
CY2(6)
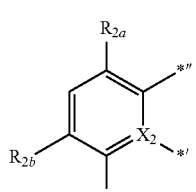
CY2(7)
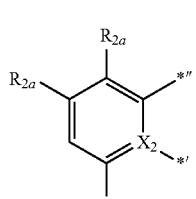
CY2(8)
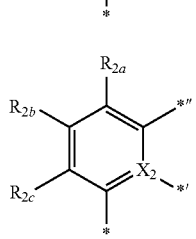
CY2(9)
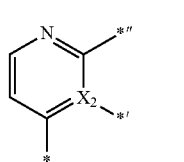
CY2(10)
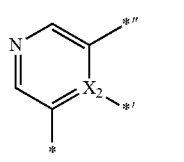
CY2(11)

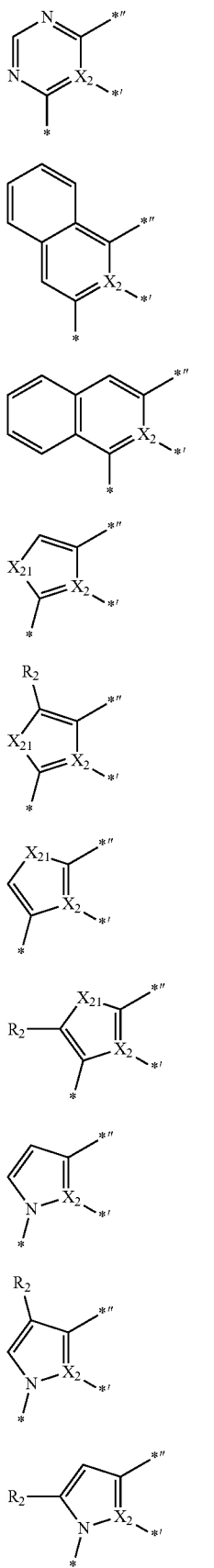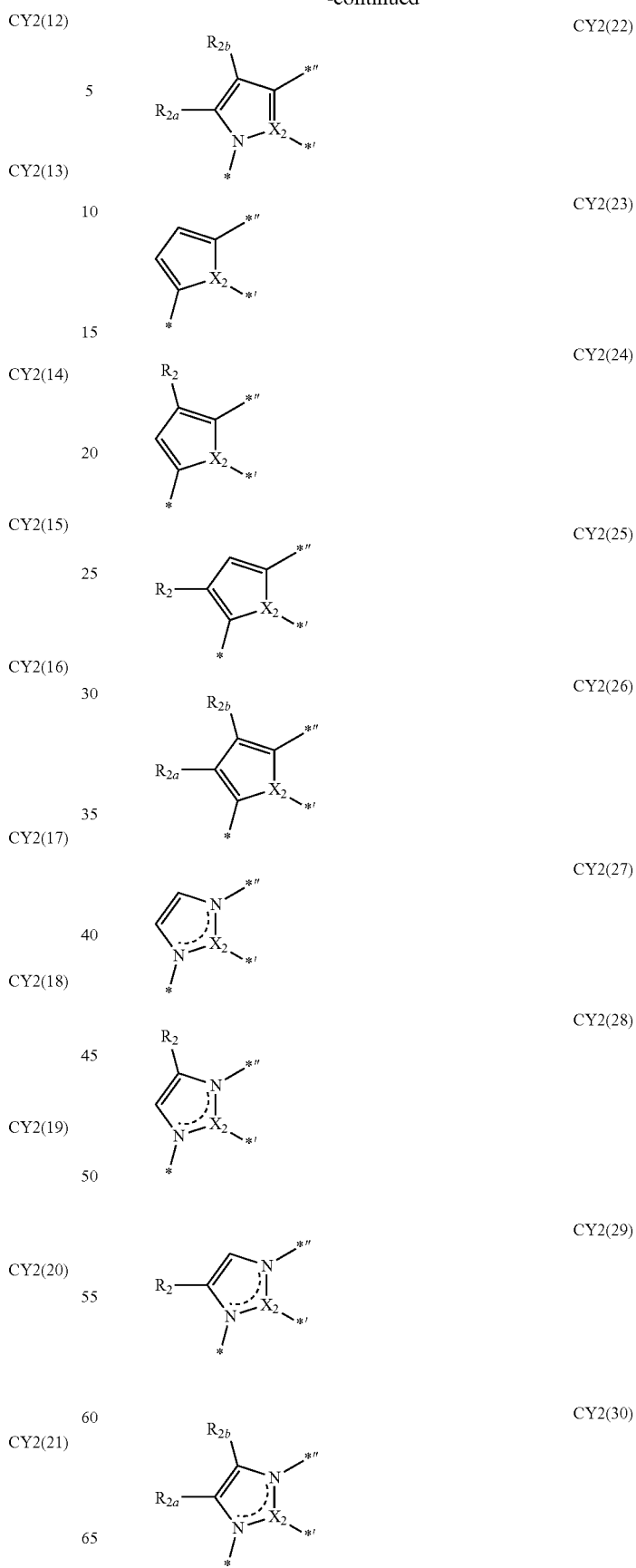

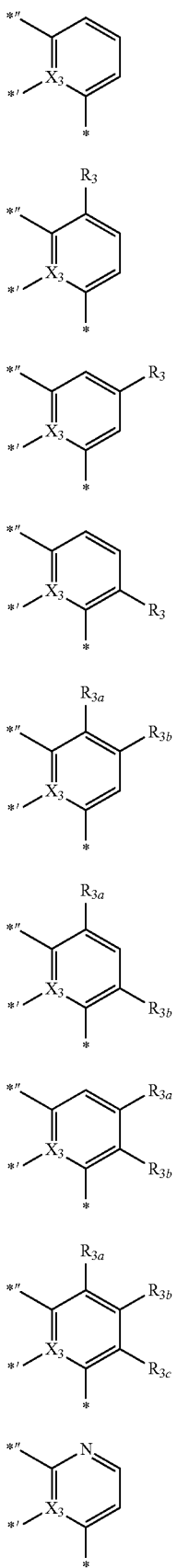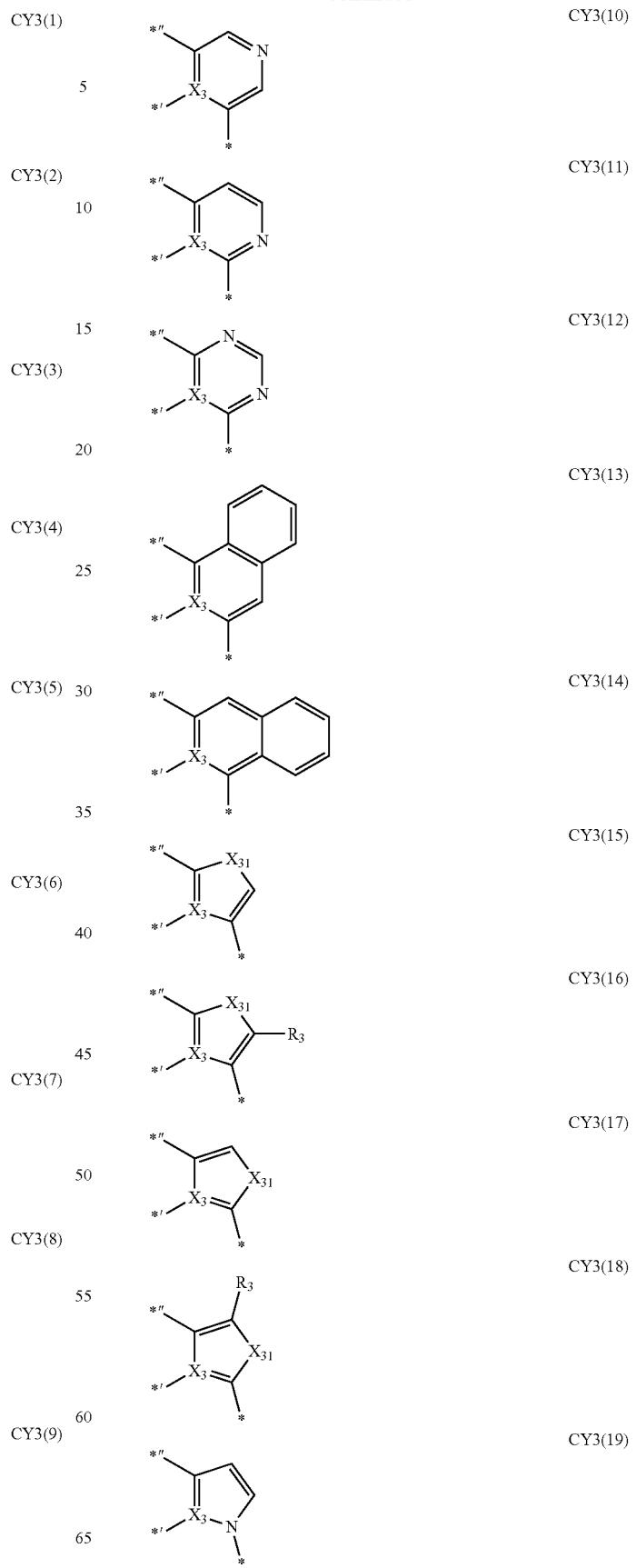

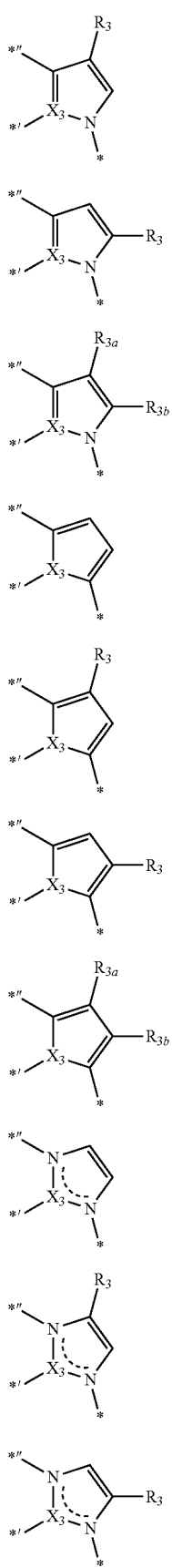
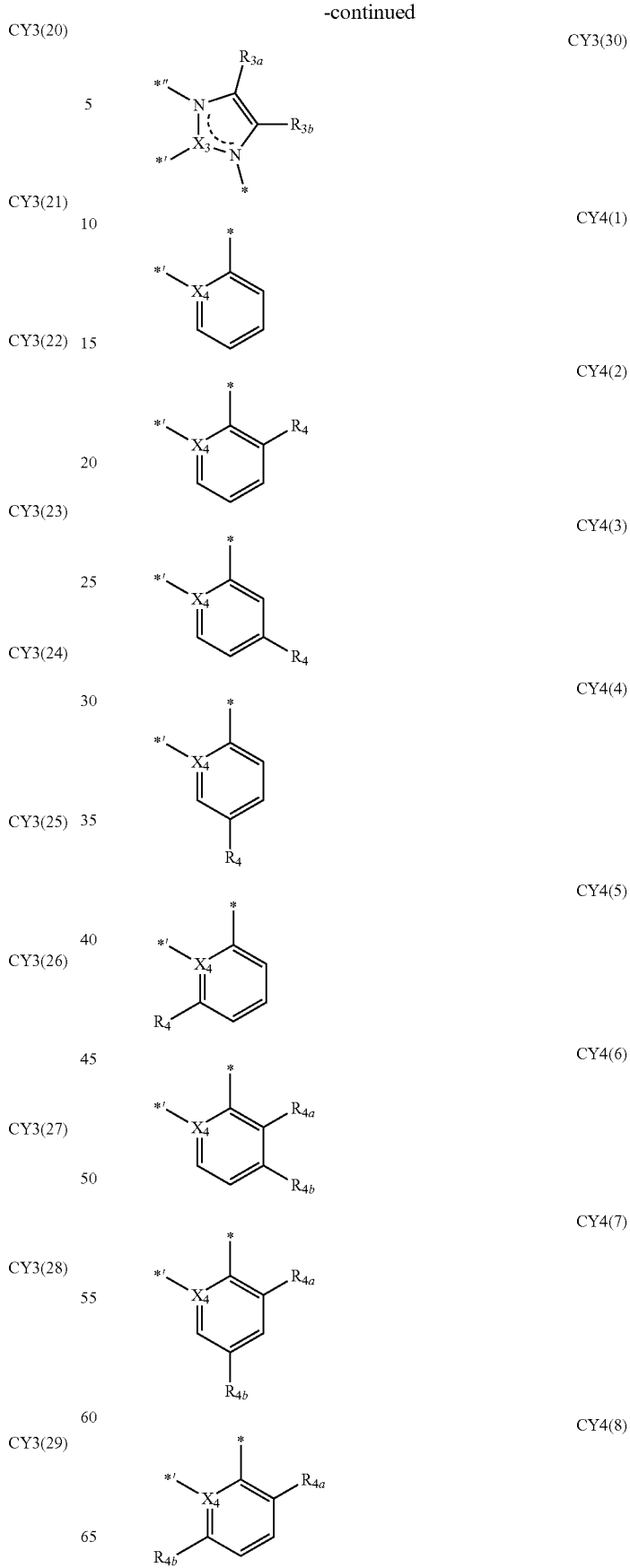

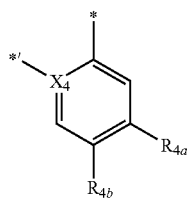 CY4(9)
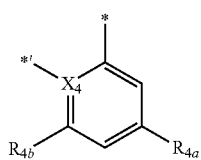 CY4(10)
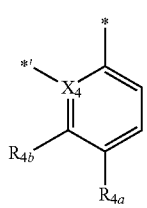 CY4(11)
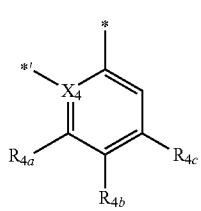 CY4(12)
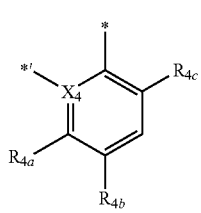 CY4(13)
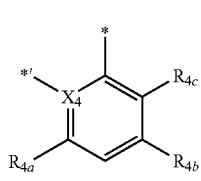 CY4(14)
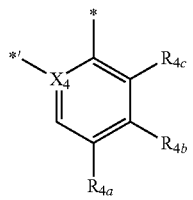 CY4(15)
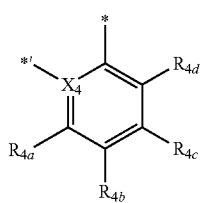 CY4(16)
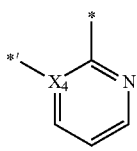 CY4(17)
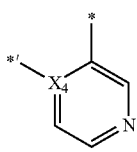 CY4(18)
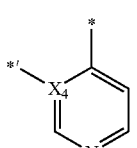 CY4(19)
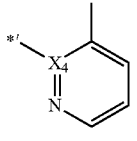 CY4(20)
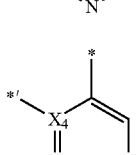 CY4(21)
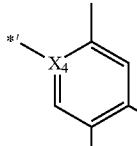 CY4(22)
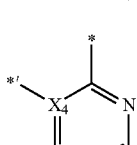 CY4(23)
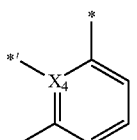 CY4(24)
CY4(25)

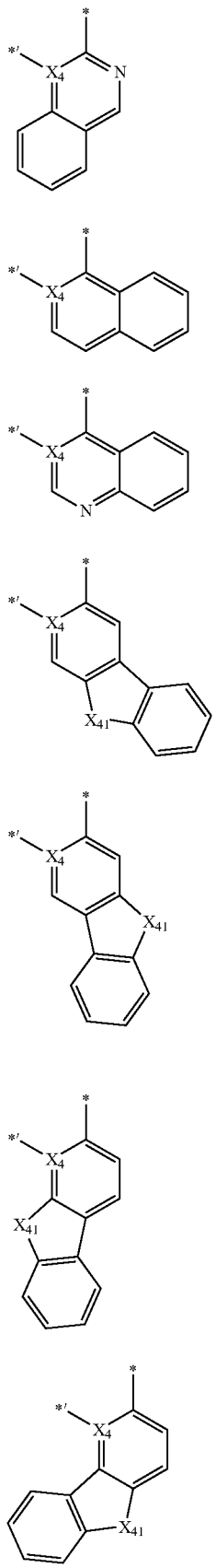
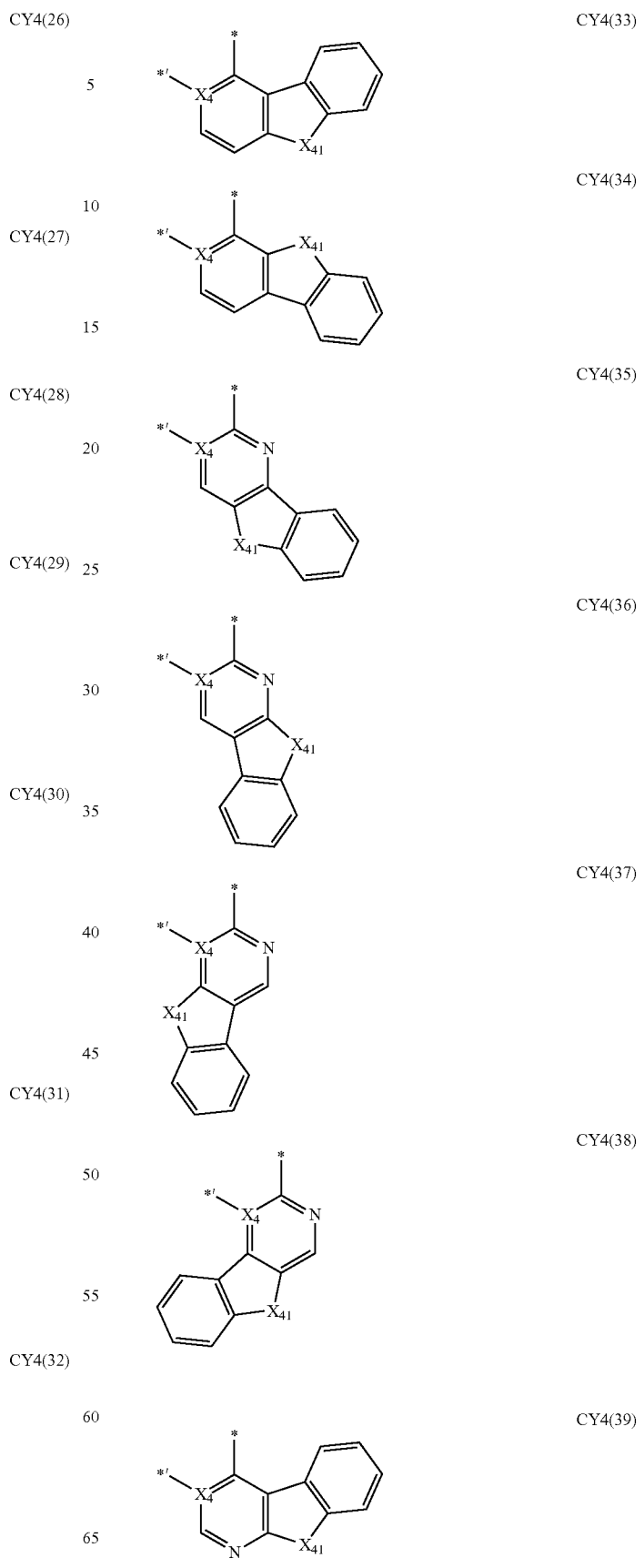

CY4(40)
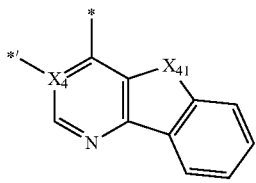
CY4(41)
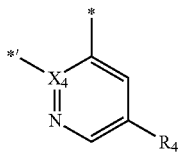
CY4(42)
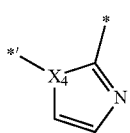
CY4(43)
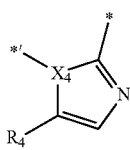
CY4(44)
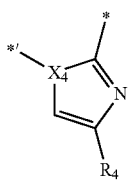
CY4(45)
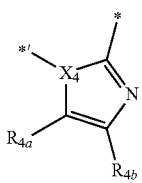
CY4(46)
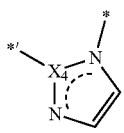
CY4(47)
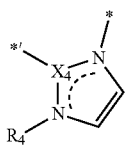
CY4(48)
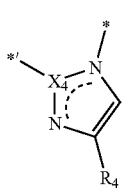
CY4(49)
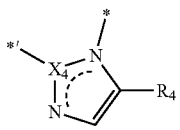
CY4(50)
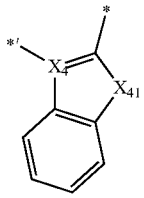
CY5(1)
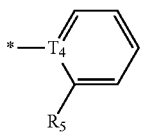
CY5(2)
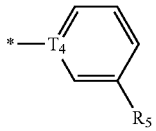
CY5(3)
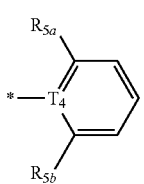
CY5(4)
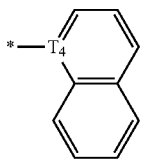
CY5(5)
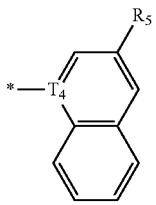
CY5(6)
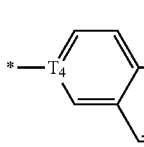
CY5(7)
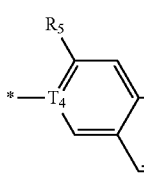

CY5(8) 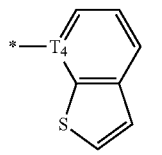

CY5(9) 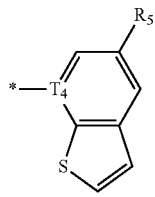

CY5(10) 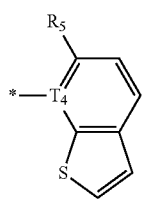

CY5(11) 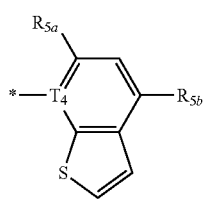

CY5(12) 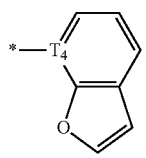

CY5(13) 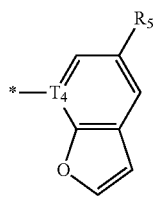

CY5(14) 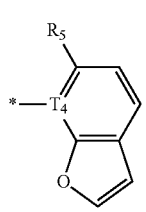

CY5(15) 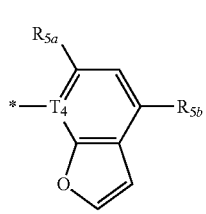

CY5(16) 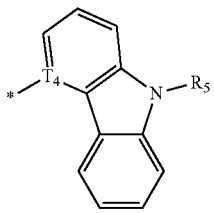

CY5(17) 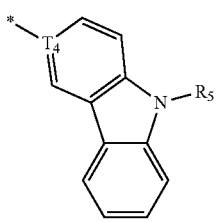

CY5(18) 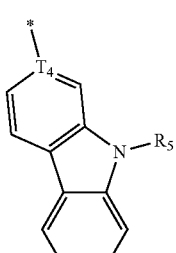

CY5(19) 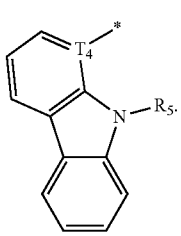

In Formulae CY1(1) to CY1(22), CY2(1) to CY2(30), CY3(1) to CY3(30), CY4(1) to CY4(50), and CY5(1) to CY5(19), $X_1$ to $X_4$, $T_4$, and $R_1$ to $R_5$ are the same as described herein, $X_{21}$ may be $C(R_{21})(R_{22})$, $N(R_{21})$, O, S, or $Si(R_{21})(R_{22})$, $X_{31}$ may be $C(R_{31})(R_{32})$, $N(R_{31})$, O, S, or $Si(R_{31})(R_{32})$, $X_{41}$ may be $C(R_{41})(R_{42})$, $N(R_{41})$, O, S, or $Si(R_{41})(R_{42})$, $R_{1a}$ to $R_{1d}$ are the same as described above in connection with $R_1$, $R_{2a}$ to $R_{2c}$, $R_{21}$, and $R_{22}$ are the same as described above in connection with $R_2$, $R_{3a}$ to $R_{3c}$, $R_{31}$, and $R_{32}$ are the same as described above in connection with $R_3$, $R_{4a}$ to $R_{4d}$, $R_{41}$, and $R_{42}$ are the same as described above in connection with $R_4$, $R_{5a}$ and $R_{5b}$ are the same as described above in connection with $R_5$, $R_1$ to $R_5$, $R_{1a}$ to $R_{1d}$, $R_{2a}$ to $R_{2c}$, $R_{3a}$ to $R_{3c}$, and $R_{4a}$ to $R_{4d}$ are not hydrogen, $R_{5a}$ and $R_{5b}$ in Formula CY5(3) are different from each other,

*' in Formulae CY1(1) to CY1(22) indicates a binding site to $X_5$ or M in Formula 1, and * indicates a binding site to $T_1$ in Formula 1,

* in Formulae CY2(1) to CY2(30) indicates a binding site to $T_1$ in Formula 1, *' indicates a binding site to M in Formula 1, and *'" indicates a binding site to $T_2$ in Formula 1, in Formulae CY3(1) to CY3(30), *'" indicates a binding site to $T_2$ in Formula 1, *' indicates a binding site to M in Formula 1, and * indicates a binding site to $T_3$ in Formula 1, in Formulae CY4(1) to CY4(50), * indicates a binding site to $T_3$ in Formula 1, and *' indicates a binding site to M in Formula 1, and in Formulae CY5(1) to CY5(19), * indicates a binding site to $T_3$ in Formula 1.

In one or more embodiments, the organometallic compound may be represented by Formula 1A:

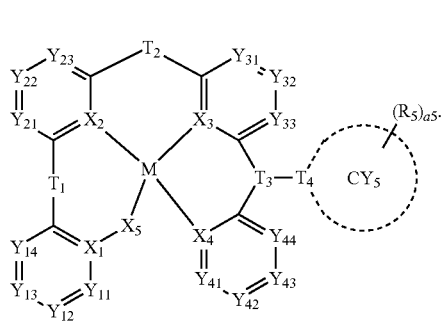

Formula 1A

In Formula 1A,

M, $X_1$ to $X_5$, $T_1$ to $T_4$, ring $CY_5$, $R_5$, and a5 are the same as described herein, $Y_{11}$ may be $C(Z_{11})$ or N, $Y_{12}$ may be $C(Z_{12})$ or N, $Y_{13}$ may be $C(Z_{13})$ or N, $Y_{14}$ may be $C(Z_{14})$ or N, $Y_{21}$ may be $C(Z_{21})$ or N, $Y_{22}$ may be $C(Z_{22})$ or N, $Y_{23}$ may be $C(Z_{23})$ or N, $Y_{31}$ may be $C(Z_{31})$ or N, $Y_{32}$ may be $C(Z_{32})$ or N, $Y_{33}$ may be $C(Z_{33})$ or N, $Y_{41}$ may be $C(Z_{41})$ or N, $Y_{42}$ may be $C(Z_{42})$ or N, $Y_{43}$ may be $C(Z_{43})$ or N, and $Y_{44}$ may be $C(Z_{44})$ or N, $Z_{11}$ to $Z_{14}$ are each independently the same as described above in connection with $R_1$, and at least two of $Z_{11}$ to $Z_{14}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $Z_{21}$ to $Z_{23}$ are each independently the same as described above in connection with $R_2$, and at least two of $Z_{21}$ to $Z_{23}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $Z_{31}$ to $Z_{33}$ are each independently the same as described above in connection with $R_3$, and at least two of $Z_{31}$ to $Z_{33}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $Z_{41}$ to $Z_{44}$ are each independently the same as described above in connection with $R_4$, and at least two of $Z_{41}$ to $Z_{44}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, and $R_{10a}$ are the same as described above in connection with $R_1$.

In Formula 1, i) two of a plurality of neighboring groups $R_1$ may optionally be linked to form a substituted or unsubstituted $C_5$-$C_{30}$ carbocyclic group or a substituted or unsubstituted $C_1$-$C_{30}$ heterocyclic group, ii) two of a plurality of neighboring groups $R_2$ may optionally be linked to form a substituted or unsubstituted $C_5$-$C_{30}$ carbocyclic group or a substituted or unsubstituted $C_1$-$C_{30}$ heterocyclic group, iii) two of a plurality of neighboring groups $R_3$ may optionally be linked to form a substituted or unsubstituted $C_5$-$C_{30}$ carbocyclic group or a substituted or unsubstituted $C_1$-$C_{30}$ heterocyclic group, iv) two of a plurality of neighboring groups $R_4$ may optionally be linked to form a substituted or unsubstituted $C_5$-$C_{30}$ carbocyclic group or a substituted or unsubstituted $C_1$-$C_{30}$ heterocyclic group, v) $R_1$ and $R_2$ may optionally be linked to form a substituted or unsubstituted $C_5$-$C_{30}$ carbocyclic group or a substituted or unsubstituted $C_1$-$C_{30}$ heterocyclic group, vi) two of $Z_{11}$ to $Z_{14}$ may optionally be linked to form a substituted or unsubstituted $C_5$-$C_{30}$ carbocyclic group or a substituted or unsubstituted $C_1$-$C_{30}$ heterocyclic group, vii) two of $Z_{21}$ to $Z_{23}$ may optionally be linked to form a substituted or unsubstituted $C_5$-$C_{30}$ carbocyclic group or a substituted or unsubstituted $C_1$-$C_{30}$ heterocyclic group, viii) two of $Z_{31}$ to $Z_{33}$ may optionally be linked to form a substituted or unsubstituted $C_5$-$C_{30}$ carbocyclic group or a substituted or unsubstituted $C_1$-$C_{30}$ heterocyclic group, and ix) two of $Z_{41}$ to $Z_{44}$ may optionally be linked to form a substituted or unsubstituted $C_5$-$C_{30}$ carbocyclic group or a substituted or unsubstituted $C_1$-$C_{30}$ heterocyclic group.

For example, i) the substituted or unsubstituted $C_5$-$C_{30}$ carbocyclic group or the substituted or unsubstituted $C_1$-$C_{30}$ heterocyclic group, formed by linking two of the plurality of neighboring groups $R_1$ ii) the substituted or unsubstituted $C_5$-$C_{30}$ carbocyclic group or the substituted or unsubstituted $C_1$-$C_{30}$ heterocyclic group, formed by linking two of the plurality of neighboring groups $R_2$, iii) the substituted or unsubstituted $C_5$-$C_{30}$ carbocyclic group or the substituted or unsubstituted $C_1$-$C_{30}$ heterocyclic group, formed by linking two of the plurality of neighboring groups $R_3$, iv) the substituted or unsubstituted $C_5$-$C_{30}$ carbocyclic group or the substituted or unsubstituted $C_1$-$C_{30}$ heterocyclic group, formed by linking two of the plurality of neighboring groups $R_4$, v) the substituted or unsubstituted $C_5$-$C_{30}$ carbocyclic group or the substituted or unsubstituted $C_1$-$C_{30}$ heterocyclic group, formed by linking $R_1$ and $R_2$, vi) the substituted or unsubstituted $C_5$-$C_{30}$ carbocyclic group or the substituted or unsubstituted $C_1$-$C_{30}$ heterocyclic group, formed by linking two of $Z_{11}$ to $Z_{14}$, vii) the substituted or unsubstituted $C_5$-$C_{30}$ carbocyclic group or the substituted or unsubstituted $C_1$-$C_{30}$ heterocyclic group, formed by linking two of $Z_{21}$ to $Z_{23}$, viii) the substituted or unsubstituted $C_5$-$C_{30}$ carbocyclic group or the substituted or unsubstituted $C_1$-$C_{30}$ heterocyclic group, formed by linking two of $Z_{31}$ to $Z_{33}$, and ix) the substituted or unsubstituted $C_5$-$C_{30}$ carbocyclic group or the substituted or unsubstituted $C_1$-$C_{30}$ heterocyclic group, formed by linking two of $Z_{41}$ to $Z_{44}$, may each independently be selected from:

a pentadiene group, a cyclohexane group, a cycloheptane group, an adamantane group, a bicycle-heptane group, a bicycle-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group; and a pentadiene group, a cyclohexane group, a cycloheptane group, an adamantane group, a bicycle-heptane group, a bicycle-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group, each substituted with at least one $R_{10a}$, but embodiments of the present disclosure are not limited thereto.

$R_{10a}$ is the same as described above in connection with $R_1$.

The terms "an azaindole group, an azabenzoborol group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-on group, and an azadibenzothiophene 5,5-dioxide group" as used herein each refer to a heteroring having the same back bond as "an indole group, a benzoborol group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, 9H-fluorene-9-on group, a dibenzothiophene 5,5-dioxide group", wherein at least one of carbon atoms constituting the heteroring is substituted with nitrogen.

For example, the organometallic compound may be at least one of Compounds 1 to 72, but embodiments of the present disclosure are not limited thereto:

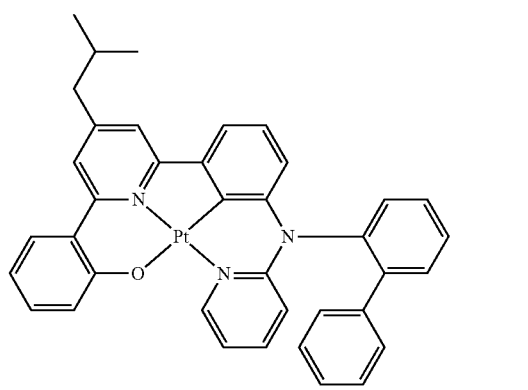

2

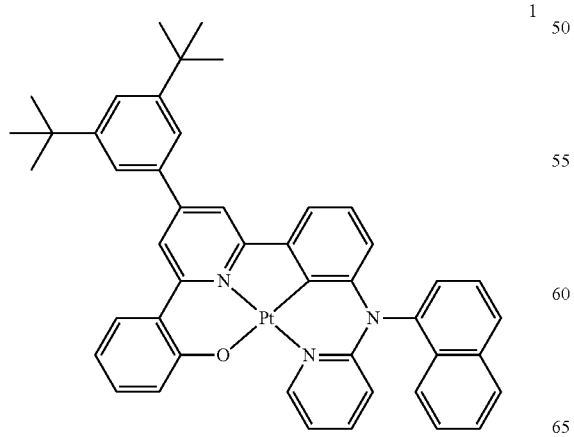

3

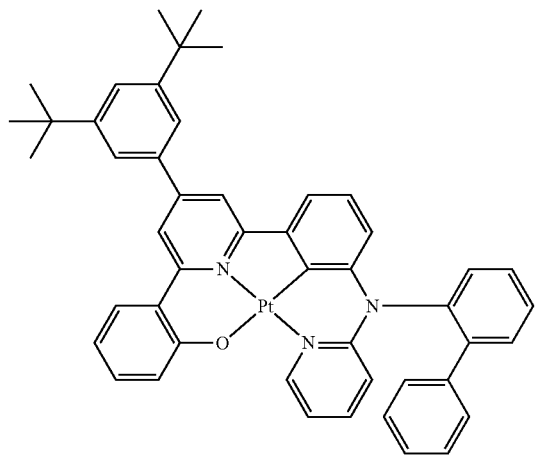

1

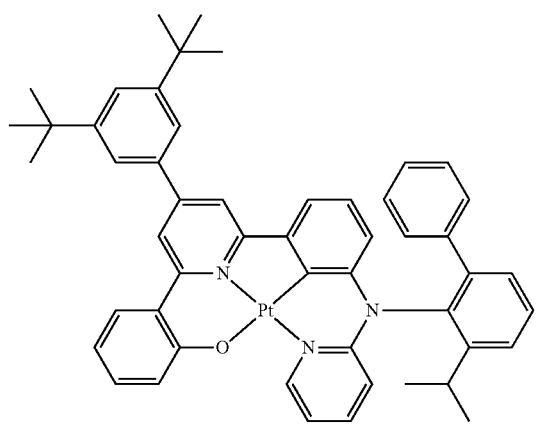

4

5
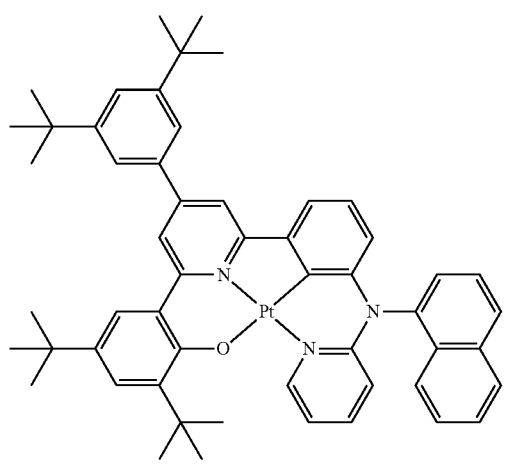
6
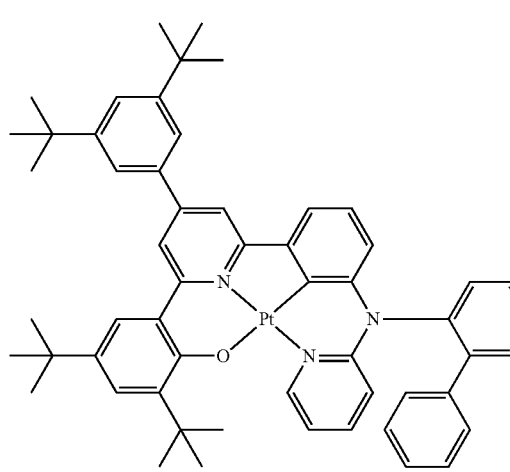
7
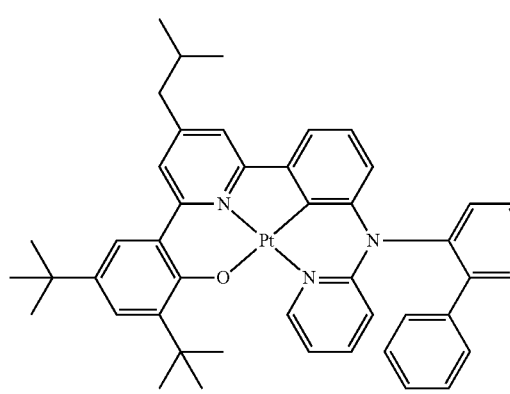
8
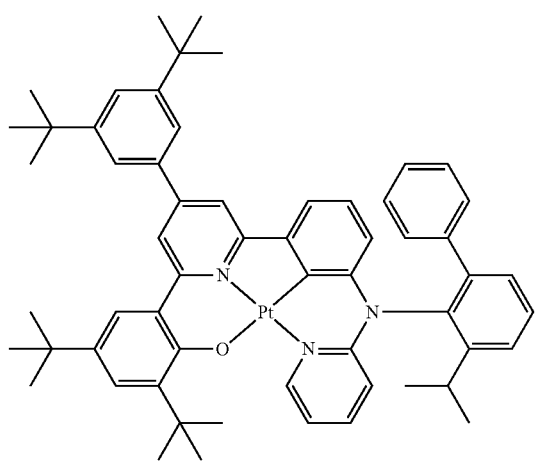
9
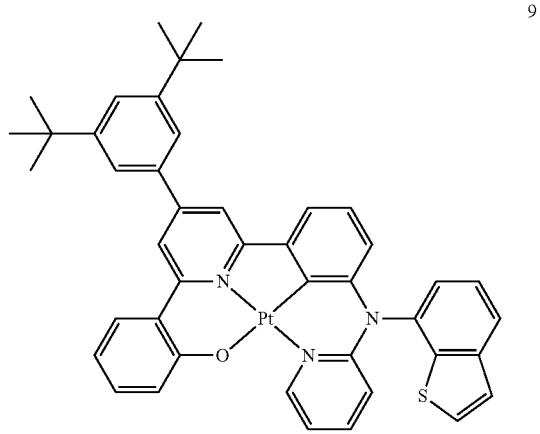
10
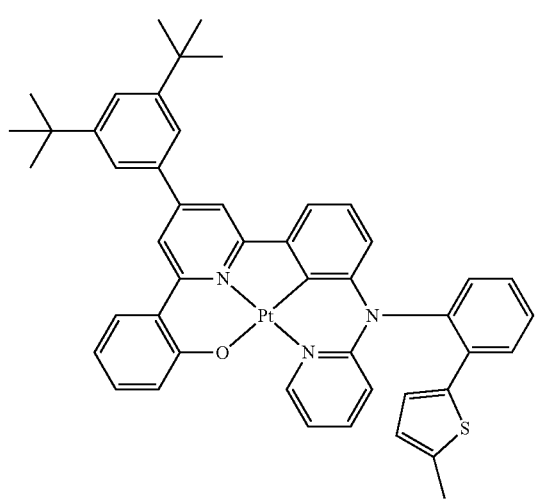

11
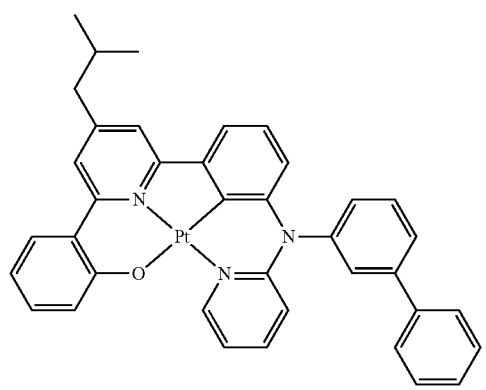
14
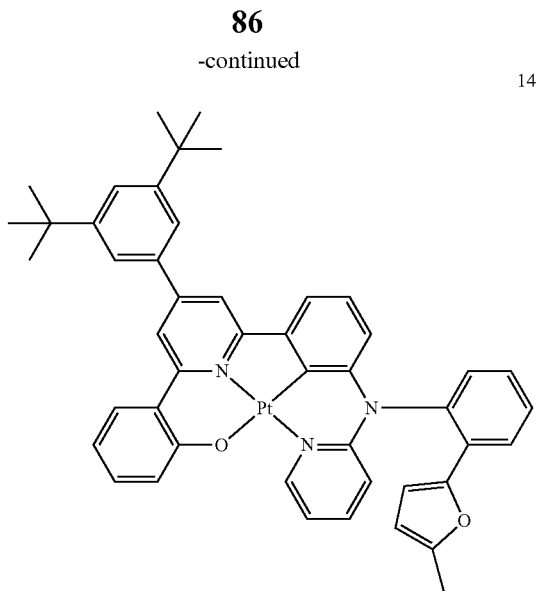
12
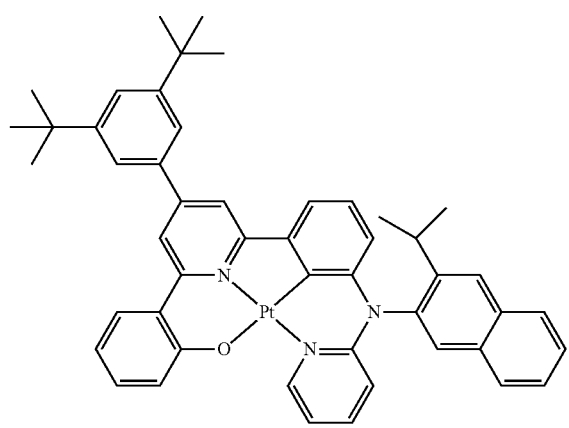
15
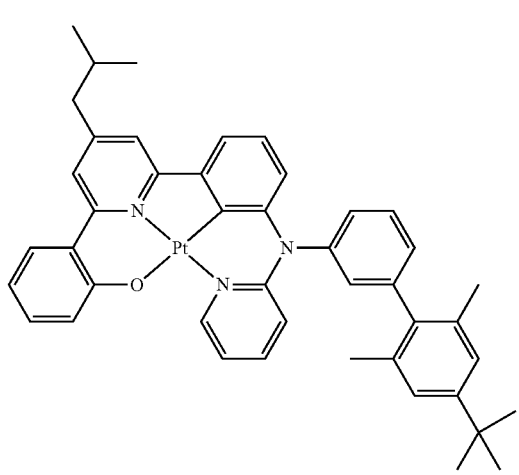
13
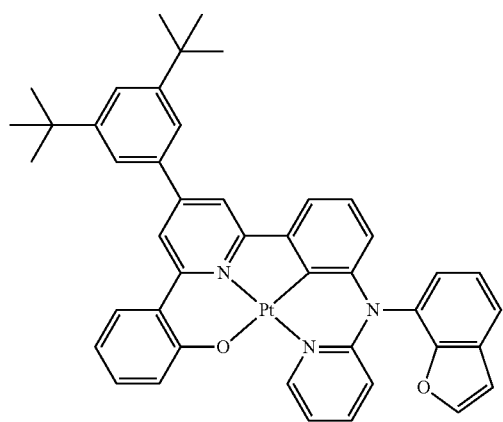
16
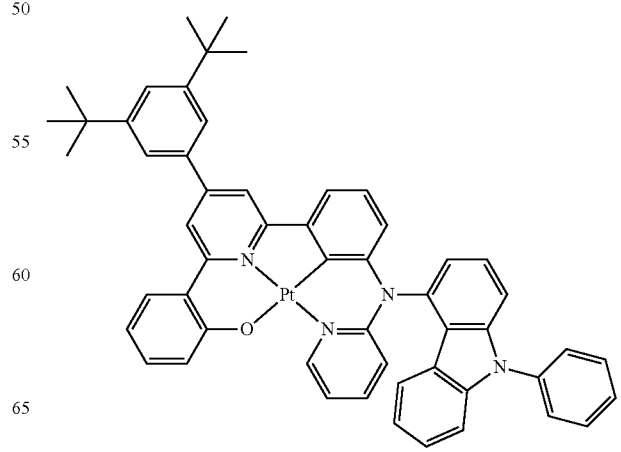

17
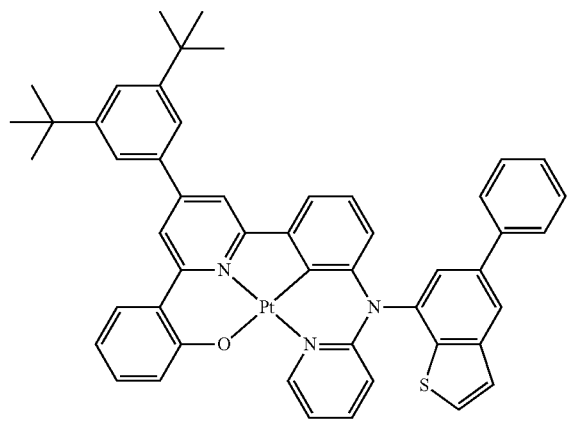
18
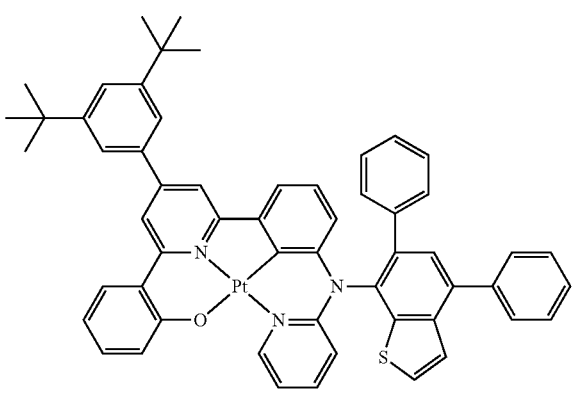
19
20
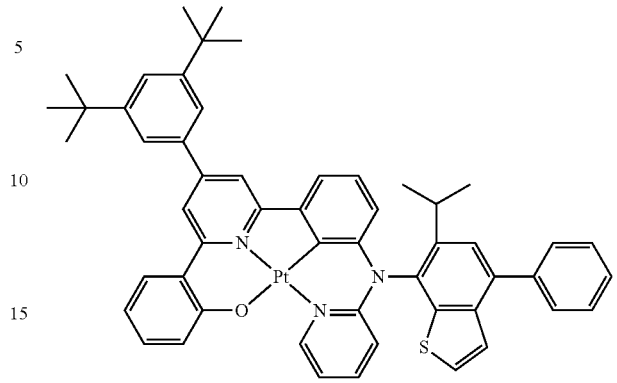
21
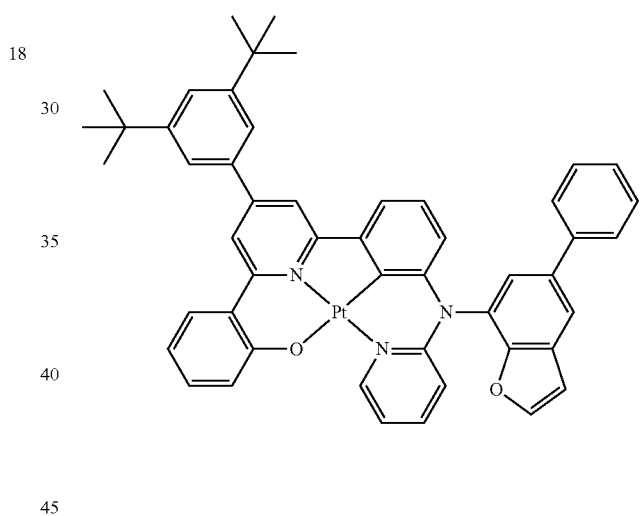
22
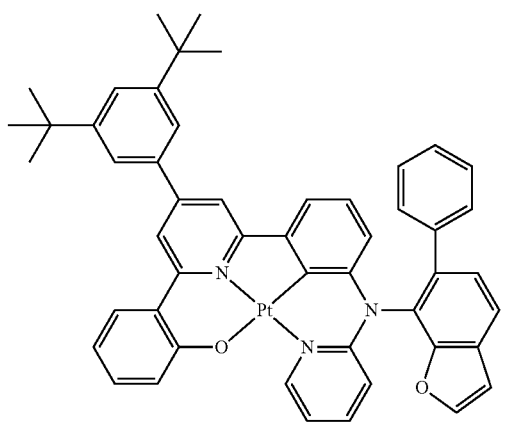

23
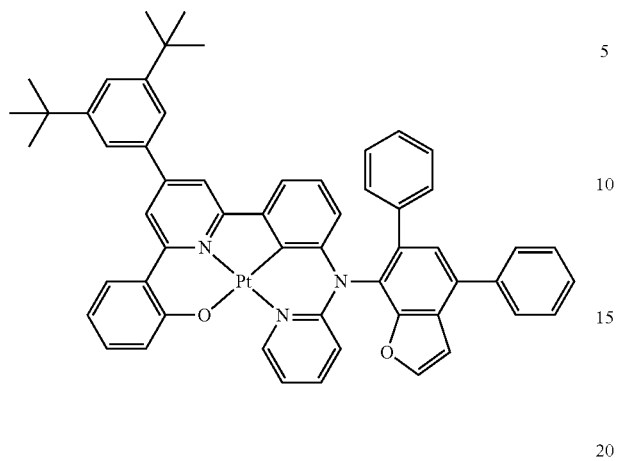
24
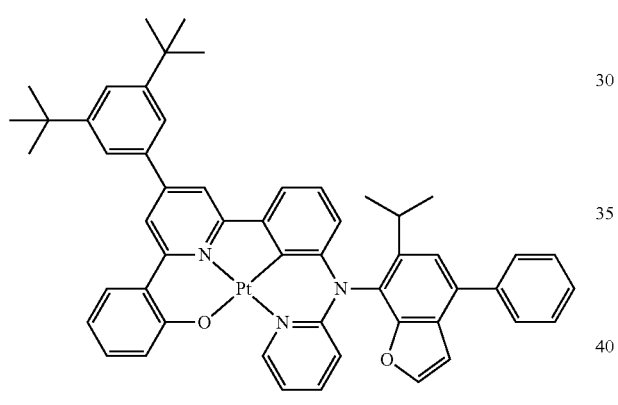
25
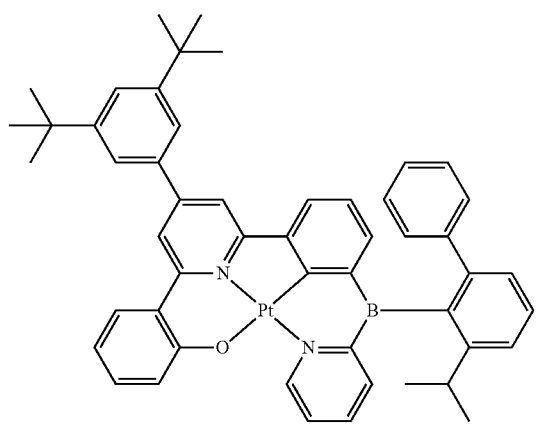
26
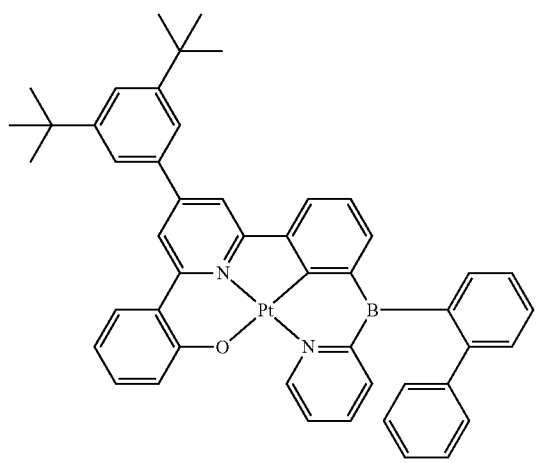
27
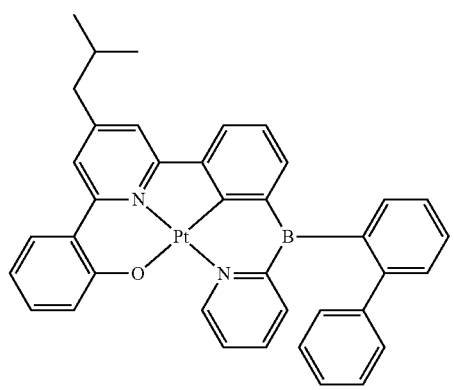
28

29
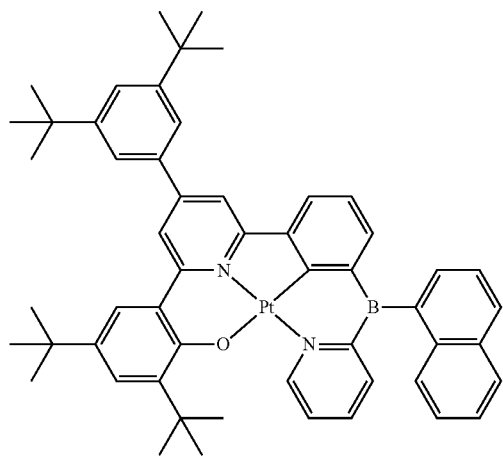
30
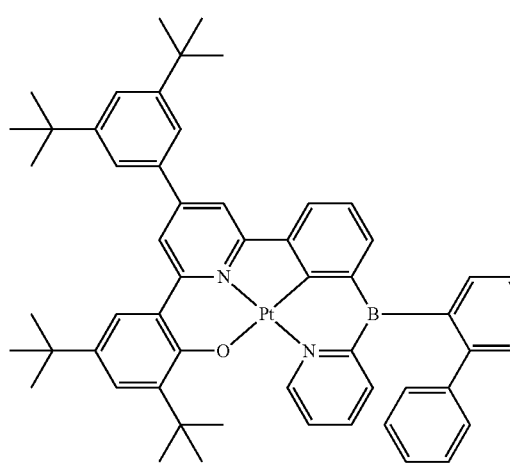
31
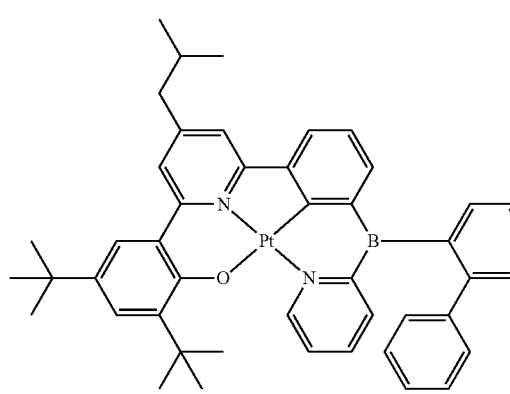
32
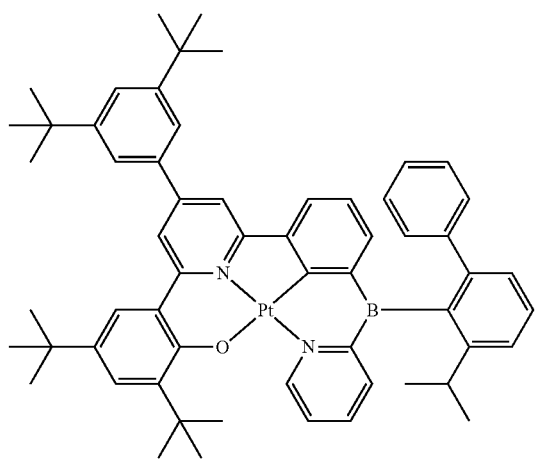
33
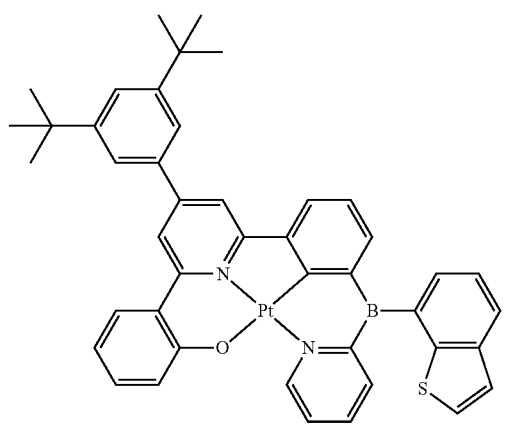
34
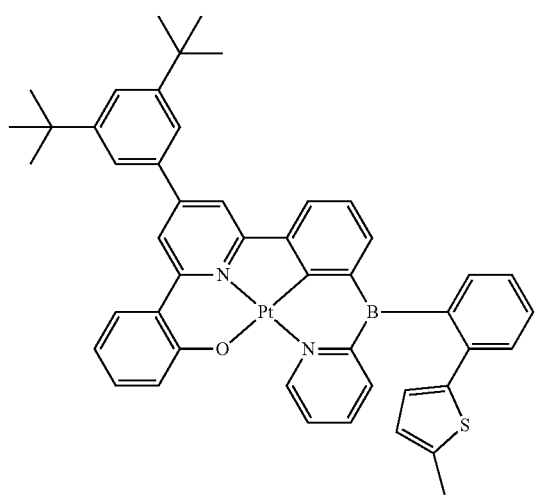

93
-continued
35
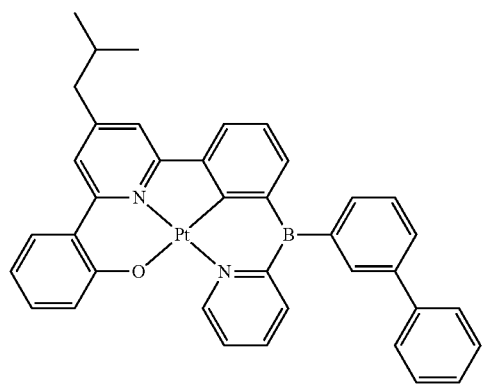
36
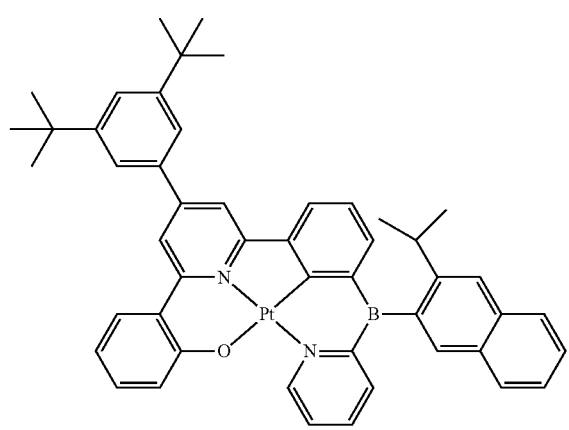
37
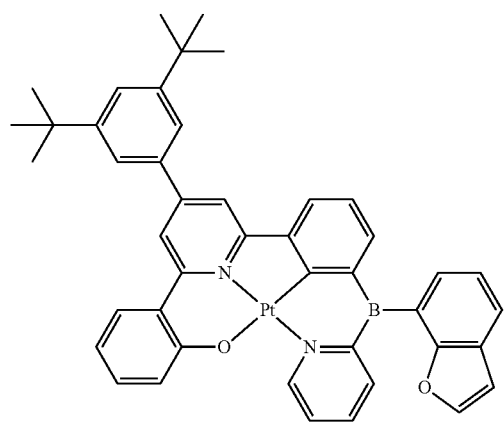
94
-continued
38
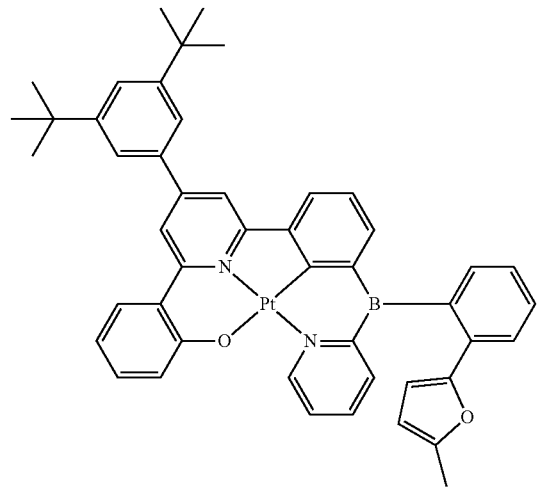
39
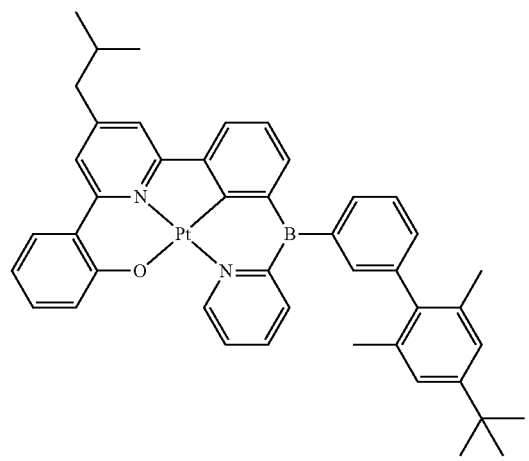
40
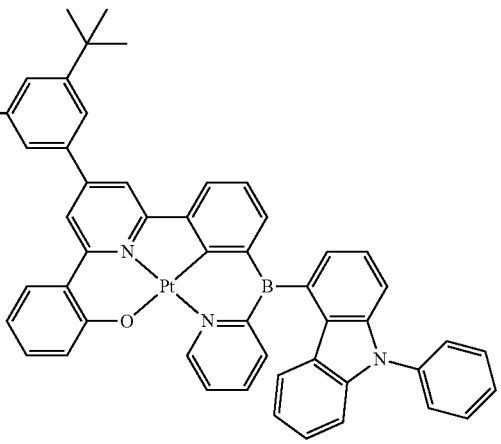

41
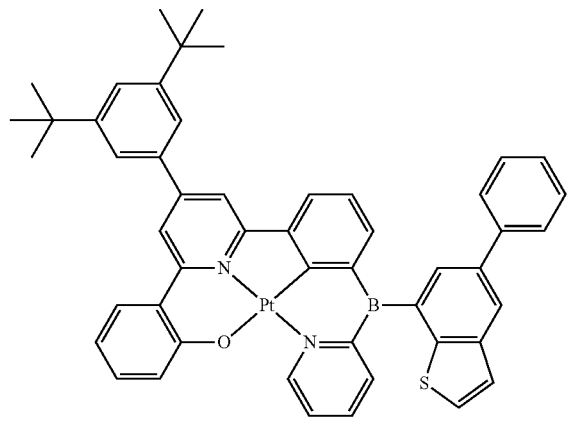
42
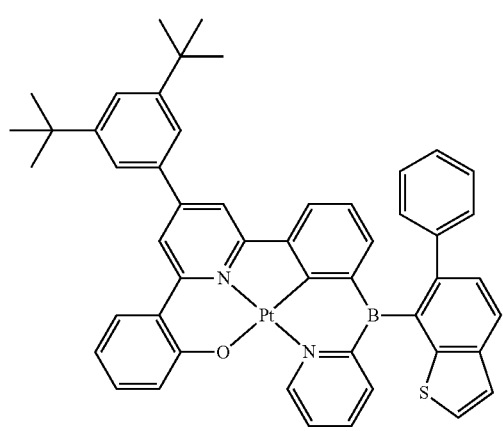
43
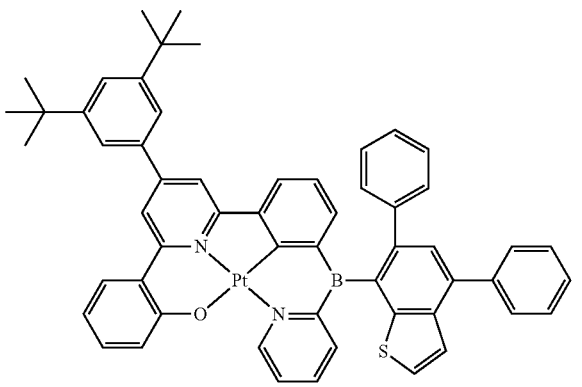
44
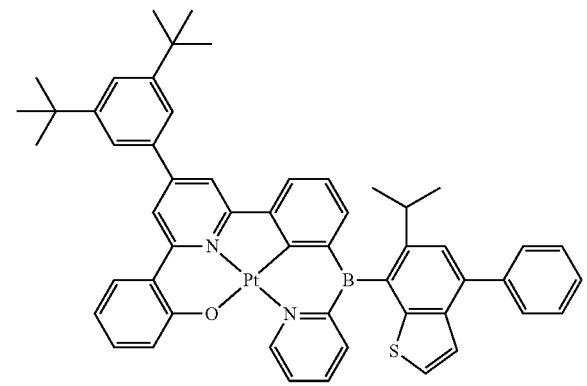
45
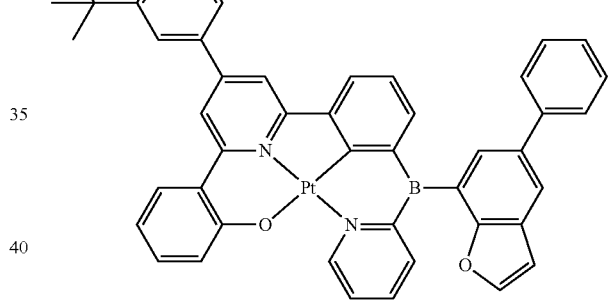
46
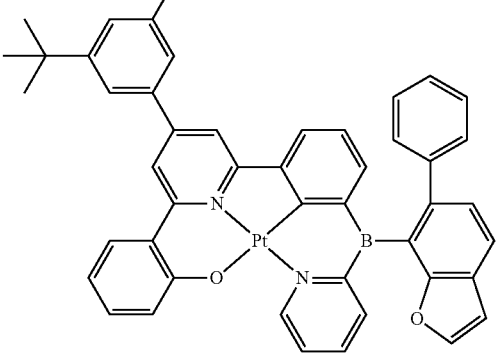

47
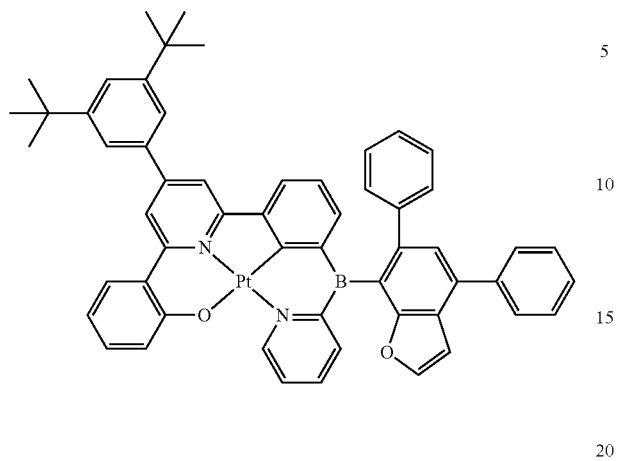
48
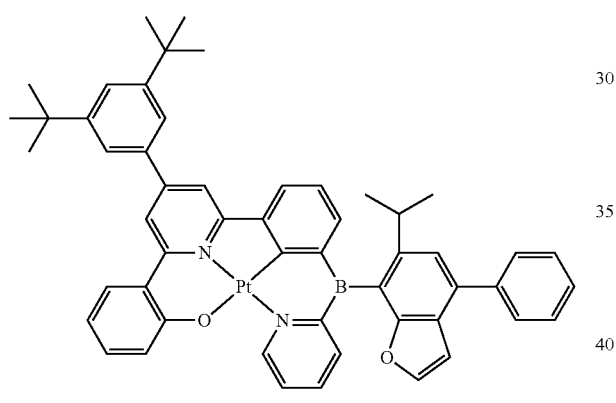
49
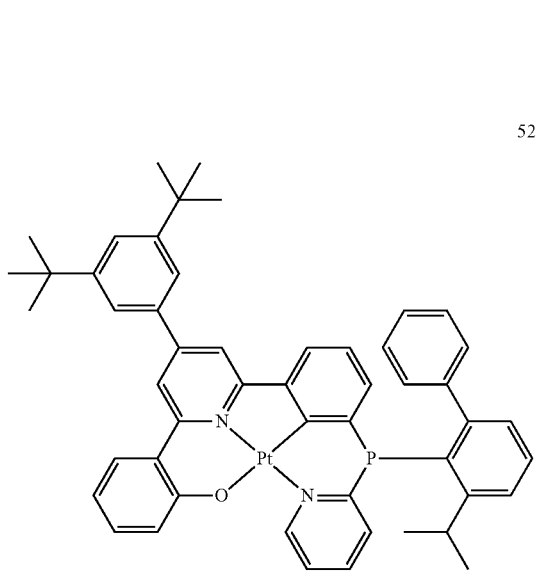
50
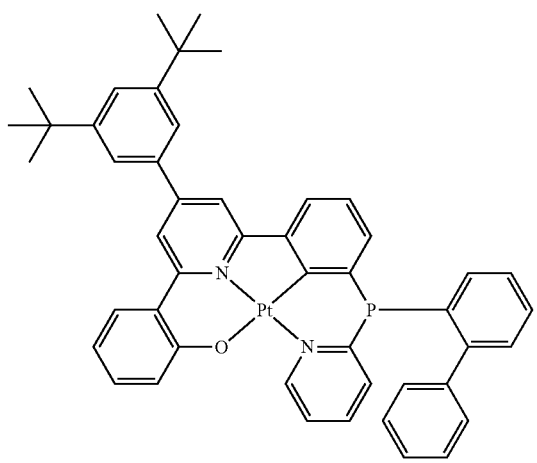
51
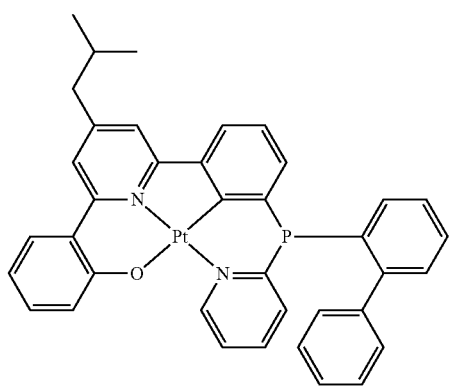
52
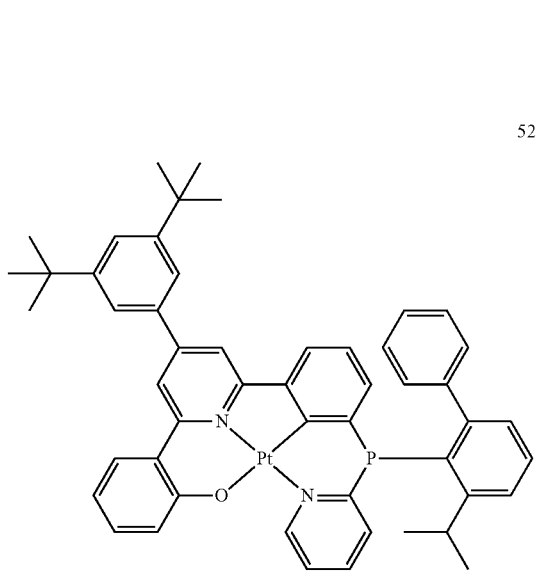

53
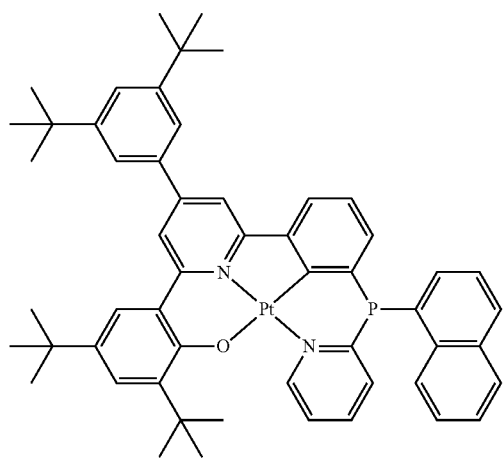
54
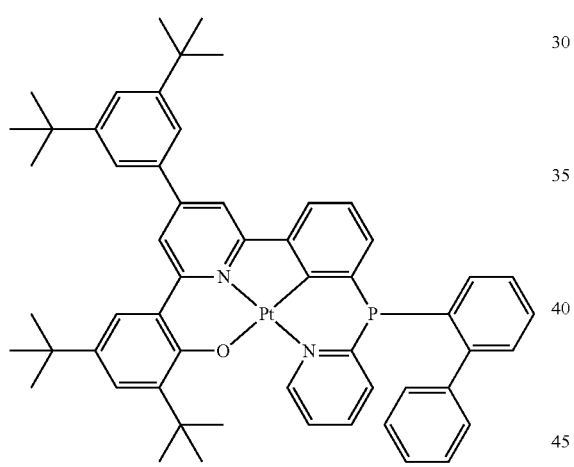
56
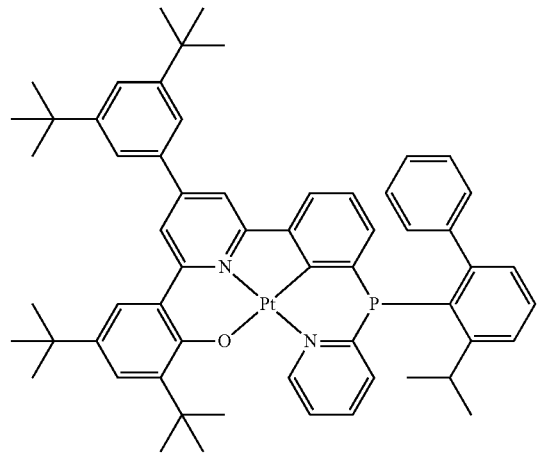
57
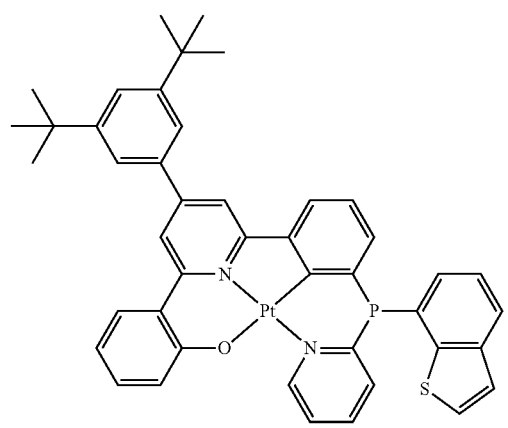
58
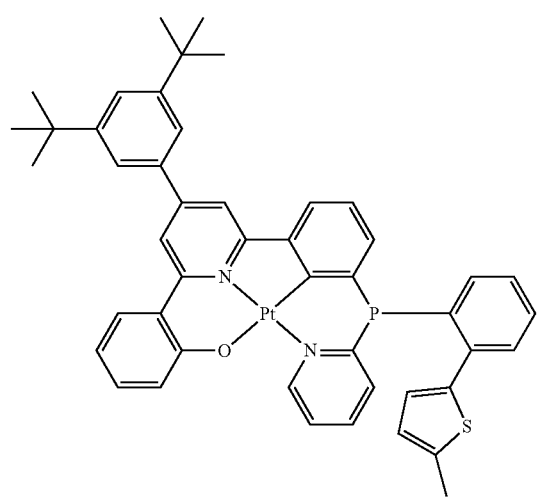

-continued
59
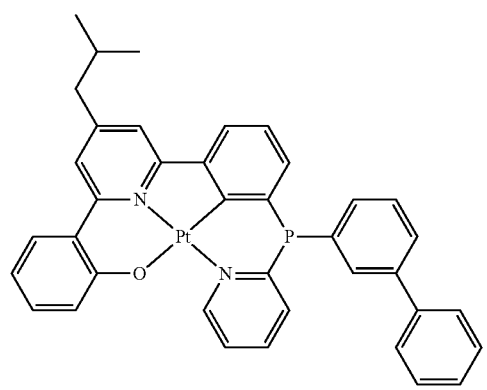
60
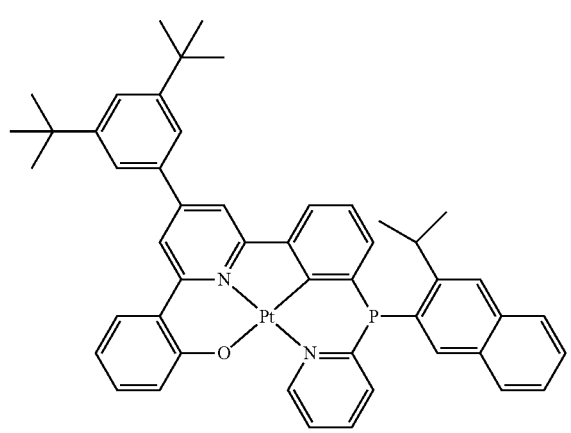
61
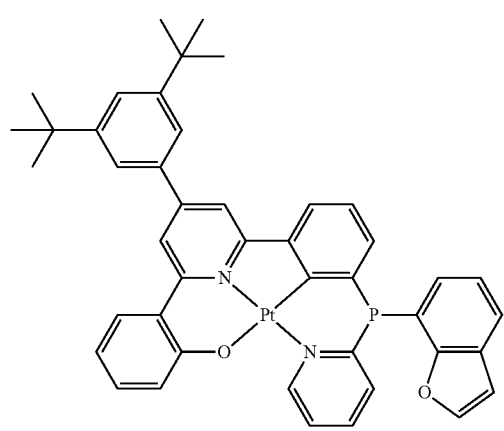
-continued
62
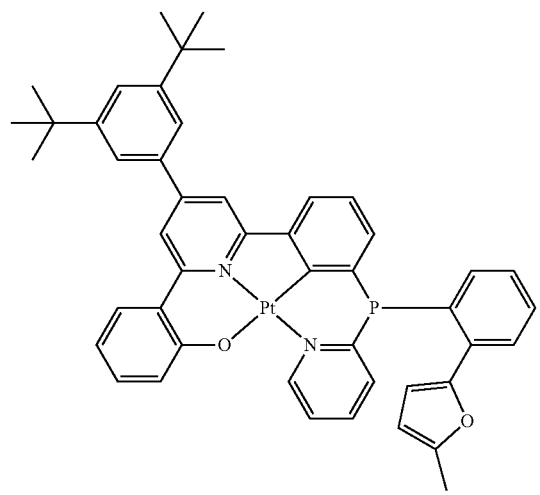
63
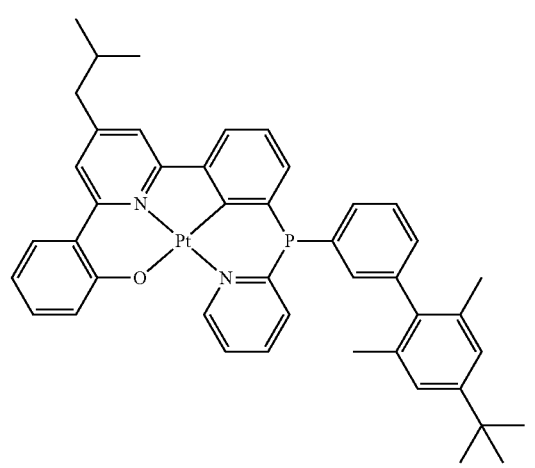
64
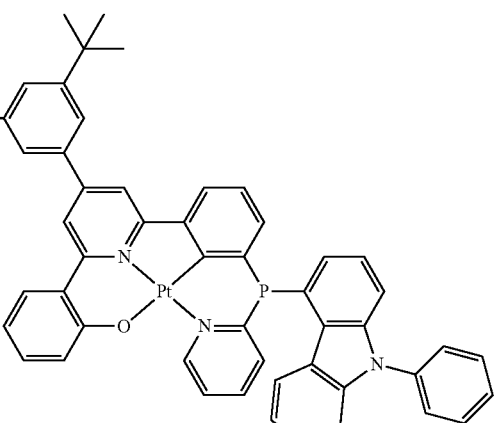

65
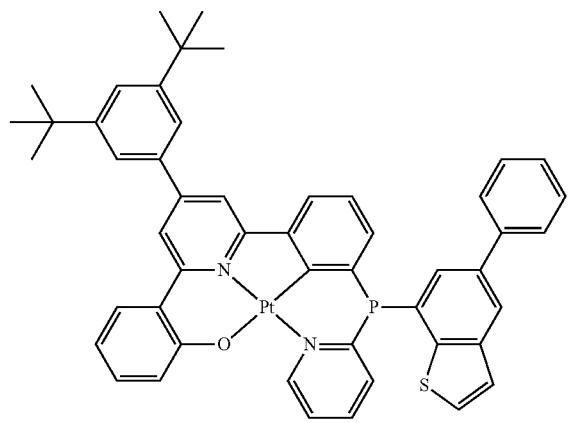
66
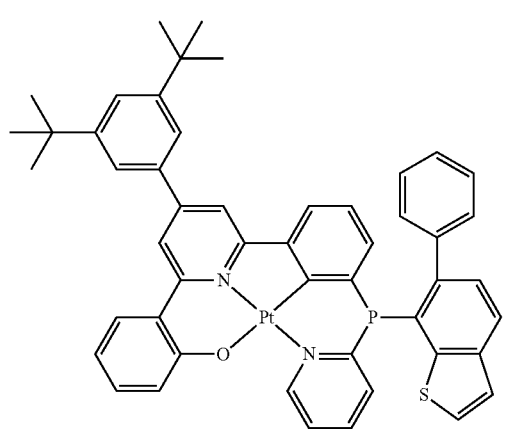
67
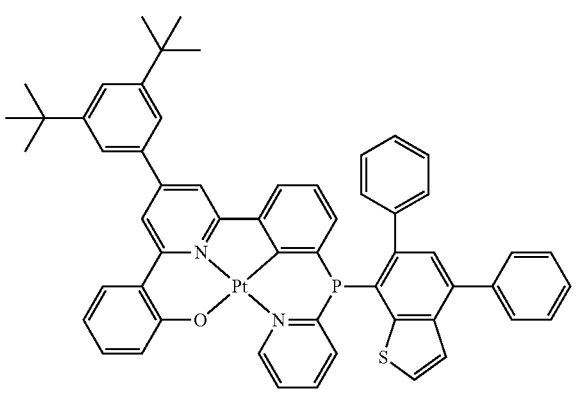
68
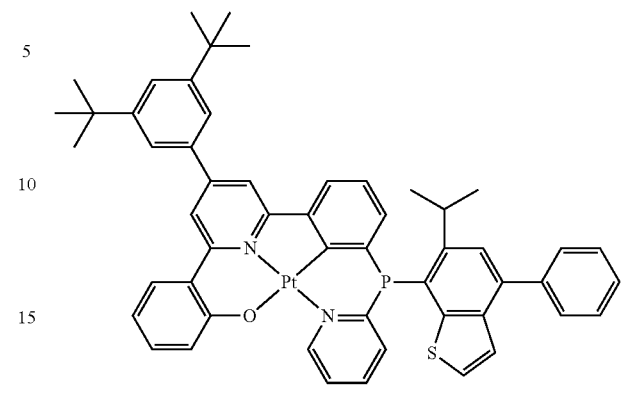
69
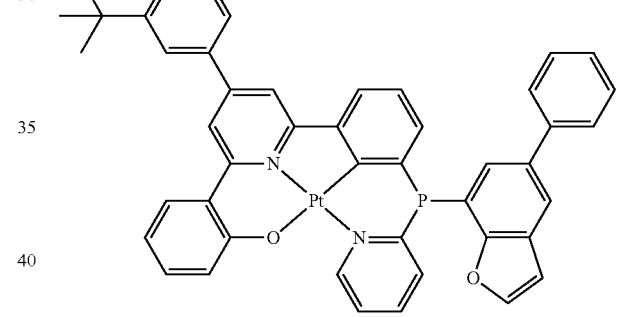
70
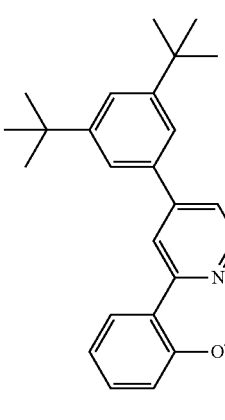

-continued

71

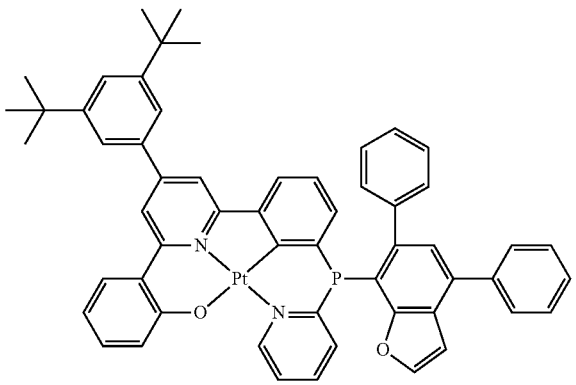

72

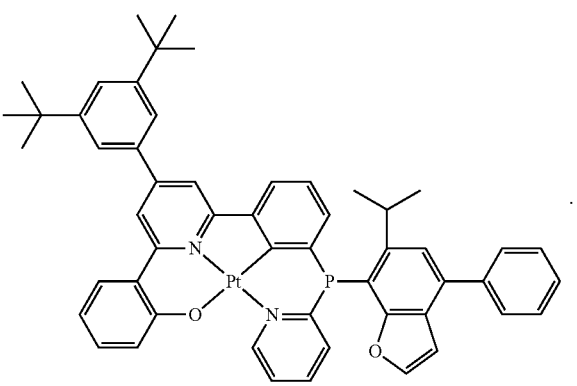

In Formula 1, $R_2$ and $R_3$ are not linked with each other, $R_3$ and $R_5$ are not linked with each other, and $R_4$ and $R_5$ are not linked with each other. Therefore, it is possible to obtain the effect that electron lobe of highest occupied molecular orbital (HOMO) and electron lobe of lowest unoccupied molecular orbital (LUMO) in the organometallic compound represented by Formula 1 are effectively separated from each other.

Also, $T_3$ in Formula 1 may be N, B, or P. Accordingly, since an $sp^3$ bond structure in Formula 1 can be effectively formed, the organometallic compound may have a three-dimensional structure that can substantially prevent aggregation between the organometallic compounds.

Furthermore, the moiety represented by

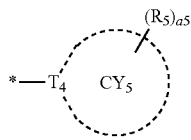

in Formula 1 has an asymmetric structure with respect to an axis connecting $T_3$ and $T_4$ in Formula 1. Hence, the planarity of the organometallic compound represented by Formula 1 may be broken, and thus a metal-metal interaction between the organometallic compounds represented by Formula 1 may be reduced. Consequently, exciton quenching such as triplet-triplet annihilation may be significantly reduced. Therefore, electronic devices, for example, organic light-emitting devices, which include such organometallic compounds represented by Formula 1, may have high luminescent efficiency and a long lifespan.

For example, the HOMO, LUMO, and triplet energy levels of Compounds 1 to 3 were evaluated by a DFT method of Gaussian program (structurally optimized at a level of B3LYP, 6-31G(d,p)), and evaluation results thereof are shown in Table 1.

TABLE 1

| Compound No. | HOMO (eV) | LUMO (eV) | $T_1$ (eV) |
| --- | --- | --- | --- |
| 1 | −4.603 | −1.521 | 2.254 |
| 2 | −4.609 | −1.527 | 2.245 |
| 3 | −4.619 | −1.397 | 2.354 |

From Table 1, it has been determined that the organometallic compound represented by Formula 1 has such electrical characteristics that are suitable for use in an electronic device, for example, for use as a dopant for an organic light-emitting device.

Synthesis methods of the organometallic compound represented by Formula 1 may be recognizable by those of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect of the present description provides an organic light-emitting device that includes:

a first electrode;

a second electrode; and an organic layer that is disposed between the first electrode and the second electrode, wherein the organic layer includes an emission layer and at least one organometallic compound represented by Formula 1.

The organic light-emitting device may have, due to the inclusion of an organic layer including the organometallic compound represented by Formula 1, a low driving voltage, high efficiency, high power, high quantum efficiency, a long lifespan, a low roll-off ratio, and excellent color purity.

The organometallic compound of Formula 1 may be used between a pair of electrodes of an organic light-emitting device. For example, the organometallic compound represented by Formula 1 may be included in the emission layer. In this embodiment, the organometallic compound may act as a dopant, and the emission layer may further include a host (that is, an amount of the organometallic compound represented by Formula 1 is smaller than an amount of the host).

The expression "(an organic layer) includes at least one of organometallic compounds" as used herein may include an embodiment in which "(an organic layer) includes identical organometallic compounds represented by Formula 1" and an embodiment in which "(an organic layer) includes two or more different organometallic compounds represented by Formula 1."

For example, the organic layer may include, as the organometallic compound, only Compound 1. In this regard, Compound 1 may be included in an emission layer of the organic light-emitting device. In one or more embodiments, the organic layer may include, as the organometallic compound, Compound 1 and Compound 2. In this embodiment, Compound 1 and Compound 2 may be included in an identical layer (for example, Compound 1 and Compound 2 may both be included in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode is an anode, and the second electrode is a cathode, and the organic layer further includes a hole transport region disposed between the first electrode and the emission layer and an electron transport region disposed between the emission layer and the second electrode, wherein the hole transport region includes a hole injection layer, a hole transport layer, an electron blocking layer, or any combination thereof, and wherein the electron transport region includes a hole blocking layer, an electron transport layer, an electron injection layer, or any combination thereof.

The term "organic layer" as used herein refers to a single layer and/or a plurality of layers disposed between the first electrode and the second electrode of the organic light-emitting device. The "organic layer" may include, in addition to an organic compound, an organometallic complex including metal.

FIG. 1 is a schematic view of an organic light-emitting device 10 according to an embodiment. Hereinafter, the structure of an organic light-emitting device according to an embodiment and a method of manufacturing an organic light-emitting device according to an embodiment will be described in connection with FIG. 1. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide ($SnO_2$), and zinc oxide (ZnO). In one or more embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

A hole injection layer may be formed on the first electrode 11 by using one or more suitable methods selected from vacuum deposition, spin coating, casting, or Langmuir-Blodgett (LB) deposition.

When a hole injection layer is formed by vacuum deposition, the deposition conditions may vary according to a compound that is used to form the hole injection layer, and the structure and thermal characteristics of the hole injection layer. For example, the deposition conditions may include a deposition temperature of about 100° C. to about 500° C., a vacuum pressure of about 10-8 torr to about $10^{-3}$ torr, and a deposition rate of about 0.01 Angstroms per second (Å/sec) to about 0 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), polyaniline/poly(4-styrene sulfonate) (PANI/PSS), a compound represented by Formula 201 below, and a compound represented by Formula 202 below:

-continued
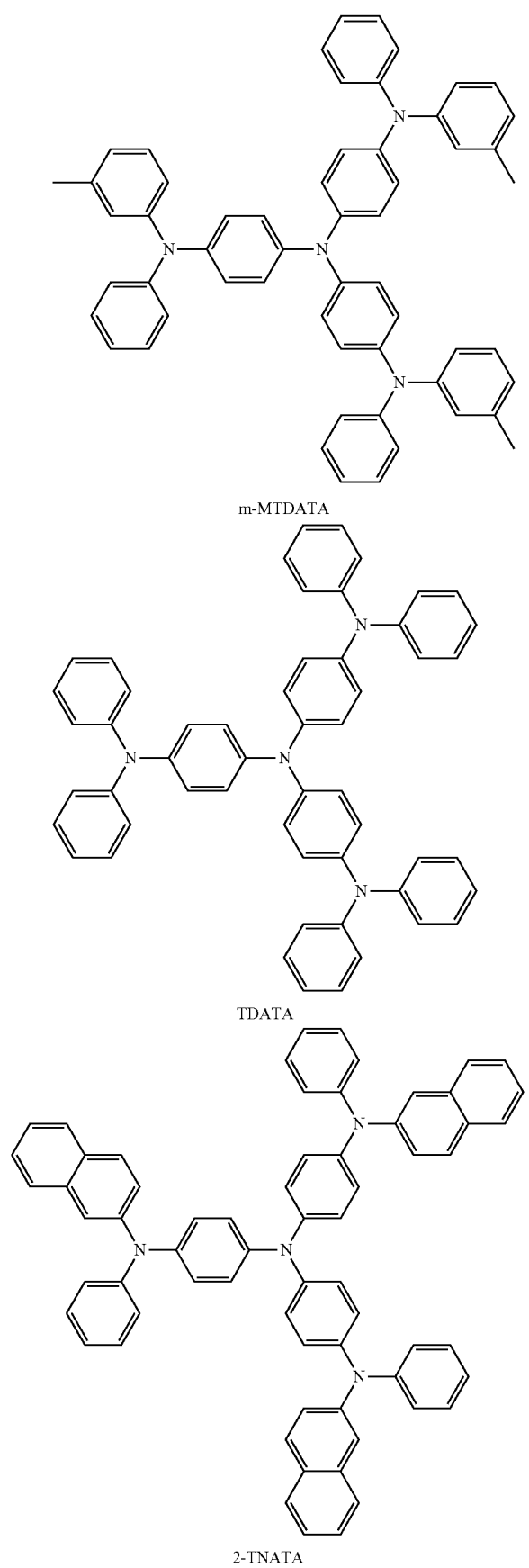
m-MTDATA
TDATA
2-TNATA
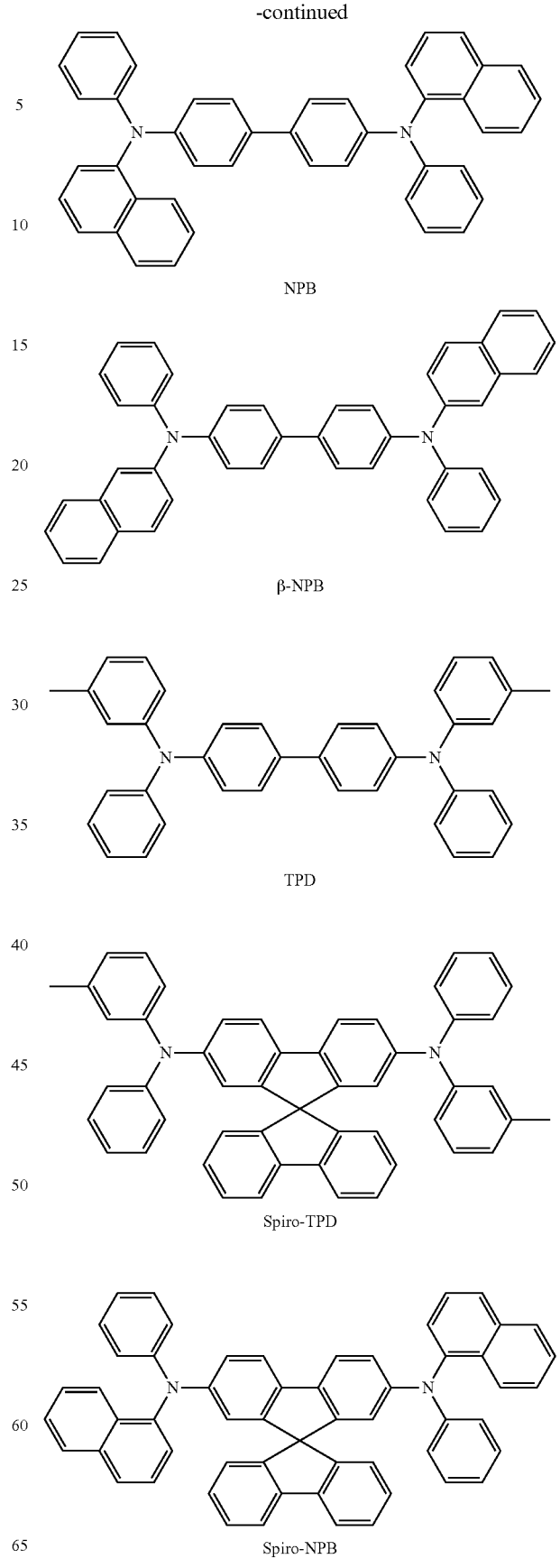
NPB
β-NPB
TPD
Spiro-TPD
Spiro-NPB -continued

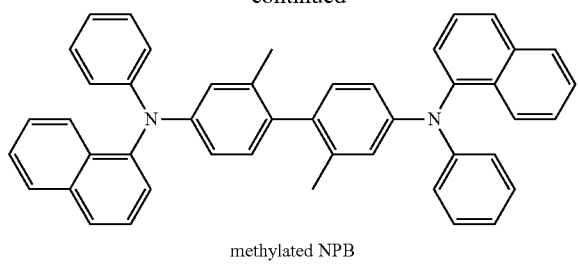

methylated NPB

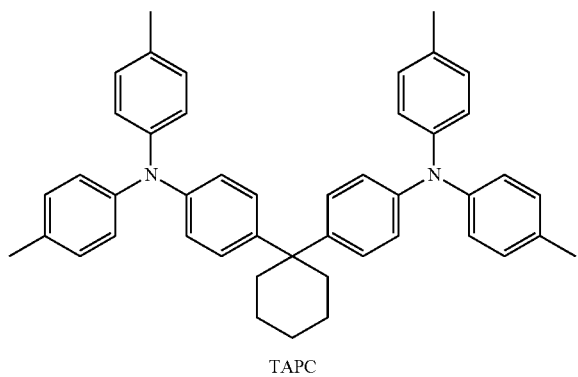

TAPC

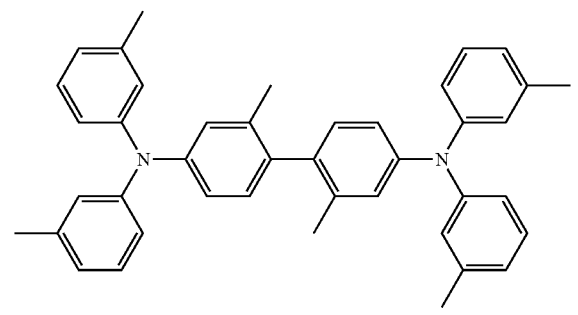

HMTPD

Formula 201

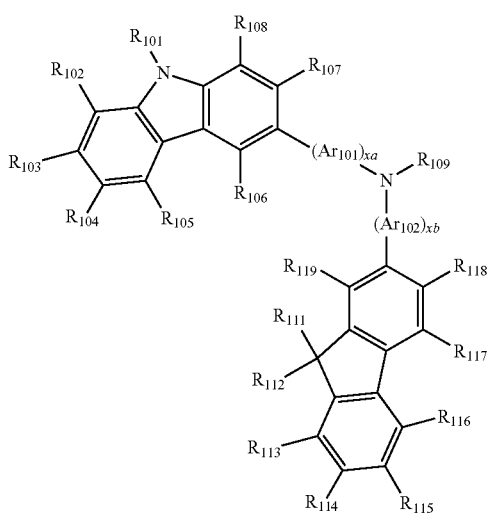

-continued

Formula 202

Ar$_{101}$ and Ar$_{102}$ in Formula 201 may each independently be selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In Formula 201, xa and xb may each independently be an integer from 0 to 5, or 0, 1, or 2. For example, xa is 1 and xb is 0, but xa and xb are not limited thereto. R$_{101}$ to R$_{108}$, R$_{111}$ to R$_{119}$, and R$_{121}$ to R$_{124}$ in Formulae 201 and 202 may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and so on), or a $C_1$-$C_{10}$ alkoxy group (for example, a methoxy group, an ethoxy group, a propoxy group, a butoxy group, a pentoxy group, and so on);

a $C_1$-$C_{10}$ alkyl group or a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments of the present disclosure are not limited thereto.

$R_{109}$ in Formula 201 may be selected from:

a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

According to an embodiment, the compound represented by Formula 201 may be represented by Formula 201A, but embodiments of the present disclosure are not limited thereto:

Formula 201A $R_{101}$, $R_{111}$, $R_{112}$, and $R_{109}$ in Formula 201A may be understood by referring to the description provided herein.

For example, the compound represented by Formula 201, and the compound represented by Formula 202 may include compounds HT1 to HT20 illustrated below, but are not limited thereto:

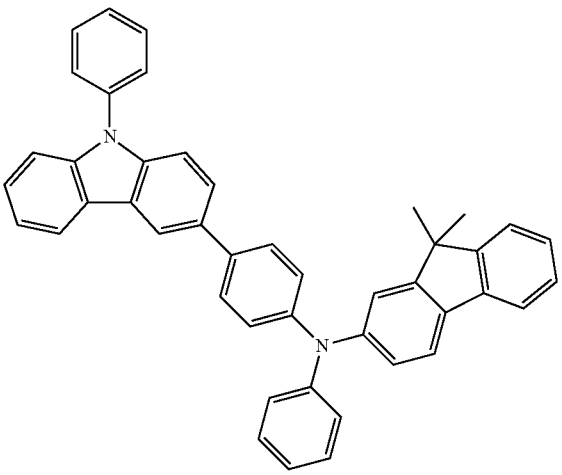

HT1

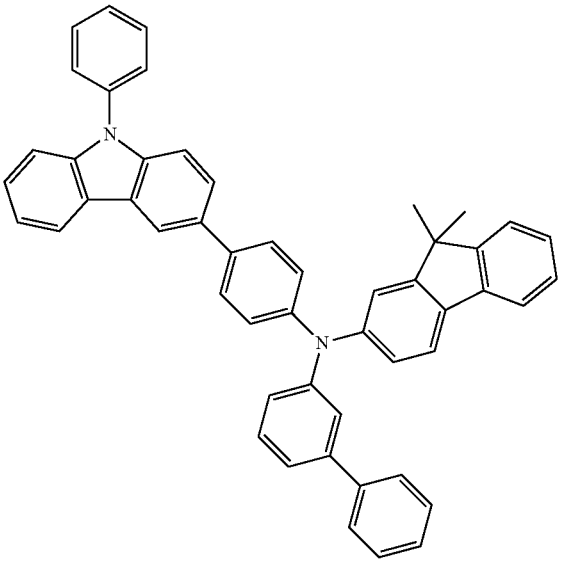

HT2

HT3
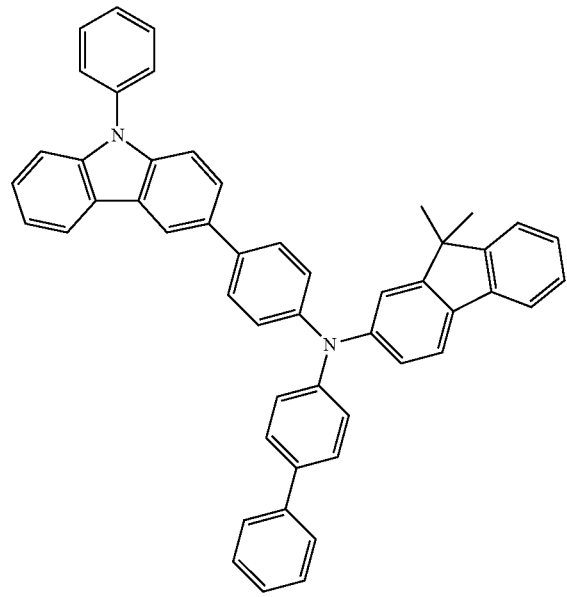
HT4
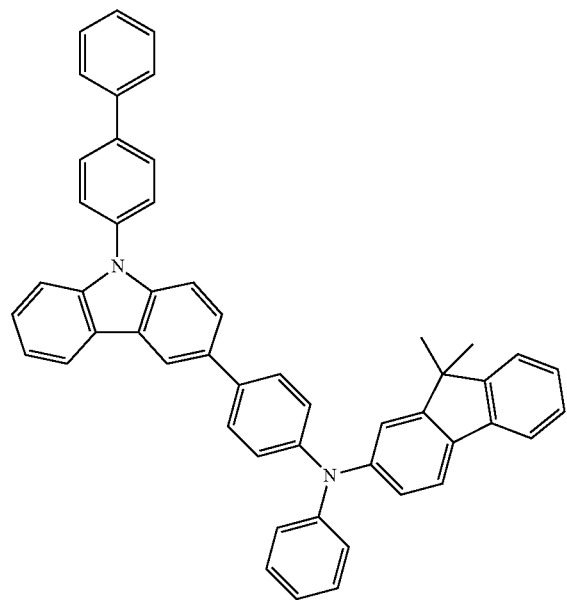
HT5
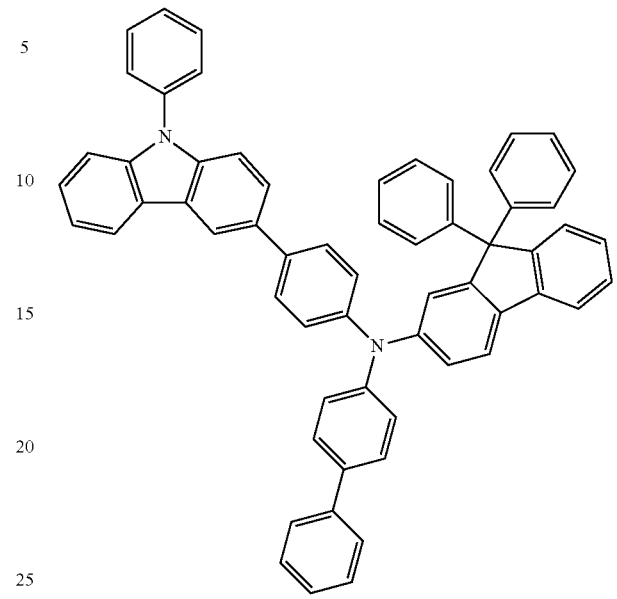
HT6
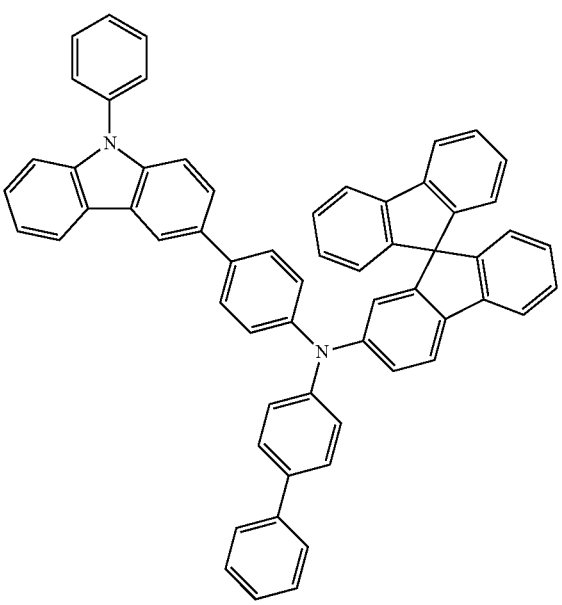

HT7
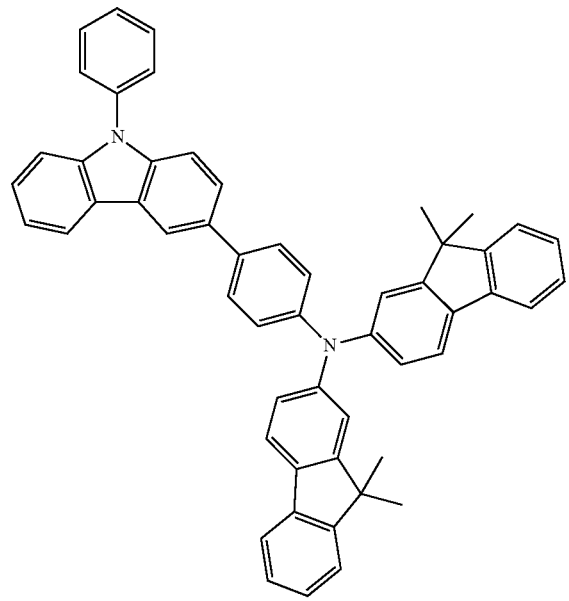
HT8
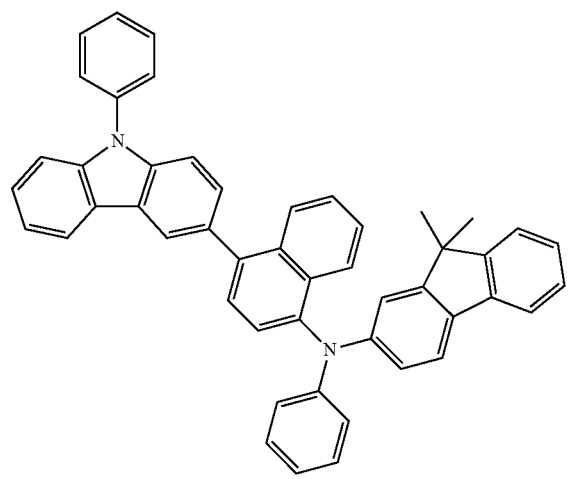
HT9
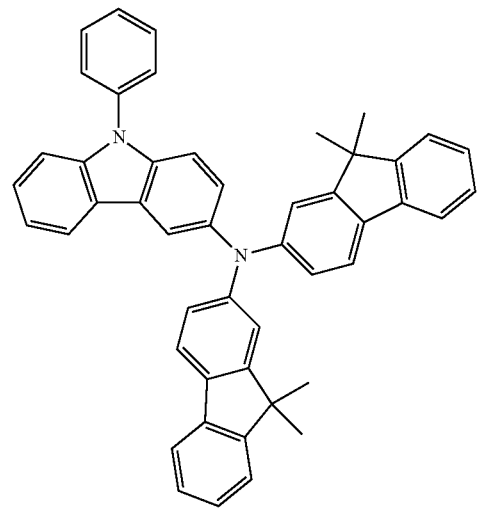
HT10
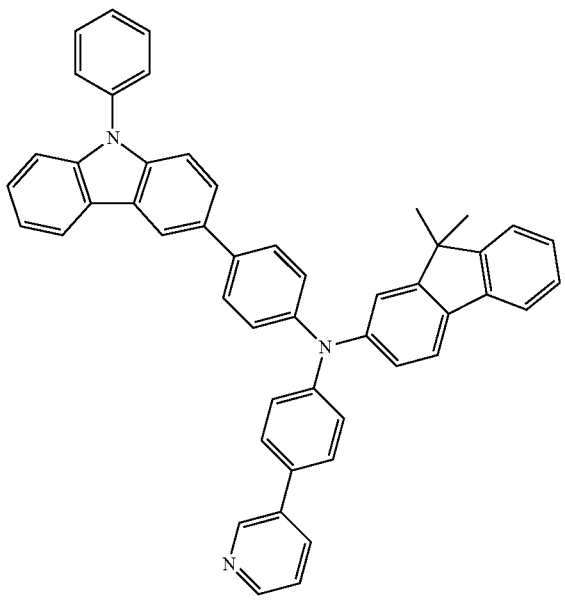
HT11
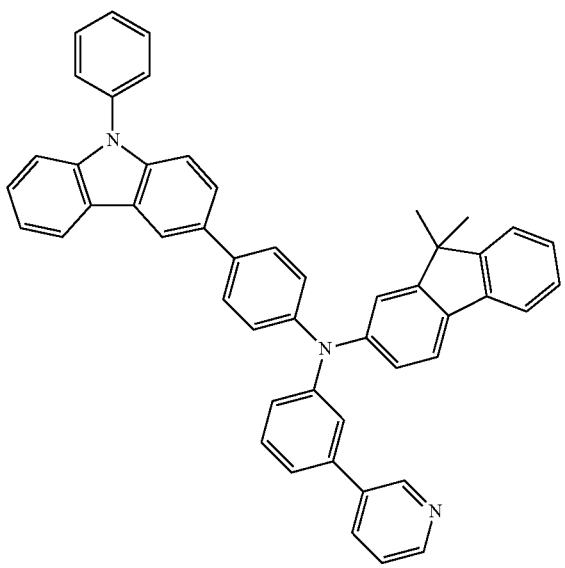

HT12
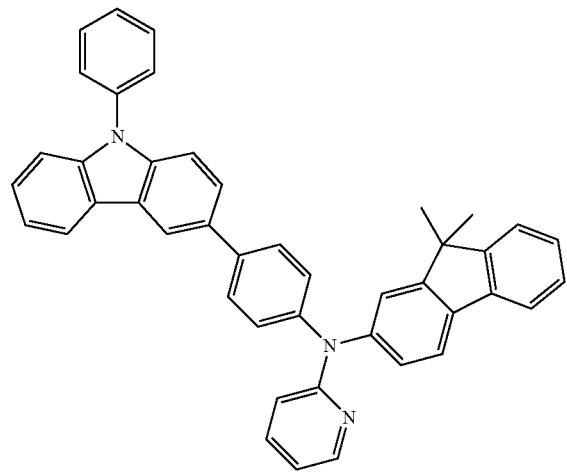
HT16
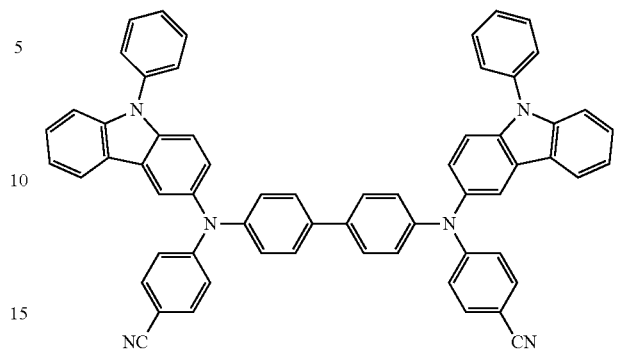
HT13
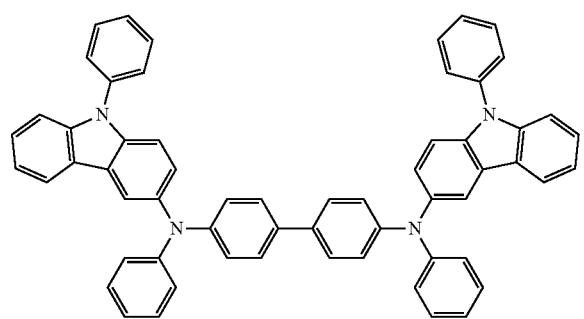
HT17
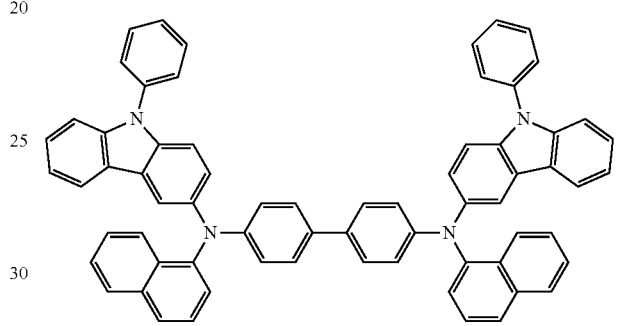
HT14
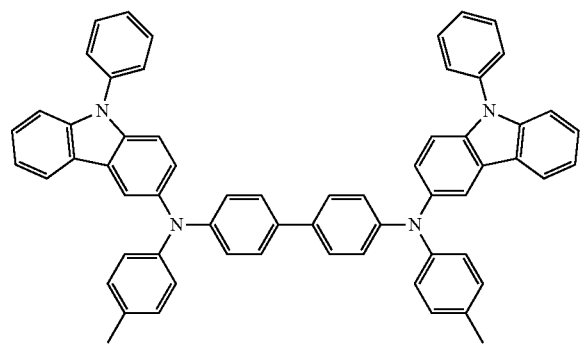
HT18
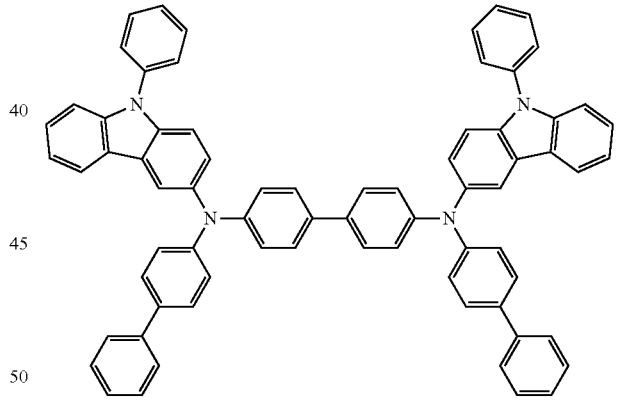
HT15
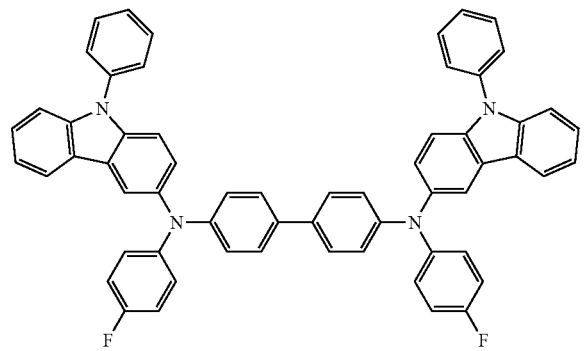
HT19
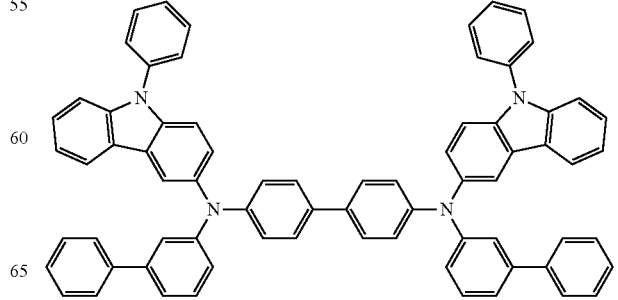

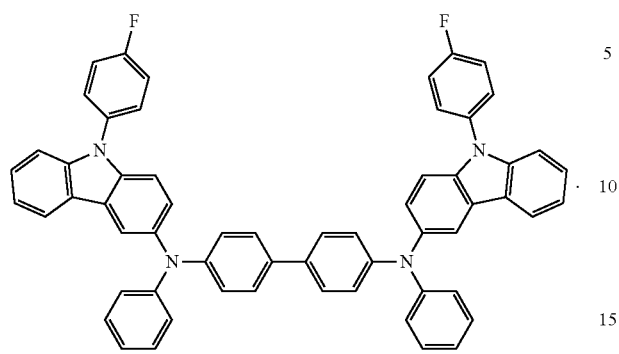

HT20

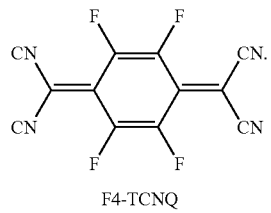

F4-TCNQ

A thickness of the hole transport region may be in a range of about 100 Angstroms (Å) to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as Compound HT-D1 below, but are not limited thereto:

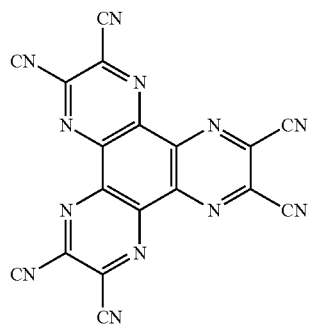

HT-D1

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1.

The host may include at least one selected from TPBi, TBADN, ADN (also referred to as "DNA"), CBP, CDBP, TCP, mCP, Compound H50, and Compound H51:

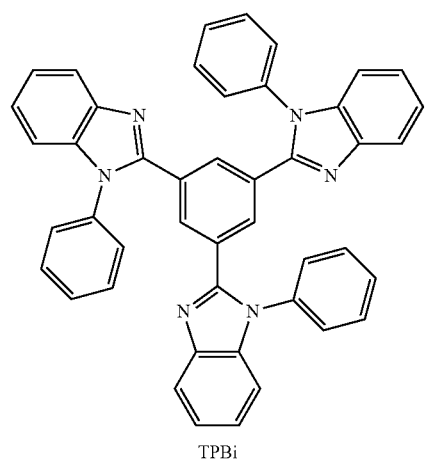

TPBi

-continued

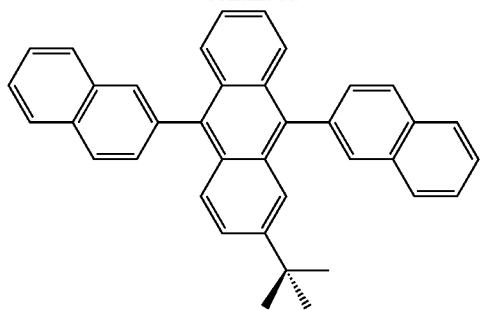

TBADN

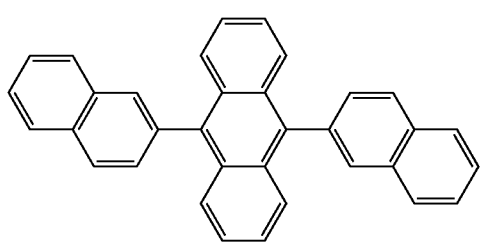

ADN

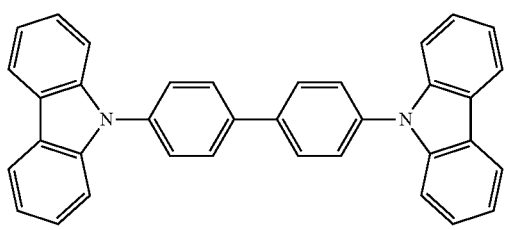

CBP

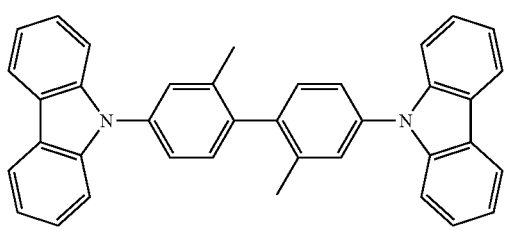

CDBP

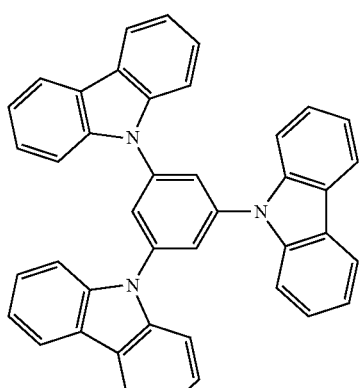

TCP

-continued

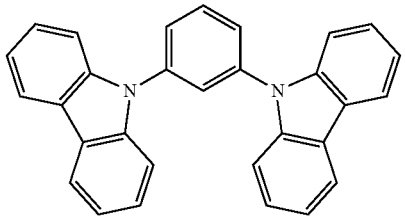

mCP

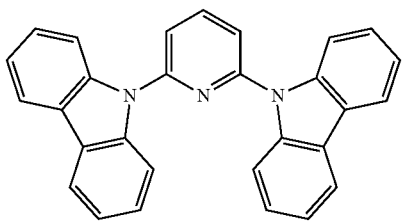

H50

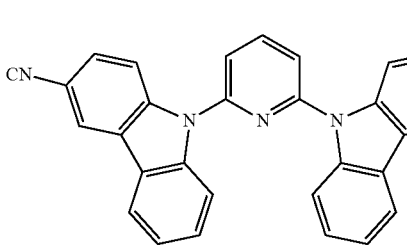

H51

In one or more embodiments, the host may further include a compound represented by Formula 301 below.

Formula 301

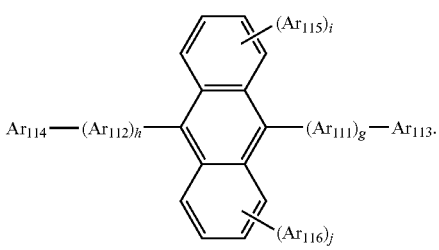

$Ar_{111}$ and $Ar_{112}$ in Formula 301 may each independently be selected from:

a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

$Ar_{113}$ to $Ar_{116}$ in Formula 301 may each independently be selected from:

a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group.

g, h, i, and j in Formula 301 may each independently be an integer from 0 to 4, and may be, for example, 0, 1, or 2.

$Ar_{113}$ to $Ar_{116}$ in Formula 301 may each independently be selected from:

a $C_1$-$C_{10}$ alkyl group, substituted with at least one selected from a phenyl group, a naphthyl group, and an anthracenyl group;

a phenyl group, a naphthyl group, an anthracenyl group, a pyrenyl, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

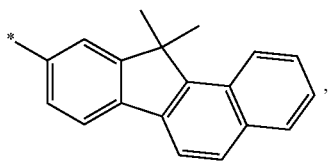 [SMILES: *c1ccc2c(c1)C(C)(C)c1c-2ccc2ccccc12]

but embodiments of the present disclosure are not limited thereto.

In one or more embodiments, the host may include a compound represented by Formula 302 below:

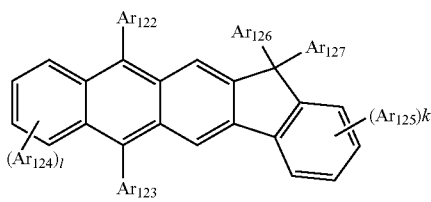

Formula 302

$Ar_{122}$ to $Ar_{125}$ in Formula 302 are the same as described in detail in connection with $Ar_{113}$ in Formula 301.

$Ar_{126}$ and $Ar_{127}$ in Formula 302 may each independently be a $C_1$-$C_{10}$ alkyl group (for example, a methyl group, an ethyl group, or a propyl group).

k and l in Formula 302 may each independently be an integer from 0 to 4. For example, k and l may be 0, 1, or 2.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto:

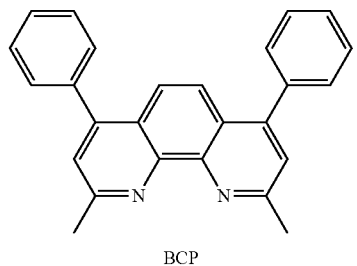

BCP

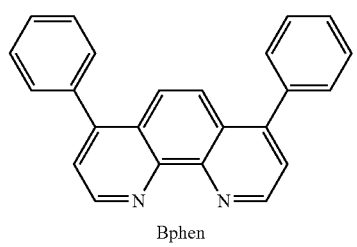

Bphen

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have improved hole blocking ability without a substantial increase in driving voltage.

The electron transport layer may further include at least one selected from BCP, Bphen, Alq$_3$, BAlq, TAZ, and NTAZ:
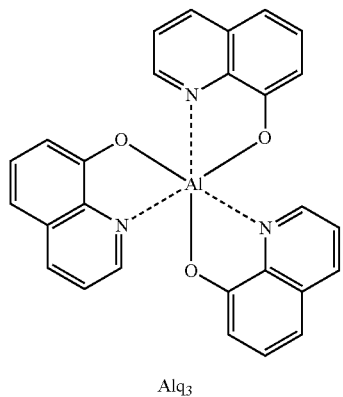
Alq$_3$
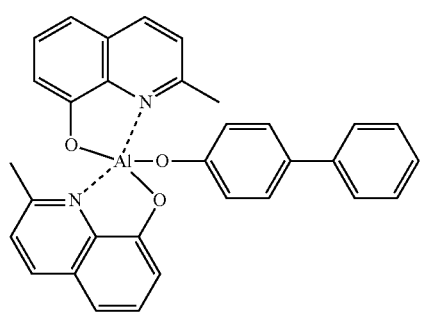
BAlq
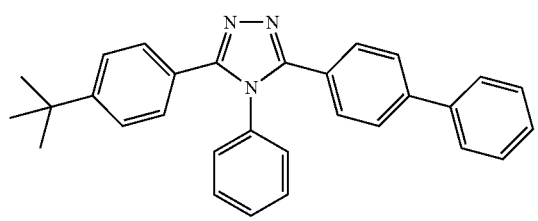
TAZ
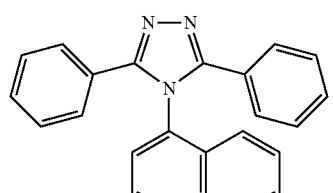
NTAZ
In one or more embodiments, the electron transport layer may include at least one of ET1 and ET25, but are not limited thereto:
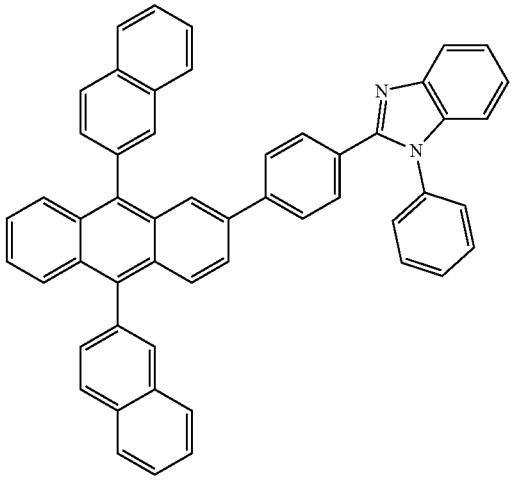
ET1
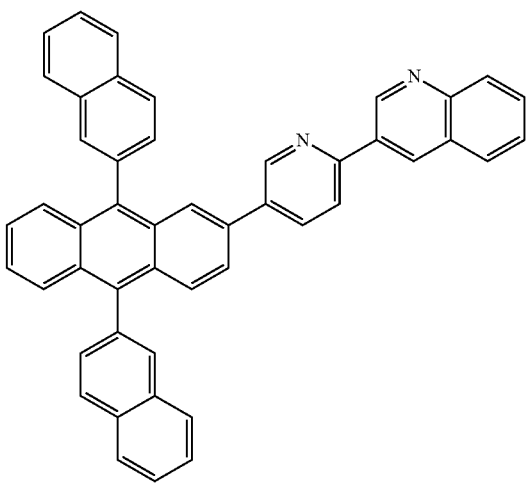
ET2
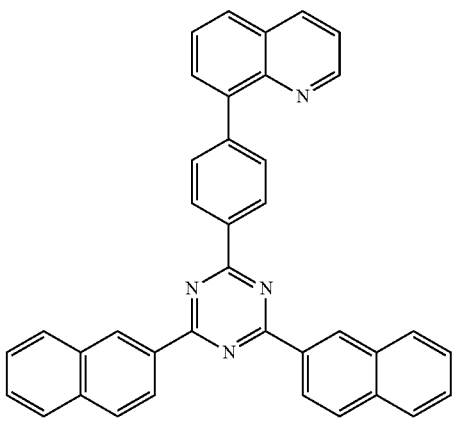
ET3

-continued
ET4
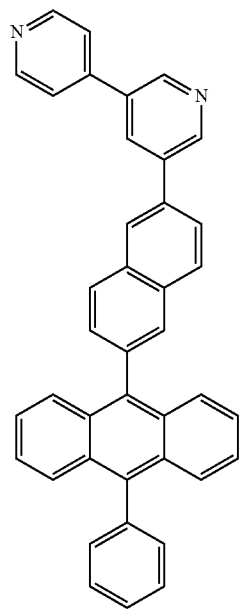
ET7
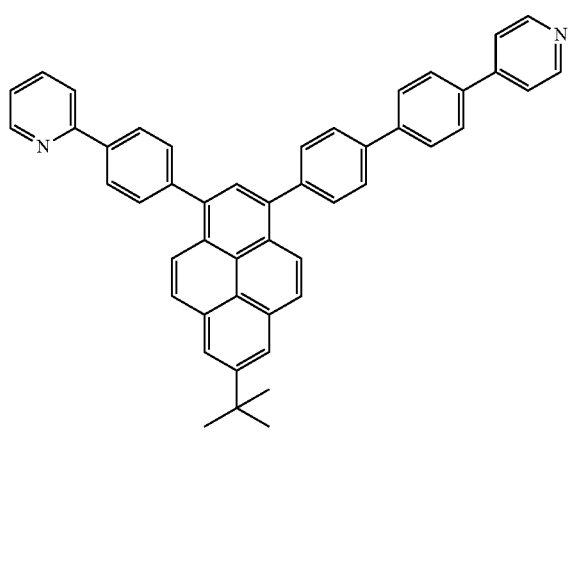
ET5
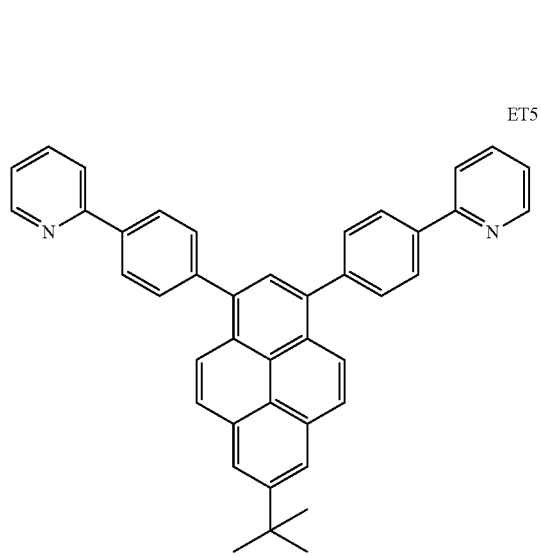
ET8
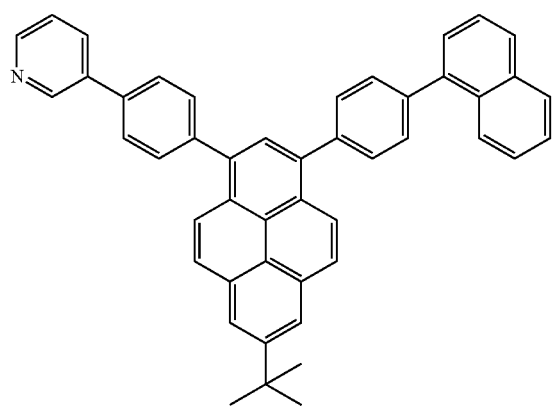
ET6
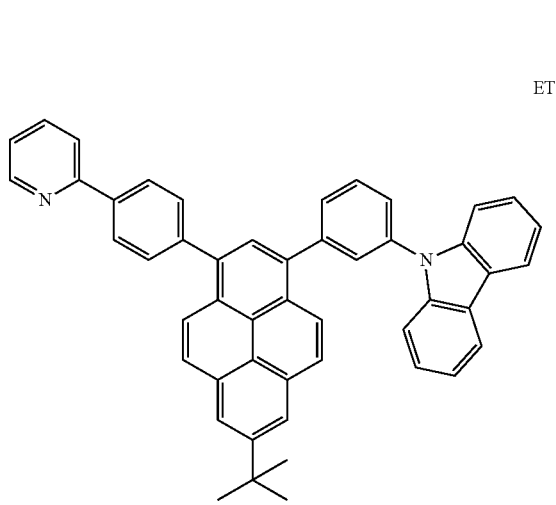
ET9
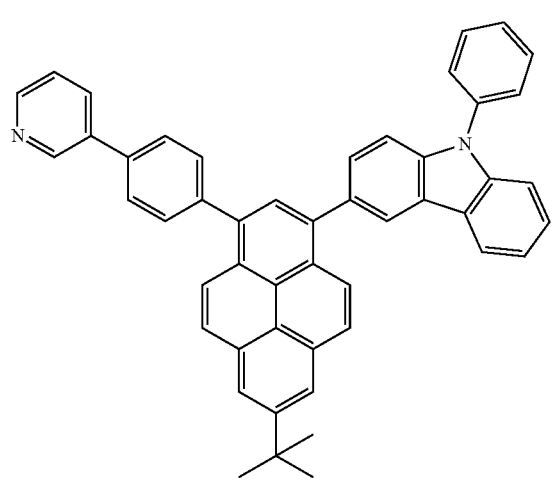

-continued
ET10
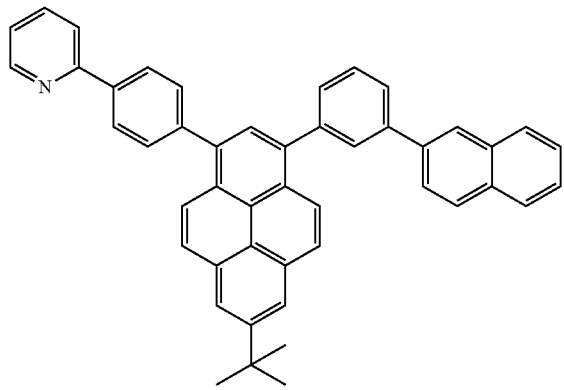
ET11
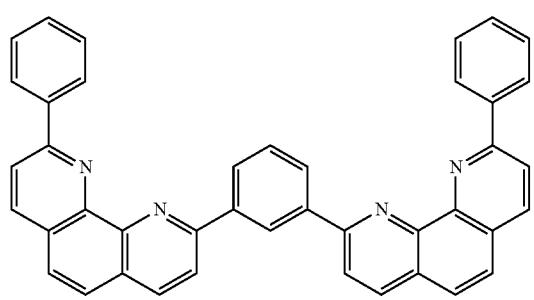
ET12
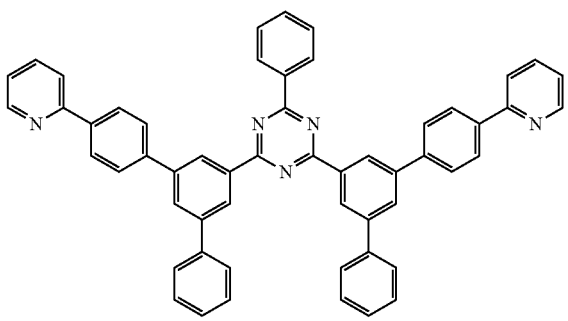
ET13
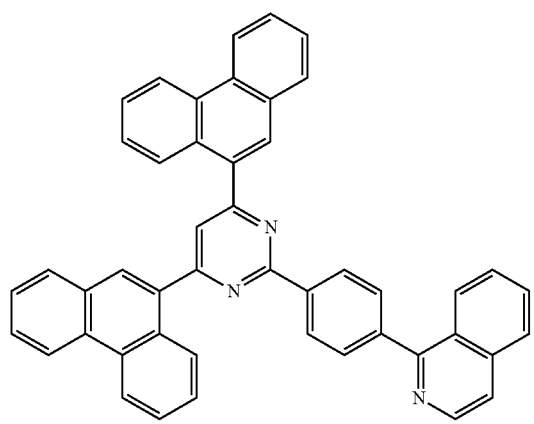
-continued
ET14
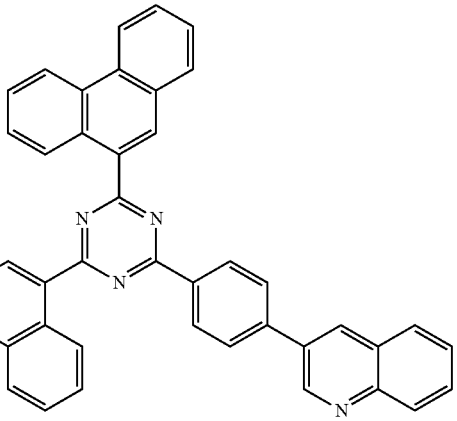
ET15
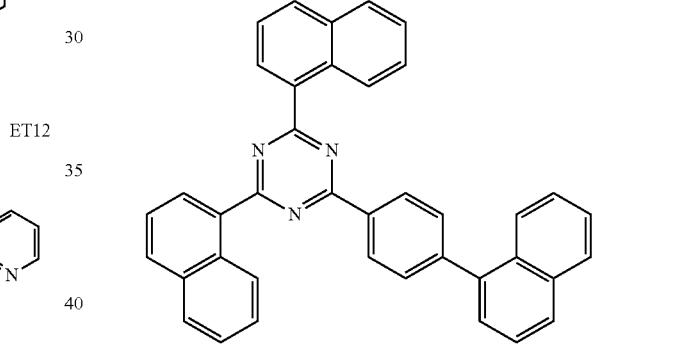
ET16
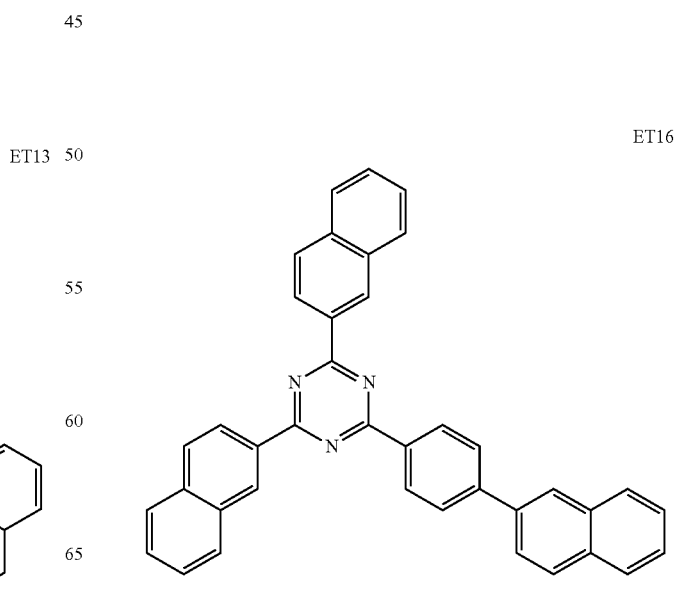

ET17
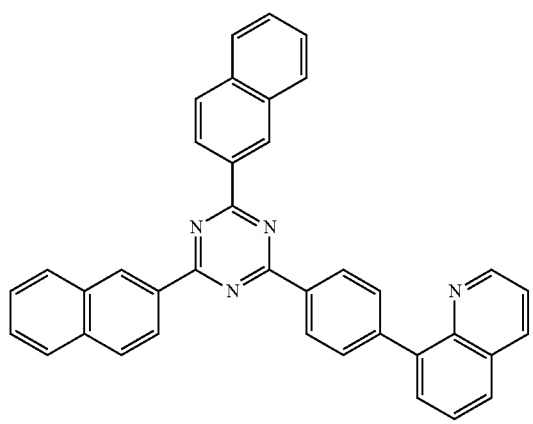
ET18
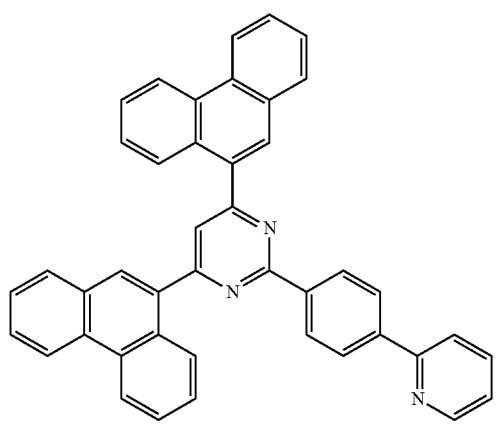
ET19
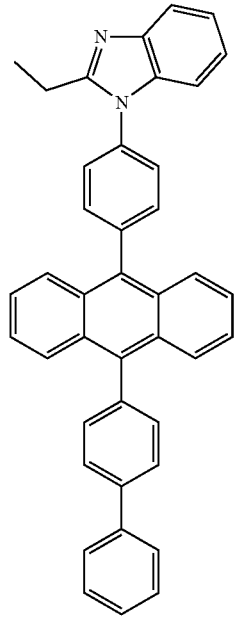
ET20
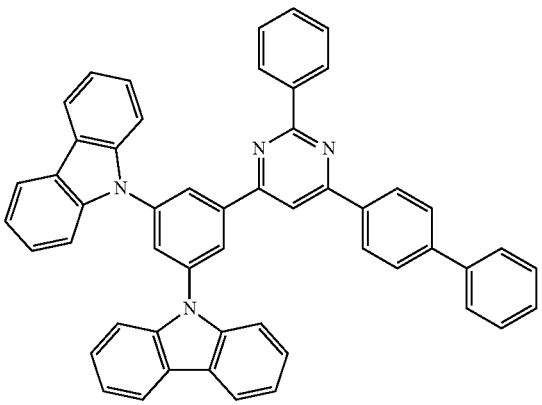
ET21
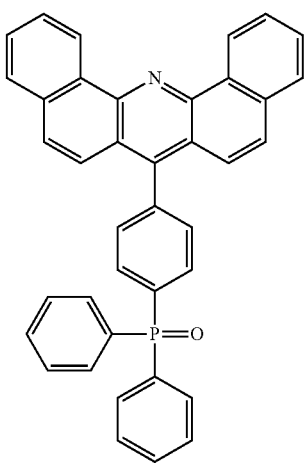
ET22
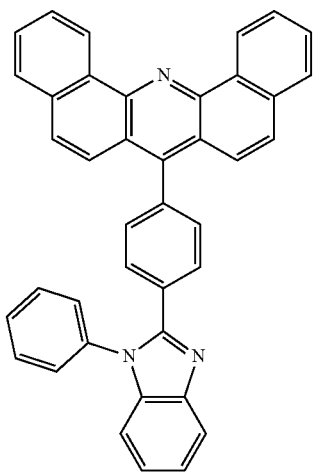

ET23

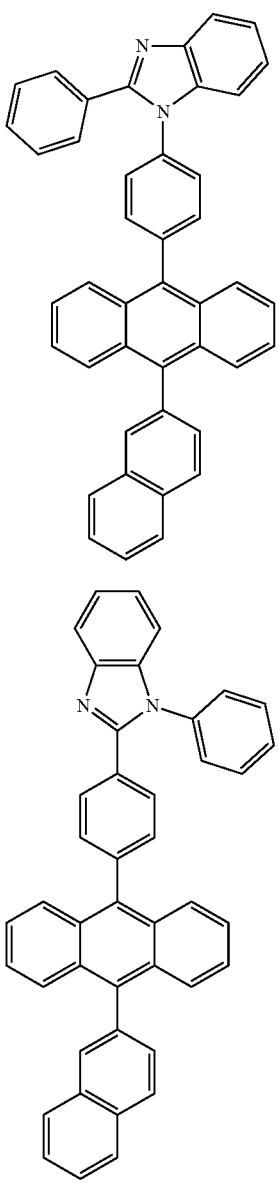

ET24

ET25

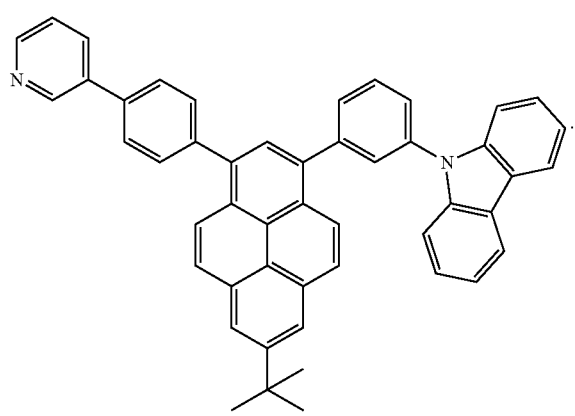

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or ET-D2:

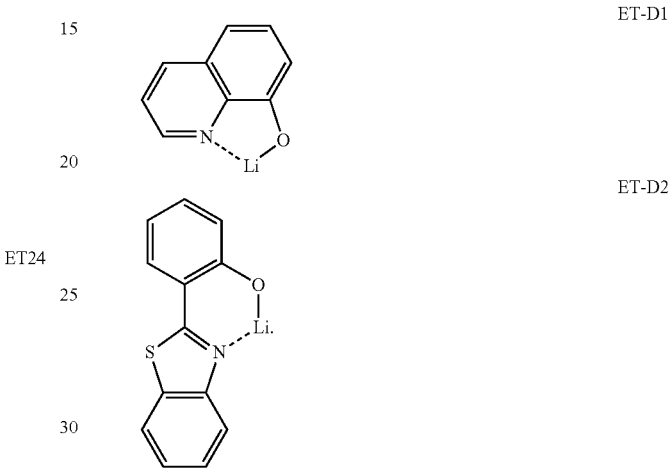

The electron transport region may include an electron injection layer that promotes flow of electrons from the second electrode 19 thereinto.

The electron injection layer may include at least one selected from LiF, NaCl, CsF, $Li_2O$, and BaO.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to FIG. 1, but embodiments of the present disclosure are not limited thereto.

Another aspect of the present disclosure provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —O$A_{101}$ (wherein $A_{101}$ is the $C_1$-$C_{60}$ alkyl group), and non-limiting examples thereof include a methoxy group, an ethoxy group, and an iso-propyloxy group.

The term "$C_2$-$C_{60}$ alkenyl group" as used herein refers to a hydrocarbon group formed by including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by including at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and that has no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other. The term "$C_7$-$C_{60}$ alkylaryl group" as used herein refers to a $C_6$-$C_{60}$ aryl group substituted with at least one $C_1$-$C_{60}$ alkyl group.

The term "$C_1$-$C_{60}$ heteroaryl group" as used herein refers to a monovalent group having a carbocyclic aromatic system that has at least one heteroatom selected from N, O, P, Si, and S as a ring-forming atom, and 1 to 60 carbon atoms. The term "$C_1$-$C_{60}$ heteroarylene group" as used herein refers to a divalent group having a carbocyclic aromatic system that has at least one heteroatom selected from N, O, P, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other. The term "$C_2$-$C_{60}$ alkylheteroaryl group" refers to a $C_1$-$C_{60}$ heteroaryl group substituted with at least one $C_1$-$C_{60}$ alkyl group.

The term "$C_6$-$C_{60}$ aryloxy group" as used herein indicates —O$A_{102}$ (wherein $A_{102}$ is the $C_6$-$C_{60}$ aryl group), and the term a "$C_6$-$C_{60}$ arylthio group" as used herein indicates —S$A_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and having no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The $C_1$-$C_{30}$ heterocyclic group may be a monocyclic group or a polycyclic group.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkylheteroaryl group, the substituted monovalent non-aromatic condensed polycyclic group, and the substituted monovalent non-aromatic condensed heteropolycyclic group may be selected from:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_1$ heterocycloalkyl group, a $C_3$-$C_{10}$ cycloalkenyl group, a $C_1$-$C_1$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(=O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, and a monovalent non-aromatic condensed heteropolycyclic group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, and a monovalent non-aromatic condensed heteropolycyclic group.

Hereinafter, a compound and an organic light-emitting device according to embodiments are described in detail with reference to Synthesis Examples and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1: Synthesis of Compound 1

Synthesis of Intermediate 1(3)

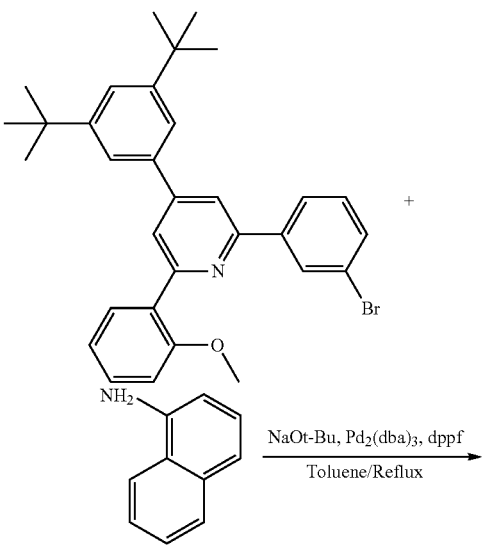

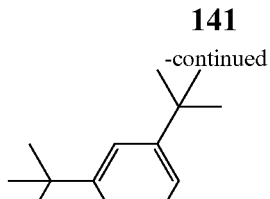

Intermediate 1(3)

4 grams (g) (7.57 millimoles, mmol) of 2-(3-bromophenyl)-4-(3,5-di-tert-butylphenyl)-6-(2-methoxyphenyl)pyridine, 1.42 g (8.32 mmol) of naphthalen-1-amine, 0.28 g (0.30 mmol) of Pd$_2$(dba)$_3$ (tris(dibenzylideneacetone)dipalladium(0)), 0.17 g (0.30 mmol) of dppf (1,1'-ferrocenediylbis(diphenylphosphine)), and 1.82 g (18.92 mmol) of sodium tert-butoxide were mixed with 100 milliliters (mL) of toluene. Then, the mixture was stirred at a temperature of 120° C. for 18 hours, cooled to room temperature, and filtered. An organic layer was extracted therefrom by using methylene chloride (MC), dried by using anhydrous magnesium sulfate (MgSO$_4$), and filtered to obtain a filtrate. Then, the residual obtained from the filtrate under reduced pressure was purified by column chromatography with ethyl acetate (EA):hexane=5:95 an eluent to obtain 3.43 g (76.7%) of Intermediate 1(3). The obtained product was confirmed by Mass and HPLC analysis.

HRMS (MALDI) calcd for C$_{42}$H$_{42}$N$_2$O: m/z 590.3297, Found: 590.3298.

Synthesis of Intermediate 1(2)

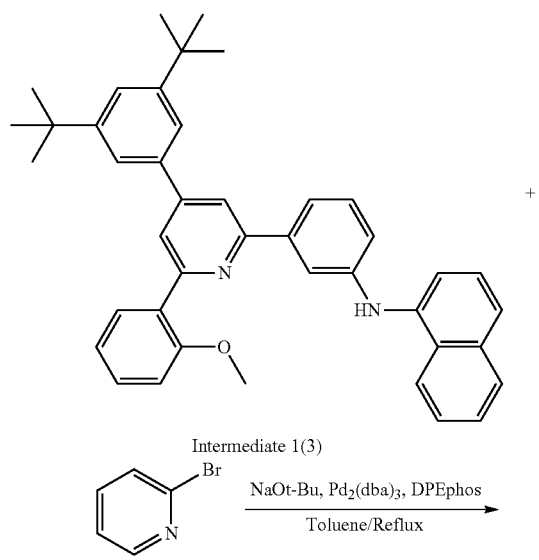

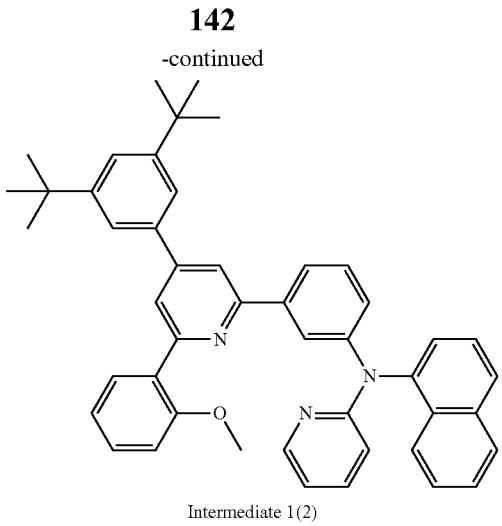

Intermediate 1(2)

3.3 g (5.59 mmol) of Intermediate 1(3), 3.53 g (22.34 mmol) of 2-bromopyridine, 1.84 g (2.01 mmol) of Pd$_2$(dba)$_3$ (tris(dibenzylideneacetone)dipalladium(0)), 2.11 g (3.91 mmol) of DPEphos (bis[(2-diphenylphosphino)phenyl] ether), and 1.07 g (11.17 mmol) of sodium tert-butoxide were mixed with 100 mL of toluene. The mixture was stirred at a temperature of 120° C. for 18 hours, cooled to room temperature, and filtered. An organic layer was extracted therefrom by using MC, dried by using anhydrous magnesium sulfate (MgSO$_4$), and filtered to obtain a filtrate. A residual obtained from the filtrate under reduced pressure was purified by column chromatography with EA:hexane: methanol=1:3:5 as an eluent to obtain 2.70 g (72.4%) of Intermediate 1(2). The obtained product was confirmed by Mass and HPLC analysis.

HRMS (MALDI) calcd for C$_{47}$H$_{45}$N$_3$O: m/z 667.3563, Found: 667.3565.

Synthesis of Intermediate 1(1)

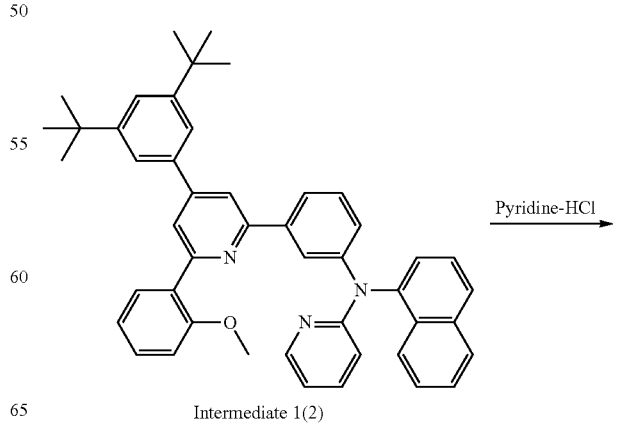

-continued

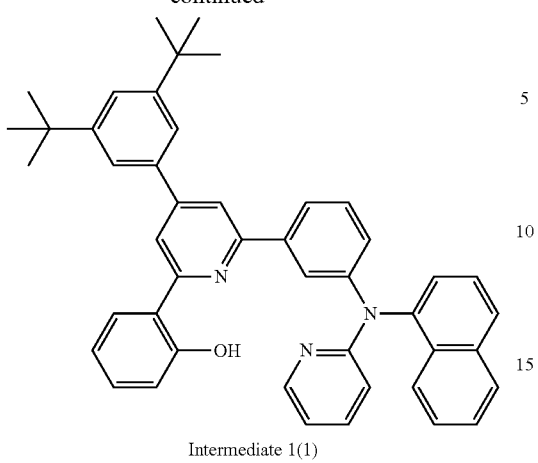

Intermediate 1(1)

2.70 g (4.04 mmol) of Intermediate 1(2) was mixed with 20.32 g (80.85 mmol) of pyridine-HCl. The mixture was stirred at a temperature of 170° C. for 24 hours, cooled to room temperature, and filtered. An organic layer was extracted therefrom by using MC, dried by using anhydrous magnesium sulfate (MgSO$_4$), and filtered to obtain a filtrate. Then, a residue obtained from the filtrate under reduced pressure was purified by column chromatography with EA:hexane:methanol=1:2:2 as an eluent to obtain 2.0 g (75.8%) of pyridine-HCl. The obtained product was confirmed by Mass and HPLC analysis.

HRMS (MALDI) calcd for $C_{46}H_{43}N_3O$: m/z 653.3406, Found: 653.3409.

Synthesis of Compound 1

-continued

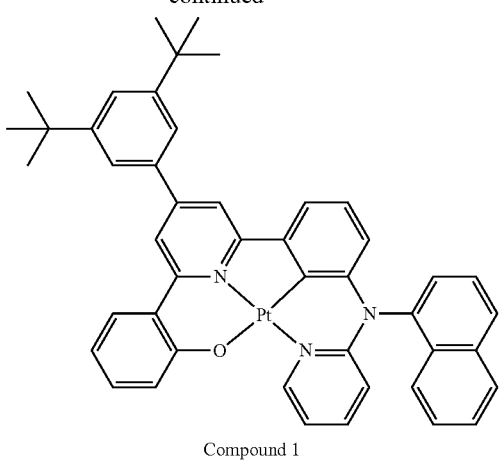

Compound 1

2.0 g (3.06 mmol) of Intermediate 1(1) and 1.15 g (2.77 mmol) of K$_2$PtCl$_4$ were mixed with 60 mL of acetic acid, and 10 mL of CH$_2$Cl$_2$ was added thereto. The mixture was stirred at a temperature of 125° C. for 24 hours. After the reaction was completed, the mixture was cooled. A compound obtained therefrom was filtered to obtain a solid. The solid was thoroughly washed by using methanol and melted. The crude product was purified by column chromatography with CH$_2$Cl$_2$:hexane=4:1 as an eluent to obtain 1.59 g (61%) of Compound 1. The obtained product was confirmed by Mass and HPLC analysis.

HRMS (MALDI) calcd for $C_{46}H_{41}N_3OPt$: m/Z 846.2897, Found: 846.2899.

Synthesis Example 2: Synthesis of Compound 2

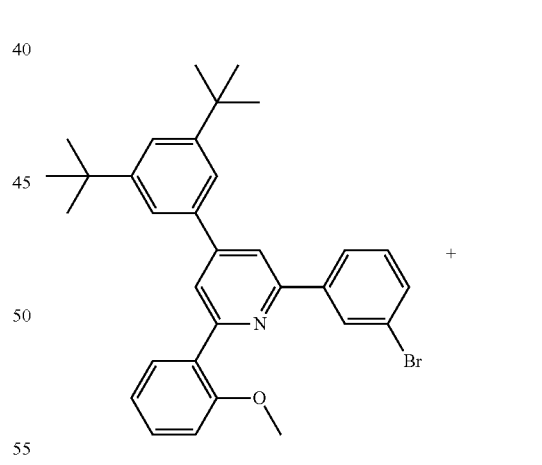

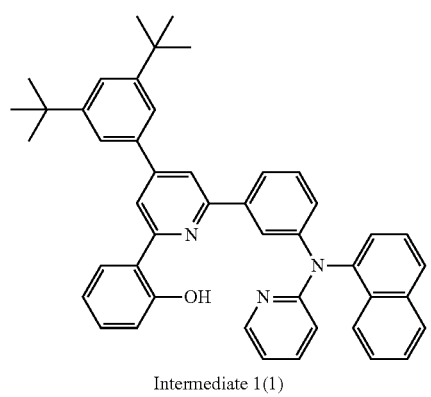

Intermediate 1(1)

-continued

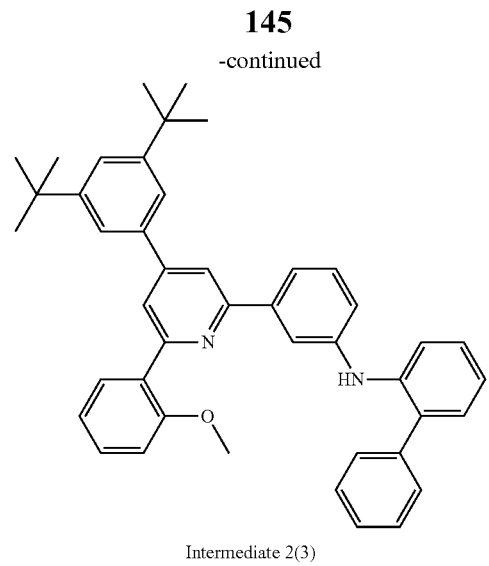

Intermediate 2(3)

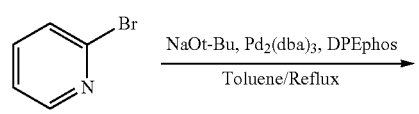

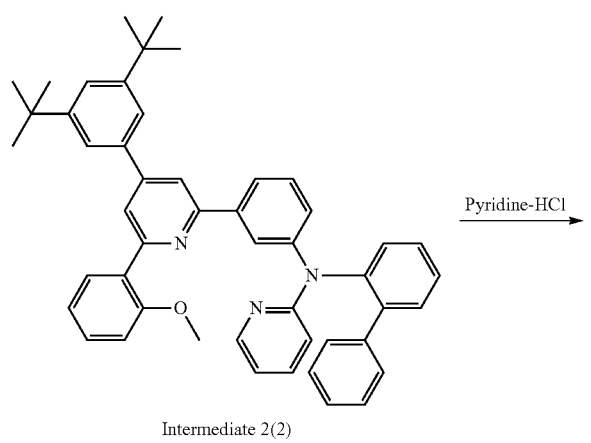

Intermediate 2(2)

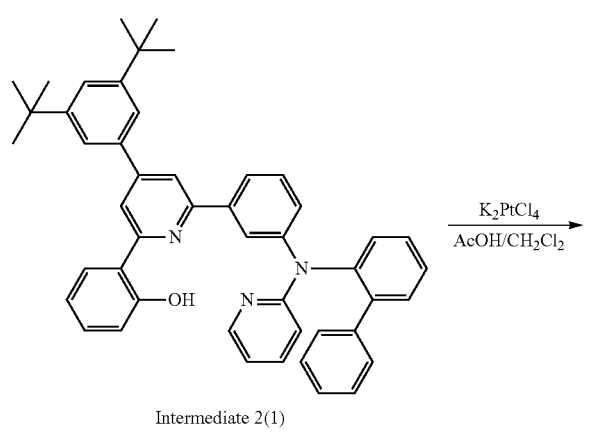

Intermediate 2(1)

-continued

[Compound 2 structure]

Compound 2

Synthesis of Intermediate 2(3)

3.22 g (75.1%) of Intermediate 2(3) was obtained in the same manner as Intermediate 1(3) of Synthesis Example 1, except that 2-phenylbenzenamine was used instead of naphthalen-1-amine. The obtained product was confirmed by Mass and HPLC analysis.

HRMS (MALDI) calcd for $C_{44}H_{44}N_2O$: m/z 616.35, Found: 617.43.

Synthesis of Intermediate 2(2)

2.65 g (71.3%) of Intermediate 2(2) was obtained in the same manner as Intermediate 1(2) of Synthesis Example 1, except that Intermediate 2(3) was used instead of Intermediate 1(3). The obtained product was confirmed by Mass and HPLC analysis.

HRMS (MALDI) calcd for $C_{49}H_{47}N_3O$: m/z 693.37, Found: 694.41.

Synthesis of Intermediate 2(1)

1.99 g (75.5%) of Intermediate 2(1) was obtained in the same manner as Intermediate 1(1) of Synthesis Example 1, except that Intermediate 2(2) was used instead of Intermediate 1(2). The obtained product was confirmed by Mass and HPLC analysis.

HRMS (MALDI) calcd for $C_{48}H_{45}N_3O$: m/z 679.36, Found: 680.41.

Synthesis of Compound 2

1.48 g (56.7%) of Compound 2 was obtained as in the same manner as Compound 1 of Synthesis Example 1, except that Intermediate 2(1) was used instead of Intermediate 1(1). The obtained product was confirmed by Mass and HPLC analysis.

HRMS (MALDI) calcd for $C_{48}H_{43}N_3OPt$: m/z 872.31, Found: 873.33.

Synthesis Example 3: Synthesis of Compound 3

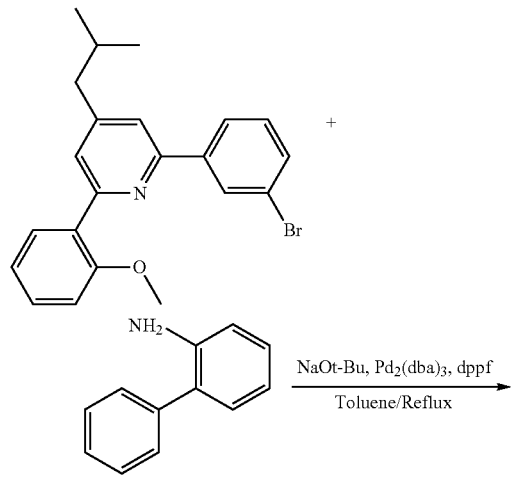

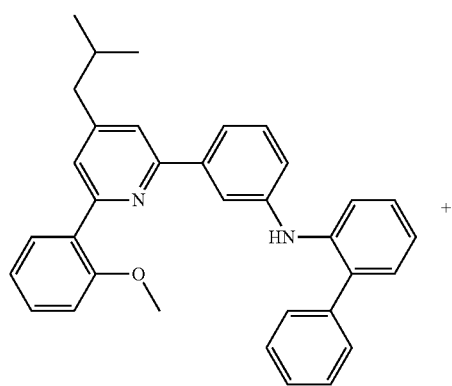

Intermediate 3(3)

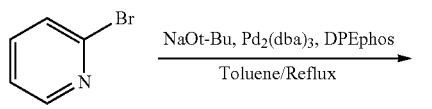

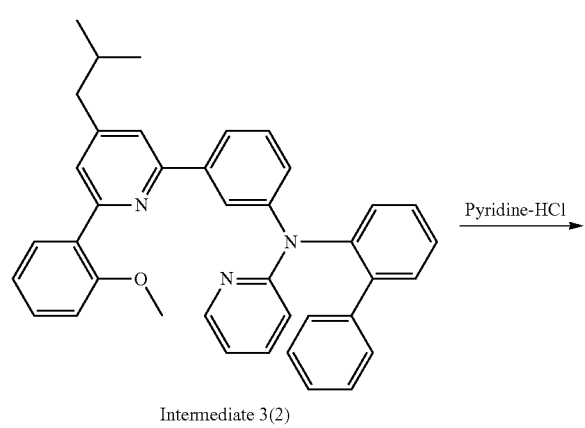

Intermediate 3(2)

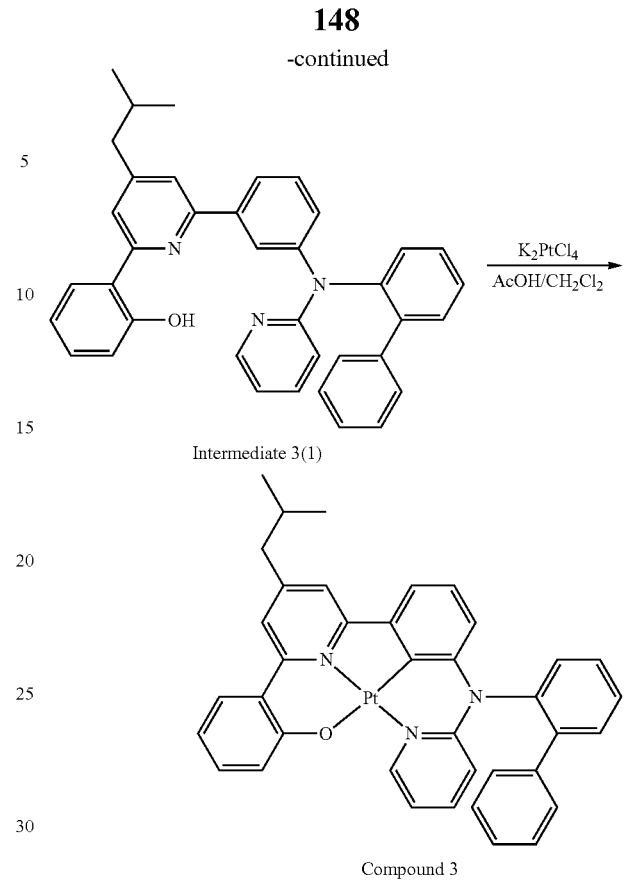

Intermediate 3(1)

Compound 3

Synthesis of Intermediate 3(3)

3.08 g (67.6%) of Intermediate 3(3) was obtained in the same manner as Intermediate 1(3) of Synthesis Example 1, except that 2-(3-bromophenyl)-4-iso-butyl-6-(2-methoxyphenyl)pyridine and 2-phenylbenzenamine were respectively used instead of 2-(3-bromophenyl)-4-(3,5-di-tert-butylphenyl)-6-(2-methoxyphenyl)pyridine and naphthalen-1-amine. The obtained product was confirmed by Mass and HPLC analysis.

HRMS (MALDI) calcd for $C_{34}H_{32}N_2O$: m/z 484.25, Found: 485.30.

Synthesis of Intermediate 3(2)

2.11 g (65.5%) of Intermediate 3(2) was obtained in the same manner as Intermediate 1(2) of Synthesis Example 1, except that Intermediate 3(3) was used instead of Intermediate 1(3). The obtained product was confirmed by Mass and HPLC analysis.

HRMS (MALDI) calcd for $C_{39}H_{35}N_3O$: m/z 561.28, Found: 562.33.

Synthesis of Intermediate 3(1)

1.83 g (70.8%) of Intermediate 3(1) was obtained in the same manner as Intermediate 1(1) of Synthesis Example 1, except that Intermediate 3(2) was used instead of Intermediate 1(2). The obtained product was confirmed by Mass and HPLC analysis.

HRMS (MALDI) calcd for $C_{38}H_{33}N_3O$: m/z 547.26, Found: 548.30.

Synthesis of Compound 3

1.26 g (54.5%) of Compound 3 was obtained in the same manner as Compound 1 of Synthesis Example 1, except that Intermediate 3(1) was used instead of Intermediate 1(1). The obtained product was confirmed by Mass and HPLC analysis.

HRMS (MALDI) calcd for $C_{38}H_{31}N_3OPt$: m/z 740.21, Found: 741.23.

Synthesis Example 4: Synthesis of Compound 4

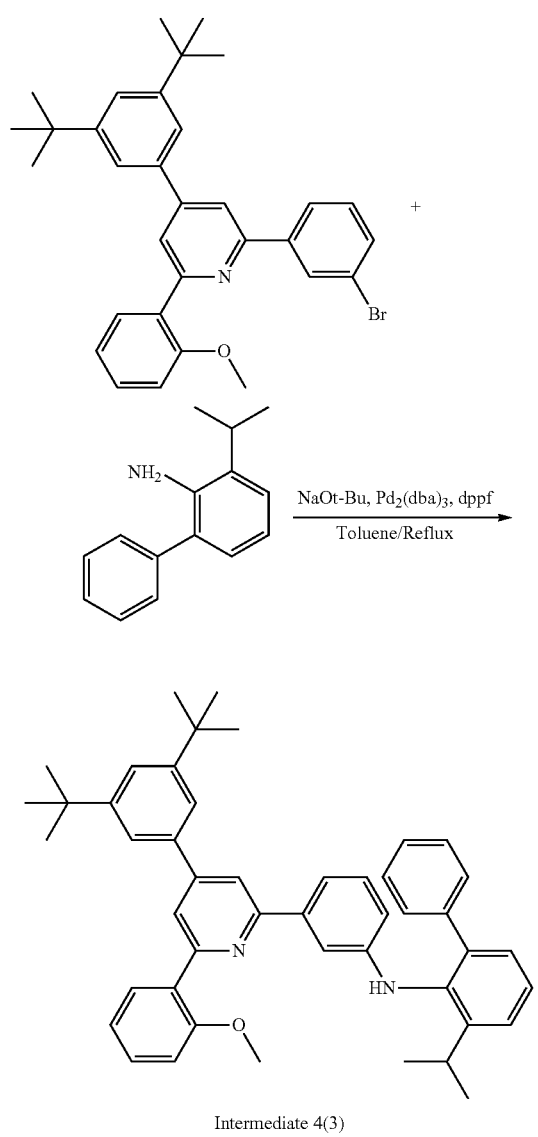

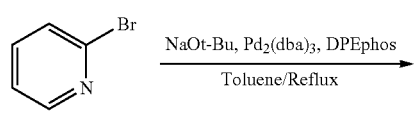

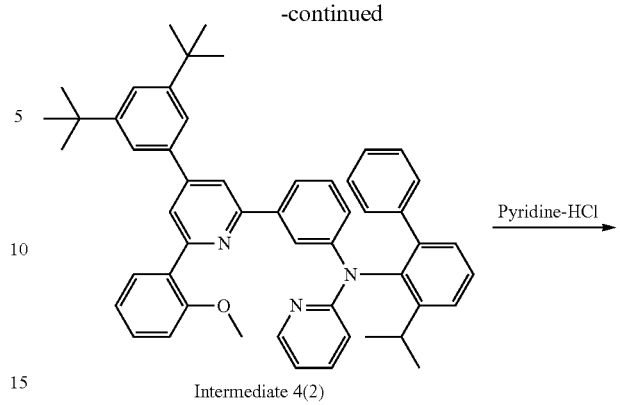

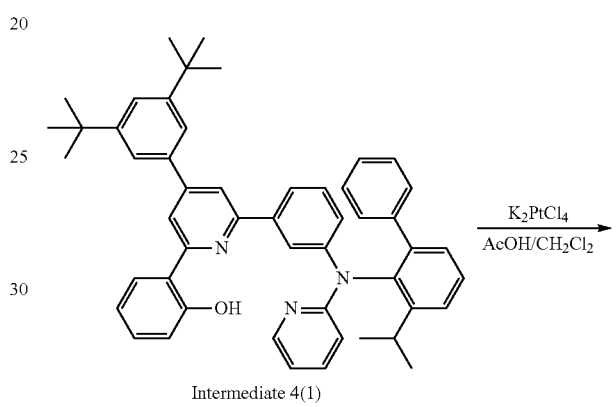

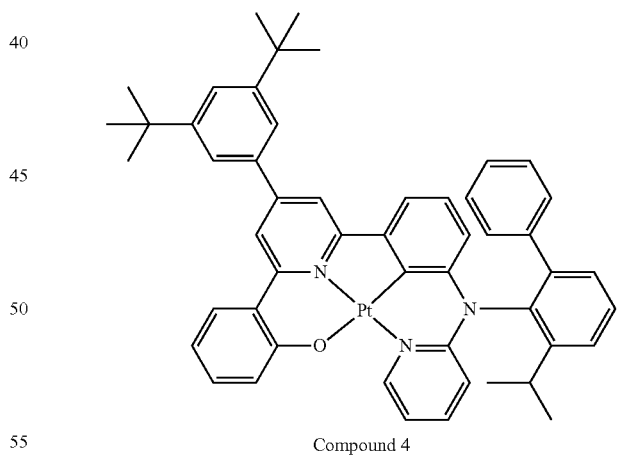

Synthesis of Intermediate 4(3)

3.17 g (73.0%) of Intermediate 4(3) was obtained in the same manner as Intermediate 1(3) of Synthesis Example 1, except that 2-phenyl-2'-iso-butylbenzene amine was used instead of naphthalen-1-amine. The obtained product was confirmed by Mass and HPLC analysis.

HRMS (MALDI) calcd for $C_{47}H_{50}N_2O$: m/z 658.39, Found: 659.40.

Synthesis of Intermediate 4(2)

2.58 g (71.8%) of Intermediate 4(2) was obtained in the same manner as Intermediate 1(2) of Synthesis Example 1, except that Intermediate 4(3) was used instead of Intermediate 1(3). The obtained product was confirmed by Mass and HPLC analysis.

HRMS (MALDI) calcd for $C_{52}H_{53}N_3O$: m/z 735.42, Found: 736.48.

Synthesis of Intermediate 4(1)

1.89 g (68.5%) of Intermediate 4(1) was obtained in the same manner as Intermediate 1(1) of Synthesis Example 1, except that Intermediate 4(2) was used instead of Intermediate 1(2). The obtained product was confirmed by Mass and HPLC analysis.

HRMS (MALDI) calcd for $C_{51}H_{51}N_3O$: m/z 721.40, Found: 722.45.

Synthesis of Compound 4

1.44 g (51.9%) of Compound 4 was obtained in the same manner as Synthesis Example 1, except that Intermediate 4(1) was used instead of Intermediate 1(1). The obtained product was confirmed by Mass and HPLC analysis.

HRMS (MALDI) calcd for $C_{51}H_{49}N_3OPt$: m/z 914.35, Found: 915.38.

Example 1

As an anode, a glass substrate, on which ITO/Ag/ITO were respectively deposited to thicknesses of 70 Å/1,000 Å/70 Å (Å=Angstrom), was cut to a size of 50 mm×50 mm×0.5 mm (mm=millimeter), sonicated with iso-propyl alcohol and pure water each for 5 minutes, and then cleaned by exposure to ultraviolet rays and ozone for 30 minutes. Then, the glass substrate was provided to a vacuum deposition apparatus.

2-TNATA was deposited on the anode to form a hole injection layer having a thickness of 600 Å, and 4,4'-bis[N-(1-naphthyl)-N-phenylamino]biphenyl (NPB) was deposited on the hole injection layer to form a hole transport layer having a thickness of 1,350 Å.

CBP (host) and Compound 1 (dopant) were co-deposited on the hole transport layer at a weight ratio of 90:10 to form an emission layer having a thickness of 400 Å, and BCP was deposited on the emission layer to form a hole blocking layer having a thickness of 50 Å. Then, $Alq_3$ was deposited on the hole blocking layer to form an electron transport layer having a thickness of 350 Å, LiF was deposited on the electron transport layer to form an electron injection layer having a thickness of 10 Å, and MgAg was deposited on the electron injection layer at a weight ratio of 90:10 to form a cathode having a thickness of 120 Å, thereby completing the manufacture of an organic light-emitting device (emitting red light) having a structure of ITO/Ag/ITO/2-TNATA (600 Å) /NPB (1,350 Å)/CBP+Compound 1 (10 wt %) (400 Å)/BCP (50 Å)/$Alq_3$ (350 Å)/LiF (10 Å)/MgAg (120 Å).

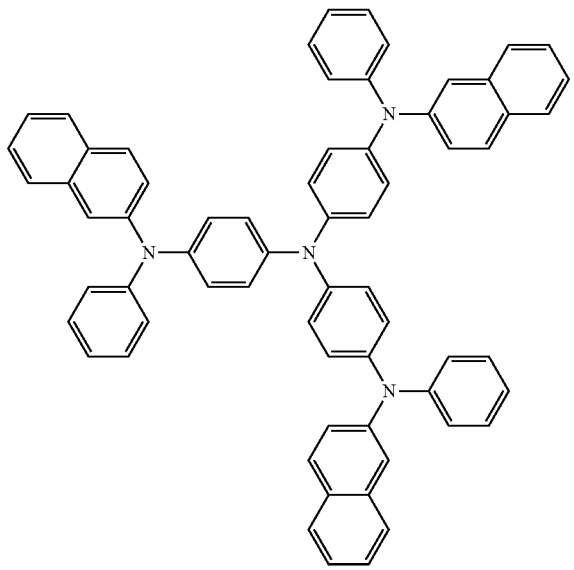

2-TNATA

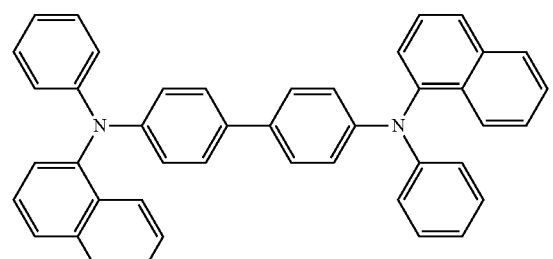

NPB

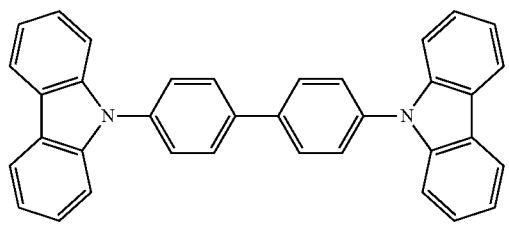

CBP

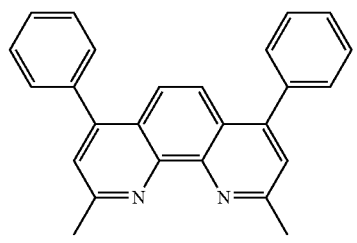

BCP

-continued

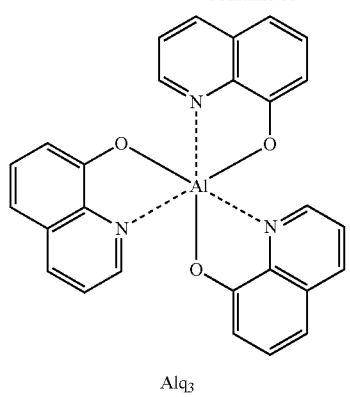

Alq₃

Examples 2 to 4 and Comparative Examples A to C

Organic light-emitting devices were manufactured in the same manner as in Example 1, except that, Compounds shown in Table 2 were each used instead of Compound 1 as a dopant in forming an emission layer.

Figure 2:
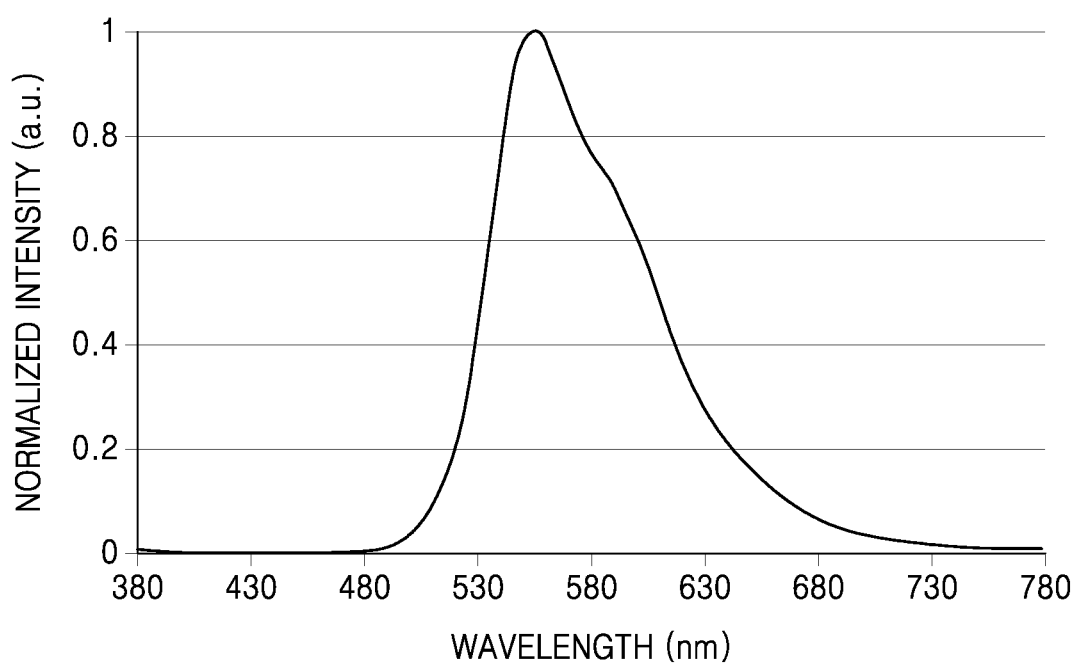
FIG. 2 is a graph of normalized intensity (arbitrary units, a. u.) versus wavelength (nanometers, nm) showing an electroluminescence (EL) spectrum of an organic light-emitting device manufactured according to Example 1.

Evaluation Example 1: Evaluation of Characteristics of Organic Light-Emitting Devices The driving voltage, luminescent efficiency, roll-off ratio, full width at half maximum (FWHM), and lifespan ($T_{95}$) of the organic light-emitting devices manufactured according to Examples 1 to 4 and Comparative Examples A to C were evaluated, and evaluation results thereof are shown in Table 2. An electroluminescent (EL) spectrum of the organic light-emitting device of Example 1 is shown in FIG. 2. The evaluation was performed by using a current-voltage meter (Keithley 2400) and a luminance meter (Minolta Cs-1000A), and the lifespan ($T_{95}$) (at 6,000 nit) indicates an amount of time that lapsed when luminance was 95% of initial luminance (100%). The roll-off ratio was calculated by using Equation 20.

Roll off={1−(efficiency (at 9,000 nit)/maximum luminescent efficiency)}×100%    Equation 20

TABLE 2

|  | Dopant | Driving voltage (V) | Luminescent Efficiency (cd/A) | Roll-off ratio (%) | FWHM (nm) | Lifespan ($T_{95}$) (hr) |
| --- | --- | --- | --- | --- | --- | --- |
| Example 1 | Compound 1 | 3.99 | 69.6 | 12 | 73 | 550 |
| Example 2 | Compound 2 | 4.07 | 67.5 | 13 | 75 | 495 |
| Example 3 | Compound 3 | 4.31 | 59.3 | 16 | 81 | 375 |
| Example 4 | Compound 4 | 4.10 | 68.8 | 12 | 74 | 460 |
| Comparative Example A | Compound A | 4.73 | 45.4 | 18 | 86 | 95 |
| Comparative Example B | Compound B | 4.22 | 63.1 | 14 | 77 | 110 |
| Comparative Example C | Compound C | 4.03 | 66.5 | 16 | 77 | 195 |

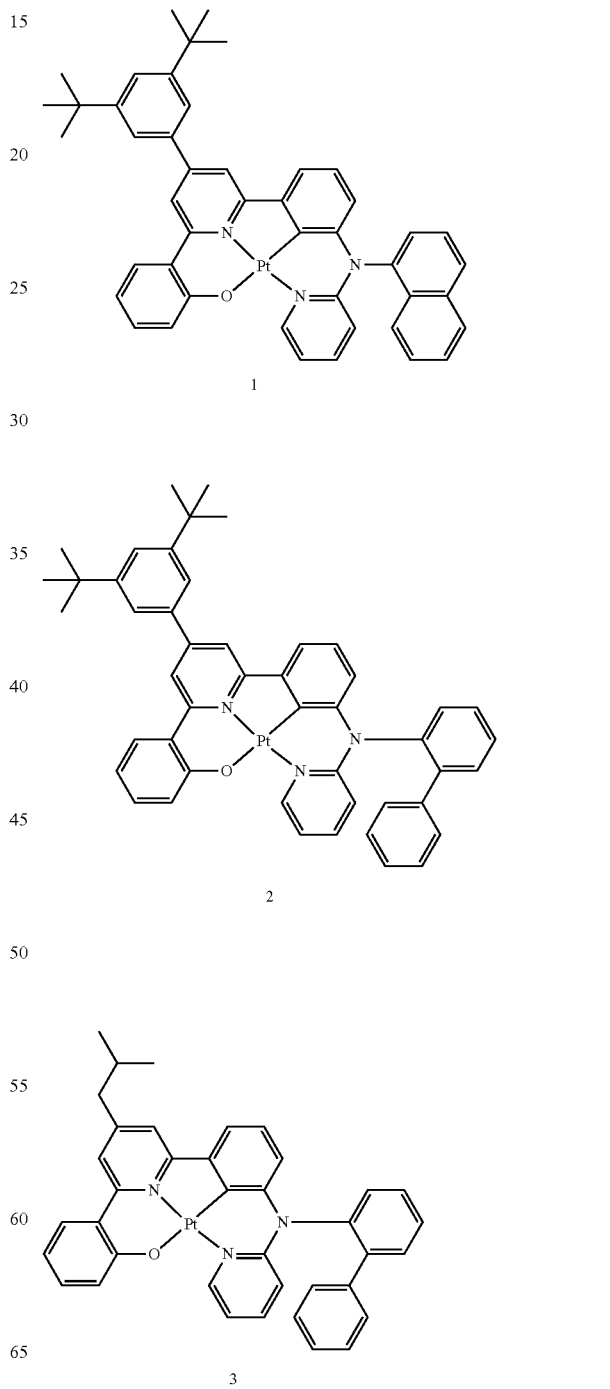

TABLE 2-continued

| Dopant | Driving voltage (V) | Luminescent Efficiency (cd/A) | Roll-off ratio (%) | FWHM (nm) | Lifespan ($T_{95}$) (hr) |
|---|---|---|---|---|---|

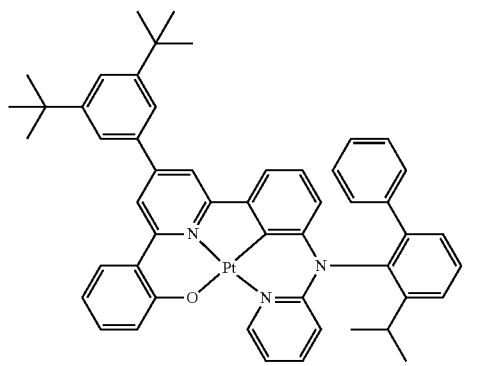

4

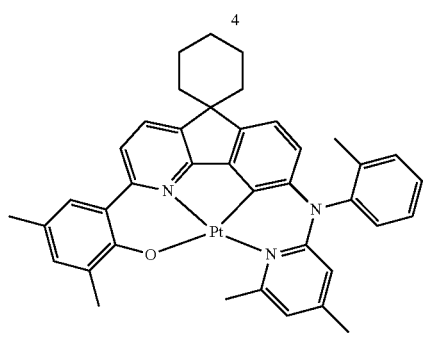

A

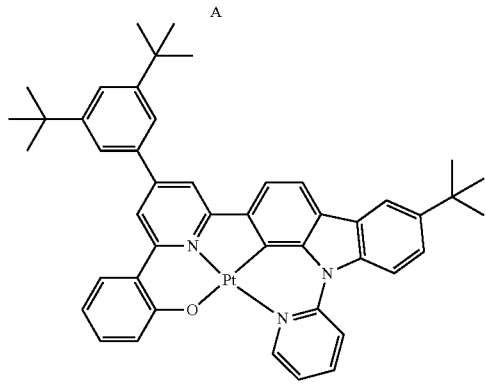

B

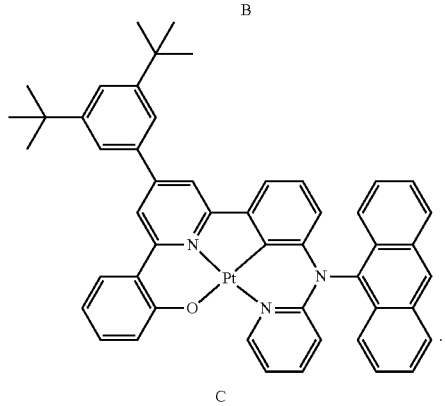

C

Referring to Table 2, it has been determined that the organic light-emitting devices of Examples 1 to 4 have driving voltage, luminescent efficiency, and roll-off ratio characteristics superior or equivalent to the organic light-emitting devices of Comparative Examples A to C, and have remarkably improved lifespan characteristics, as compared with the organic light-emitting devices of Comparative Examples A to C.

Electronic devices, for example, organic light-emitting devices, which include such organometallic compounds may have high luminescent efficiency and a long lifespan.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present description as defined by the following claims.

What is claimed is:

1. An organometallic compound represented by Formula 1A:

Formula 1A

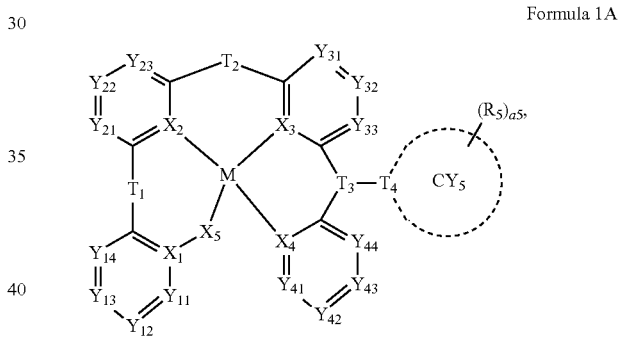

wherein, in Formula 1A,

M is beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), $X_1$ is C or N, and i) $X_2$ and $X_3$ are each N, and $X_4$ is C; or ii) $X_2$ and $X_4$ are each N, and $X_3$ is C, $X_5$ is O, S, B(R'), N(R'), P(R'), C(R')(R''), Si(R')(R''), Ge(R')(R''),C(=O), B(R')(R''), N(R')(R''), or P(R')(R''), two bonds selected from a bond between $X_2$ and M, a bond between $X_3$ and M, and a bond between $X_4$ and M are each a coordinate bond, and the other thereof is a covalent bond, a bond between $X_5$ and M is a covalent bond, ring $CY_5$ is selected from a $C_5$-$C_{30}$ carbocyclic group and a $C_1$-$C_{30}$ heterocyclic group, a moiety represented by

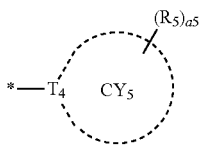

in Formula 1 has an asymmetric structure with respect to an axis connecting T$_3$ and T$_4$ in Formula 1, T$_1$ is selected from a single bond, a double bond, *—N[(L$_{61}$)$_{a61}$—(R$_{61}$)]—*', *—B(R$_{61}$)—*', *—C(R$_{61}$)(R$_{62}$)—*', *—Si(R$_{61}$)(R$_{62}$)—*', *—Ge(R$_{61}$)(R$_{62}$)—*', *—S—*', *—Se—*', *—O—*', *—C(=O)—*', *—S(=O)—*', *—S(=O)$_2$—*', *—C(R$_{61}$)=—*', *=C(R$_{61}$)—*', *—C(R$_{61}$)=C(R$_{62}$)—*', *—C(=S)—*', and *—C≡C—*', T$_2$ is a single bond, a double bond, *—N[(L$_{63}$)$_{a63}$—(R$_{63}$)]—*', *—B(R$_{63}$)—*', *—P(R$_{63}$)—*', *—C(R$_{63}$)(R$_{64}$)—*', *—Si(R$_{63}$)(R$_{64}$)—*', *—Ge(R$_{63}$)(R$_{64}$)—*', *—S—*', *—Se—*', *—O—*', *—C(=O)—*', *—S(=O)—*', *—S(=O)$_2$—*', *—C(R$_{63}$)=—*', *=C(R$_{63}$)—*', *—C(R$_{63}$)=C(R$_{64}$)—*, *—C(=S)—*', and *—C≡C—*', T$_3$ is N, B, or P, T$_4$ is C, N, B, or P, L$_{61}$ and L$_{63}$ are each independently selected from a single bond, a substituted or unsubstituted C$_5$-C$_{30}$ carbocyclic group, and a substituted or unsubstituted C$_1$-C$_{30}$ heterocyclic group, a61 and a63 are each independently an integer from 1 to 3, wherein, when a61 is two or more, two or more groups L$_{61}$ are identical to or different from each other, and when a63 is two or more, two or more groups L$_{63}$ are identical to or different from each other, R$_{61}$ and R$_{62}$ are optionally linked to via a single bond, a double bond, or a first linking group to form a substituted or unsubstituted C$_5$-C$_{30}$ carbocyclic group or a substituted or unsubstituted C$_1$-C$_{30}$ heterocyclic group, and R$_{63}$ and R$_{64}$ are optionally linked to via a single bond, a double bond, or a first linking group to form a substituted or unsubstituted C$_5$-C$_{30}$ carbocyclic group or a substituted or unsubstituted C$_1$-C$_{30}$ heterocyclic group, R$_5$, R$_{10a}$, R$_{61}$ to R$_{64}$, R', R", Z$_{11}$ to Z$_{14}$, Z$_{21}$ to Z$_{23}$, Z$_{31}$ to Z$_{33}$, and Z$_{41}$ to Z$_{44}$ are each independently selected from deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_7$-C$_{60}$ alkylaryl group, a substituted or unsubstituted C$_6$-C$_{60}$ aryloxy group, a substituted or unsubstituted C$_6$-C$_{60}$ arylthio group, a substituted or unsubstituted C$_1$-C$_{60}$ heteroaryl group, a substituted or unsubstituted C$_2$-C$_{60}$ alkylheteroaryl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —B(Q$_6$)(Q$_7$), and —P(=O)(Q$_8$)(Q$_9$), a5 is an integer from 0 to 20, Y$_{11}$ is C(Z$_{11}$) or N, Y$_{12}$ is C(Z$_{12}$) or N, Y$_{13}$ is C(Z$_{13}$) or N, Y$_{14}$ is C(Z$_{14}$) or N, Y$_{21}$ is C(Z$_{21}$) or N, Y$_{22}$ is C(Z$_{22}$) or N, Y$_{23}$ is C(Z$_{23}$) or N, Y$_{31}$ is C(Z$_{31}$) or N, Y$_{32}$ is C(Z$_{32}$) or N, Y$_{33}$ is C(Z$_{33}$) or N, Y$_{41}$ is C(Z$_{41}$) or N, Y$_{42}$ is C(Z$_{42}$) or N, Y$_{43}$ is C(Z$_{43}$) or N, and Y$_{44}$ is C(Z$_{44}$) or N, at least two of Z$_{11}$ to Z$_{14}$ are optionally linked to form a C$_5$-C$_{30}$ carbocyclic group that is unsubstituted or substituted with at least one R$_{10a}$ or C$_1$-C$_{30}$ heterocyclic group that is unsubstituted or substituted with at least one R$_{10a}$, at least two of Z$_{21}$ to Z$_{23}$ are optionally linked to form a C$_5$-C$_{30}$ carbocyclic group that is unsubstituted or substituted with at least one R$_{10a}$ or a C$_1$-C$_{30}$ heterocyclic group that is unsubstituted or substituted with at least one R$_{10a}$, at least two of Z$_{31}$ to Z$_{33}$ are optionally linked to form a C$_5$-C$_{30}$ carbocyclic group that is unsubstituted or substituted with at least one R$_{10a}$ or a C$_1$-C$_{30}$ heterocyclic group that is unsubstituted or substituted with at least one R$_{10a}$, at least two of Z$_{41}$ to Z$_{44}$ are optionally linked to form a C$_5$-C$_{30}$ carbocyclic group that is unsubstituted or substituted with at least one R$_{10a}$ or a C$_1$-C$_{30}$ heterocyclic group that is unsubstituted or substituted with at least one R$_{10a}$, and two of a plurality of neighboring groups R$_5$ are optionally linked to form a substituted or unsubstituted C$_5$-C$_{30}$ carbocyclic group or a substituted or unsubstituted C$_1$-C$_{30}$ heterocyclic group, and *' each indicate a binding site to a neighboring atom, at least one substituent of the substituted C$_5$-C$_{30}$ carbocyclic group, the substituted C$_1$-C$_{30}$ heterocyclic group, the substituted C$_1$-C$_{60}$ alkyl group, the substituted C$_2$-C$_{60}$ alkenyl group, the substituted C$_2$-C$_{60}$ alkynyl group, the substituted C$_1$-C$_{60}$ alkoxy group, the substituted C$_3$-C$_{10}$ cycloalkyl group, the substituted C$_1$-C$_{10}$ heterocycloalkyl group, the substituted C$_3$-C$_{10}$ cycloalkenyl group, the substituted C$_1$-C$_{10}$ heterocycloalkenyl group, the substituted C$_6$-C$_{60}$ aryl group, the substituted C$_7$-C$_{60}$ alkylaryl group, the substituted C$_6$-C$_{60}$ aryloxy group, the substituted C$_6$-C$_{60}$ arylthio group, the substituted C$_1$-C$_{60}$ heteroaryl group, the substituted C$_2$-C$_{60}$ alkylheteroaryl group, the substituted monovalent non-aromatic condensed polycyclic group, and the substituted monovalent non-aromatic condensed heteropolycyclic group is selected from:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_2$-C$_{60}$ alkenyl group, a C$_2$-C$_{60}$ alkynyl group, and a C$_1$-C$_{60}$ alkoxy group;

a C$_1$-C$_{60}$ alkyl group, a C$_2$-C$_{60}$ alkenyl group, a C$_2$-C$_{60}$ alkynyl group, and a C$_1$-C$_{60}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(=O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ are each independently selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, and a monovalent non-aromatic condensed heteropolycyclic group.

2. The organometallic compound of claim 1, wherein M is Pt, Pd, or Au.

3. The organometallic compound of claim 1, wherein ring $CY_5$ is selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborol group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-on group, a dibenzothiophene 5,5-dioxide group, an azaindole group, an azabenzoborol group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-on group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

4. The organometallic compound of claim 1, wherein ring $CY_5$ is selected from i) a first ring, ii) a second ring, iii) a condensed ring in which two or more second rings are condensed with each other, and iv) a condensed ring in which at least one first ring and at least one second ring are condensed with each other, the first ring is selected from a cyclopentadiene group, a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, and a triazasilole group, and the second ring is selected from an adamantane group, a norbornane group, a norbornene group, a cyclohexane group, a cyclohexene group, a benzene group, a pyridine group, a pyrimidine group, a pyrazine group, a pyridazine group, and a triazine group.

5. The organometallic compound of claim 1, wherein T$_1$ and T$_2$ are each a single bond.

6. The organometallic compound of claim 1, wherein R$_5$, R$_{10a}$, R$_{61}$ to R$_{64}$, R', R", Z$_{11}$ to Z$_{14}$, Z$_{21}$ to Z$_{23}$, Z$_{31}$ to Z$_{33}$, and Z$_{41}$ to Z$_{44}$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a C$_1$-C$_{20}$ alkyl group, and a C$_1$-C$_{20}$ alkoxy group;

a C$_1$-C$_{20}$ alkyl group and a C$_1$-C$_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a C$_1$-C$_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a C$_1$-C$_{20}$ alkylthiophenyl group, a furanyl group, a C$_1$-C$_{20}$ alkylfuranyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a C$_1$-C$_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a C$_1$-C$_{20}$ alkylthiophenyl group, a furanyl group, a C$_1$-C$_{20}$ alkylfuranyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{20}$ alkyl group, a C$_1$-C$_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a C$_1$-C$_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a C$_1$-C$_{20}$ alkylthiophenyl group, a furanyl group, a C$_1$-C$_{20}$ alkylfuranyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —N(Q$_1$)(Q$_2$), —Si(Q$_3$)(Q$_4$)(Q$_5$), —B(Q$_6$)(Q$_7$), and —P(=O)(Q$_8$)(Q$_9$), and Q$_1$ to Q$_9$ are each independently selected from:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

7. The organometallic compound of claim 1, wherein $R_5$, $R_{10a}$, $R_{61}$ to $R_{64}$, R', R", $Z_{11}$ to $Z_{14}$, $Z_{21}$ to $Z_{23}$, $Z_{31}$ to $Z_{33}$, and $Z_{41}$ to $Z_{44}$ are each independently selected from hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, groups represented by Formulae 9-1 to 9-19, and groups represented by Formulae 10-1 to 10-226, and a moiety represented by

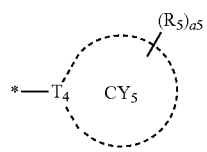

in Formula 1 is selected from groups represented by Formulae 10-14, 10-15, 10-18, 10-21, 10-22, 10-25, 10-28, 10-29, 10-32, 10-35, 10-36, 10-39, 10-42, 10-43, 10-46, 10-49, 10-50, 10-53, 10-56, 10-57, 10-60, 10-64, 10-67, 10-70, 10-71, 10-74, 10-79 to 10-87, 10-91, 10-93 to 10-95, 10-98 to 10-101, 10-105, 10-107 to 10-138, 10-140 to 10-149, 10-152, 10-158 to 10-163, 10-166, and 10-169 to 10-226:

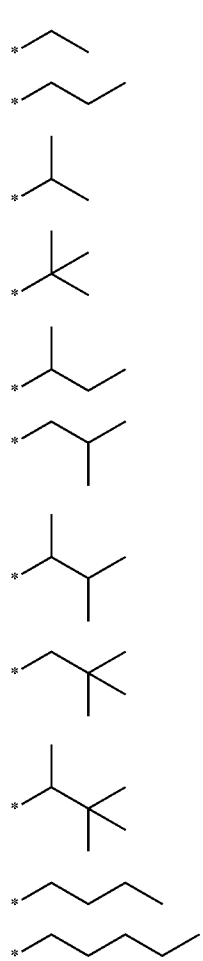

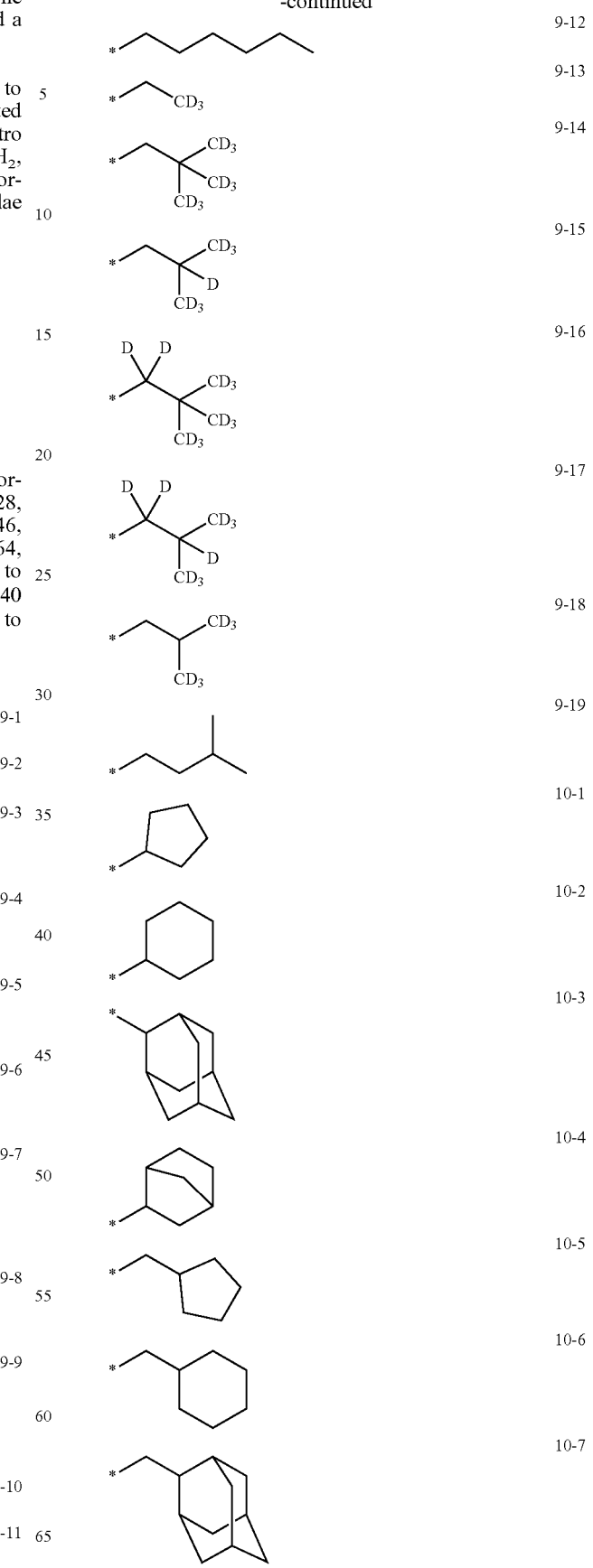

-continued
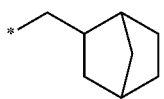
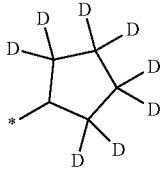
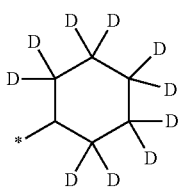
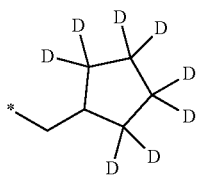
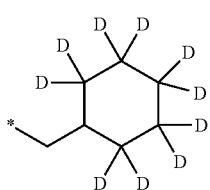
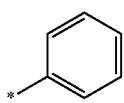
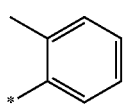
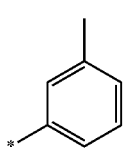
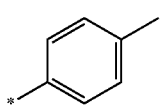
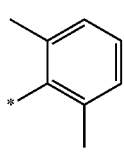
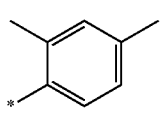
-continued
10-8
10-9
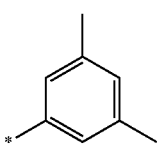
10-10
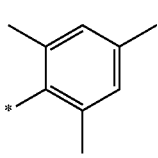
10-11
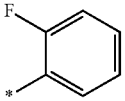
10-12
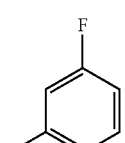
10-13
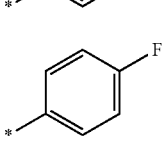
10-14
10-15
10-16
10-17
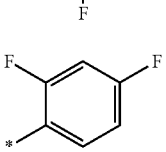
10-18
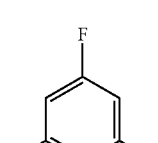
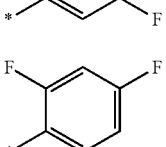
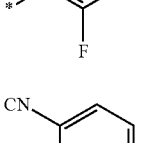
10-19
10-20
10-21
10-22
10-23
10-24
10-25
10-26
10-27
10-28
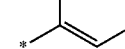
10-29
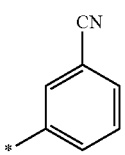

-continued
10-19 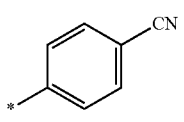
10-20 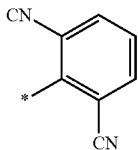
10-21 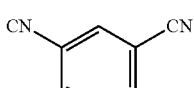
10-22 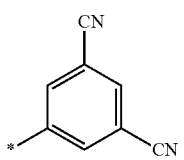
10-23 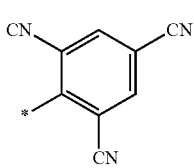
10-24 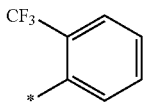
10-25 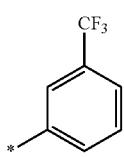
10-26 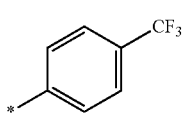
10-27 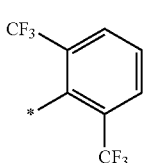
10-28 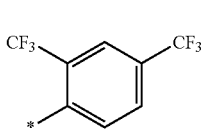
10-29 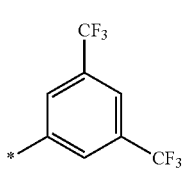
-continued
10-30 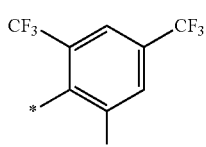
10-31 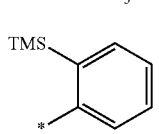
10-32 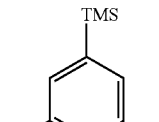
10-33 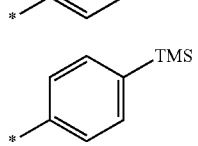
10-34 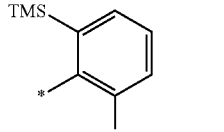
10-35 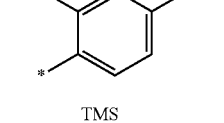
10-36 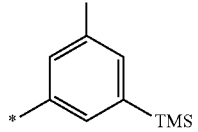
10-37 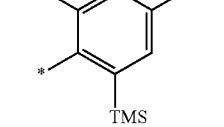
10-38 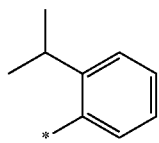
10-39 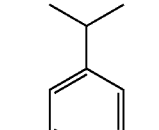
10-40 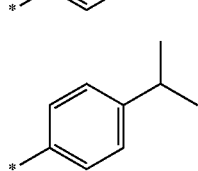
10-41
10-42
10-43
10-44
10-45
10-46
10-47
10-48
10-49
10-50
10-51

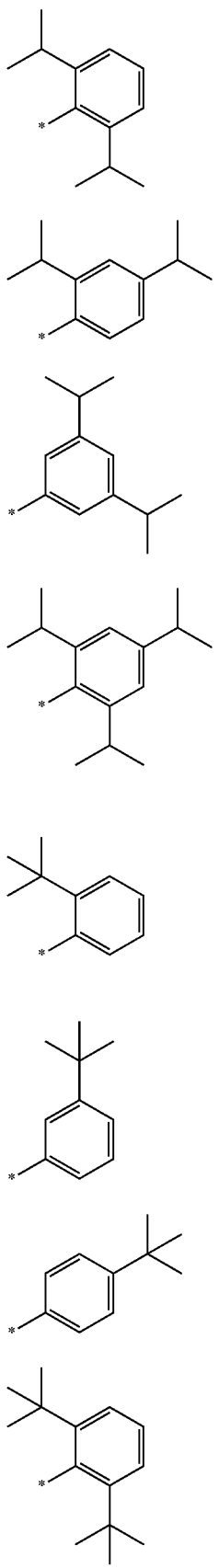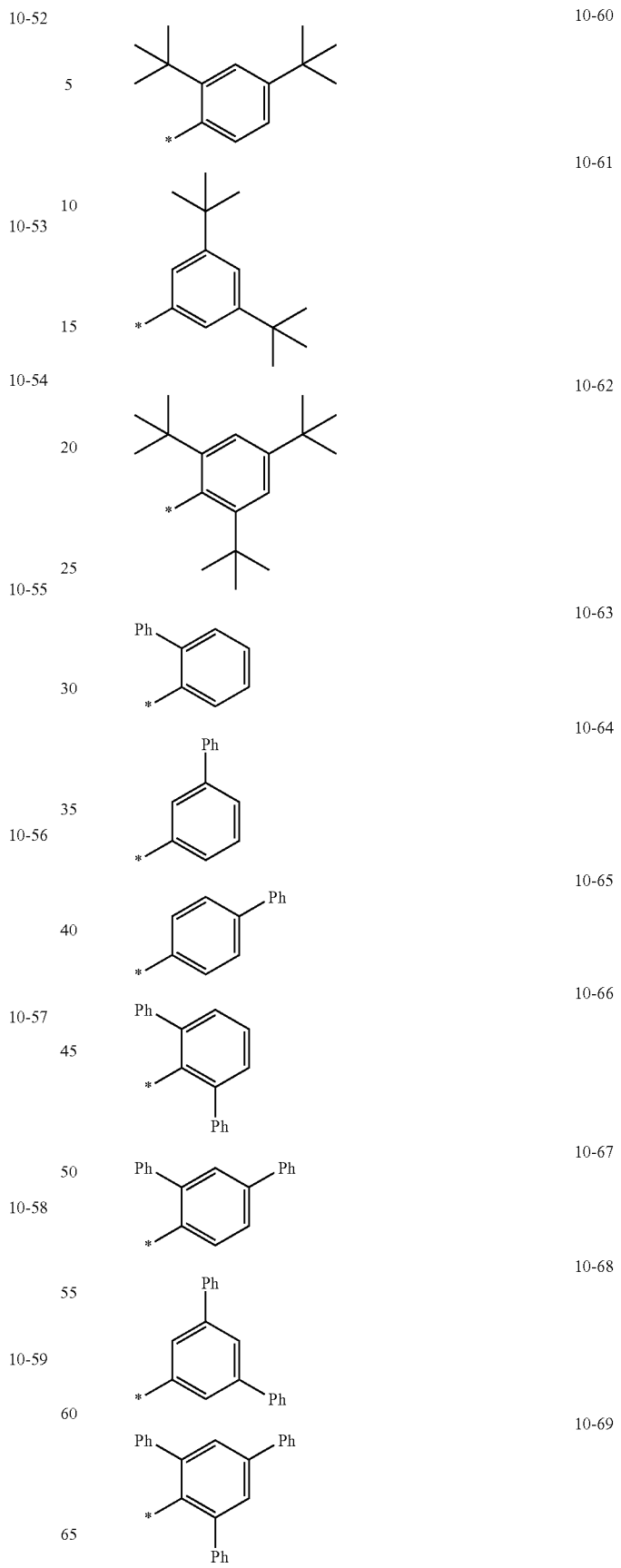

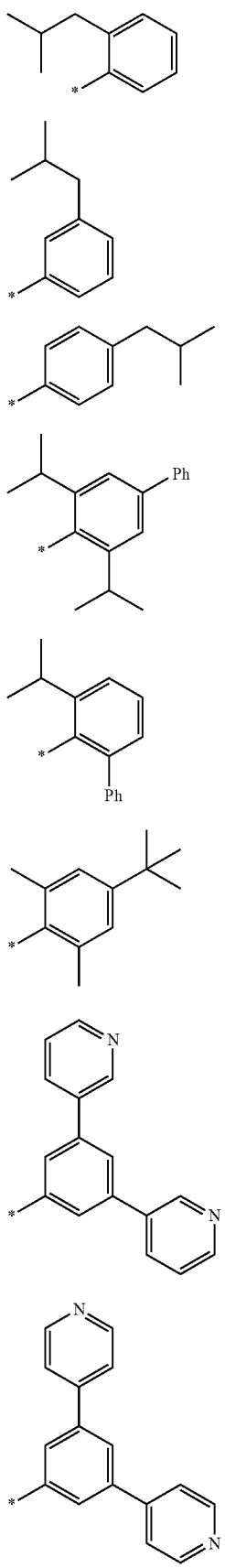
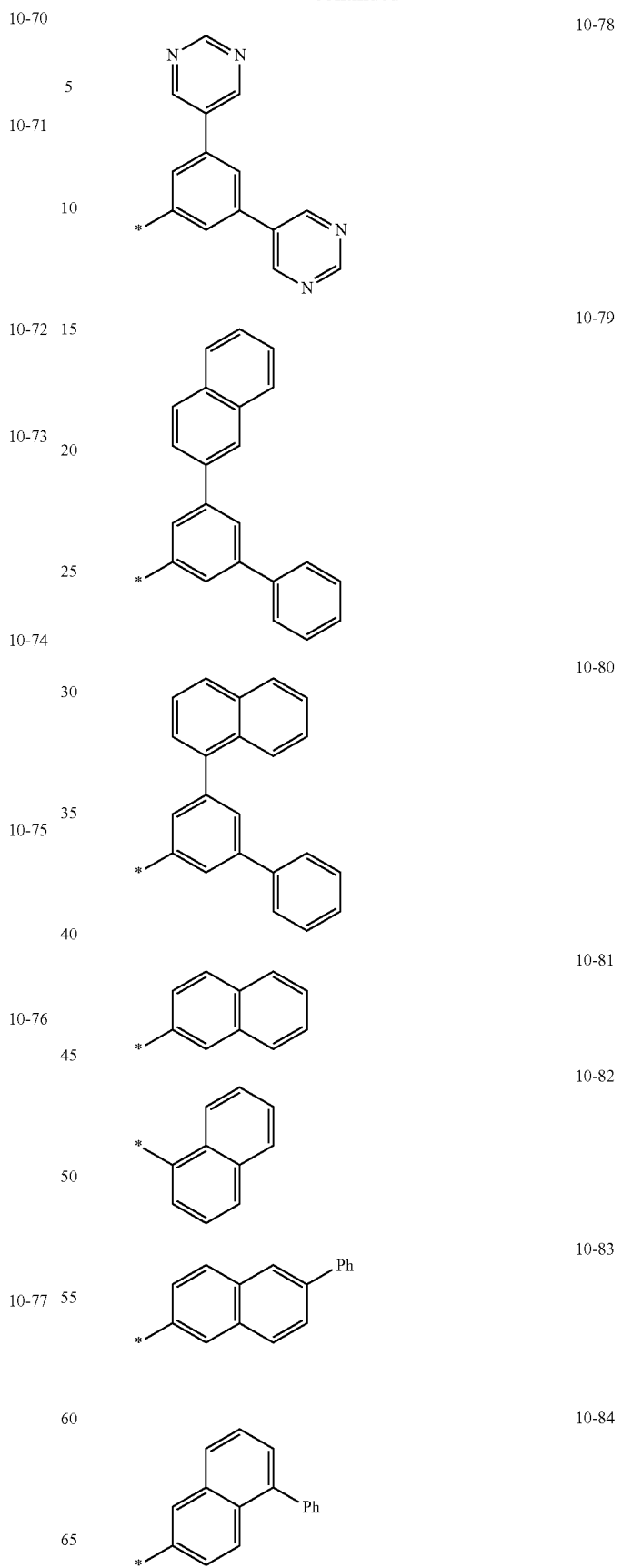

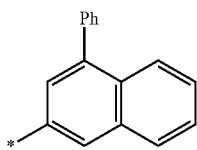
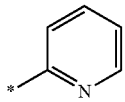
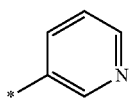
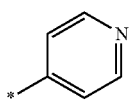
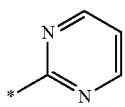
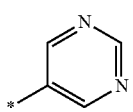
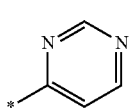
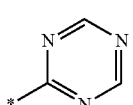
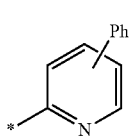
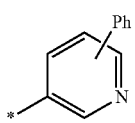
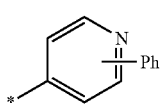
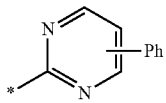
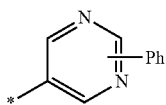
10-85 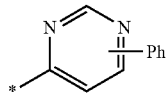
10-86 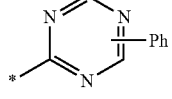
10-87 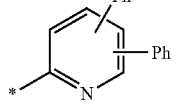
10-88 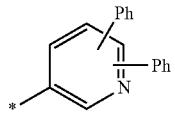
10-89 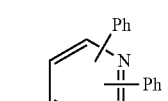
10-90 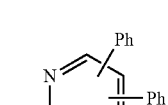
10-91 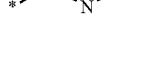
10-92 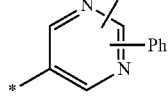
10-93 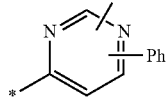
10-94 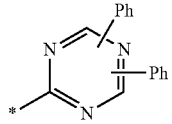
10-95 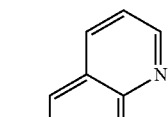
10-96 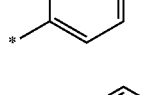
10-97 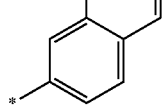
10-98
10-99
10-100
10-101
10-102
10-103
10-104
10-105
10-106
10-107
10-108

10-109 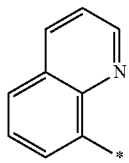
10-110 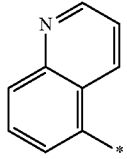
10-111 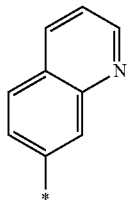
10-112 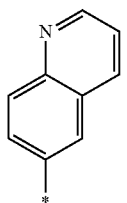
10-113 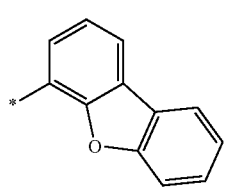
10-114 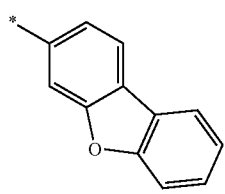
10-115 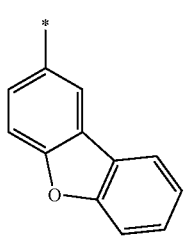
10-116 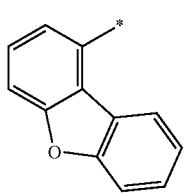
10-117 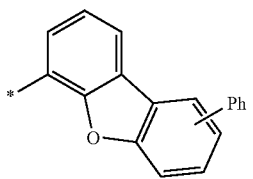
10-118 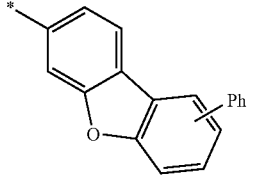
10-119 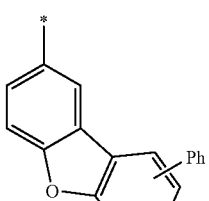
10-120 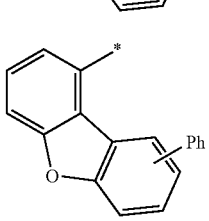
10-121 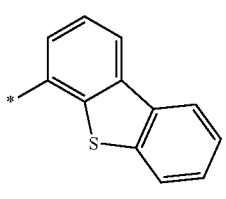
10-122 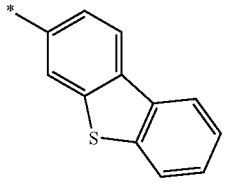
10-123 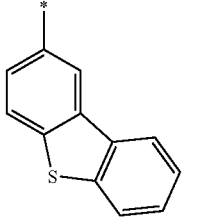
10-124 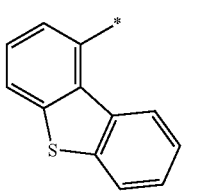

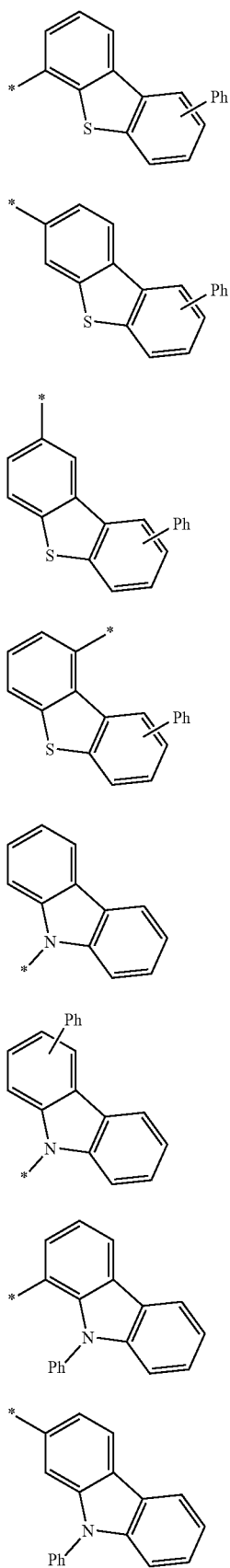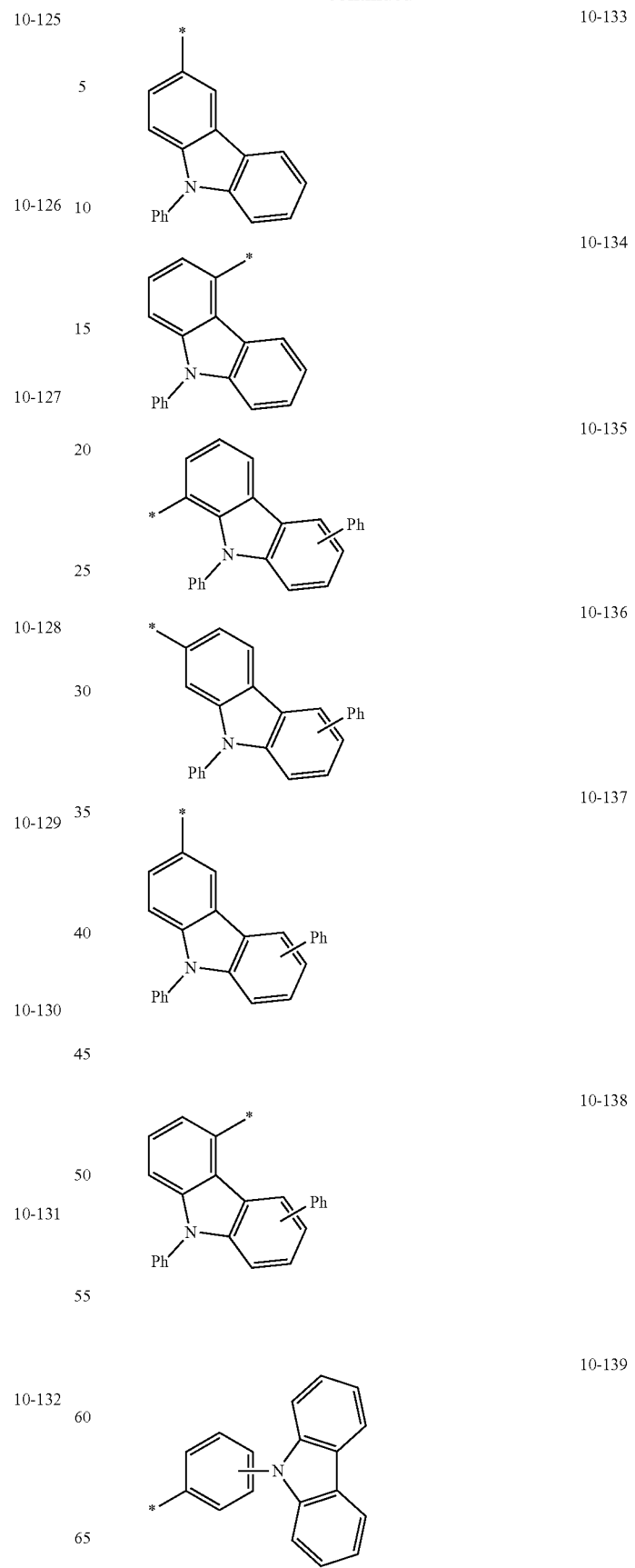

-continued
10-140 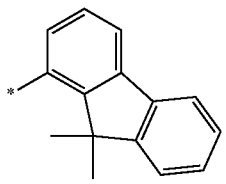
10-141 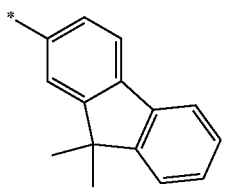
10-142 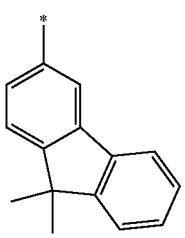
10-143 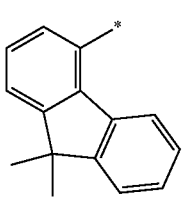
10-144 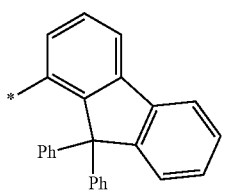
10-145 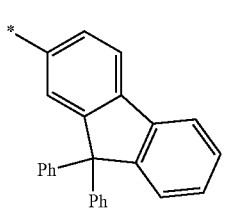
10-146 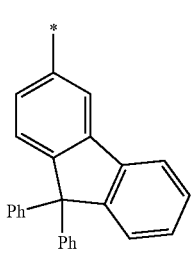
-continued
10-147 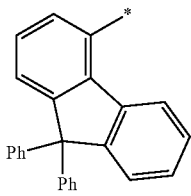
10-148 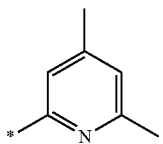
10-149 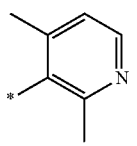
10-150 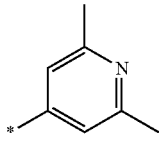
10-151 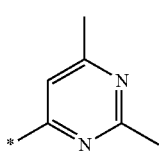
10-152 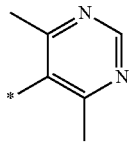
10-153 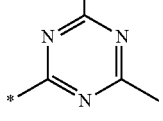
10-154 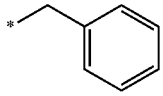
10-155 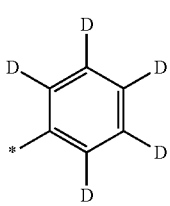
10-156

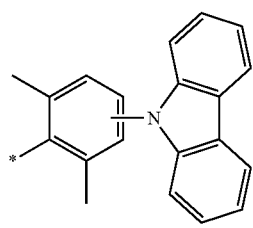
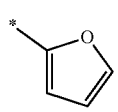
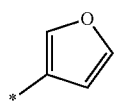
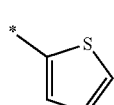
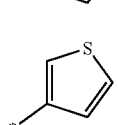
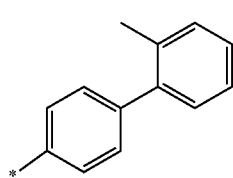
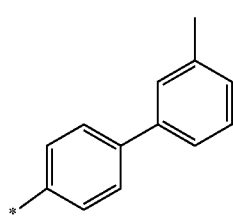
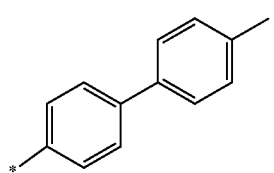
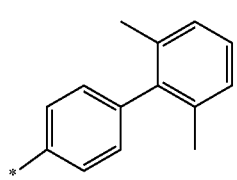
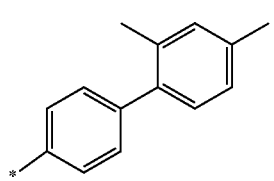
10-157
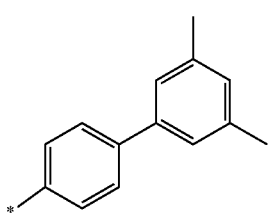
10-158
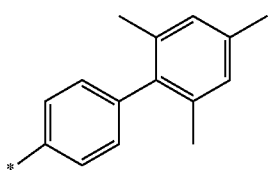
10-159
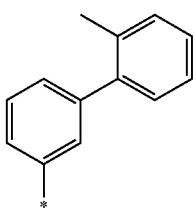
10-160
10-161
10-162
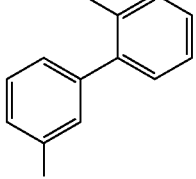
10-163
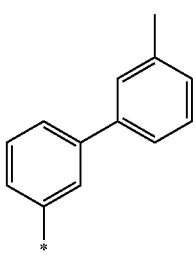
10-164
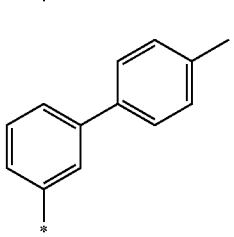
10-165
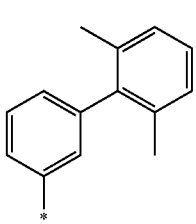
10-166
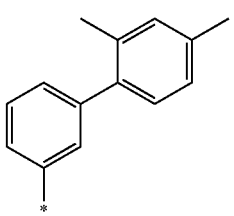
10-167
10-168
10-169
10-170
10-171
10-172
10-173

-continued

| | |
|---|---|
| 10-174 | 10-182 |
| 10-175 | 10-183 |
| 10-176 | 10-184 |
| 10-177 | 10-185 |
| 10-178 | 10-186 |
| 10-179 | 10-187 |
| 10-180 | 10-188 |
| 10-181 | 10-189 |
| | 10-190 |
| | 10-191 |
| | 10-192 |
| | 10-193 |
| | 10-194 |
| | 10-195 |

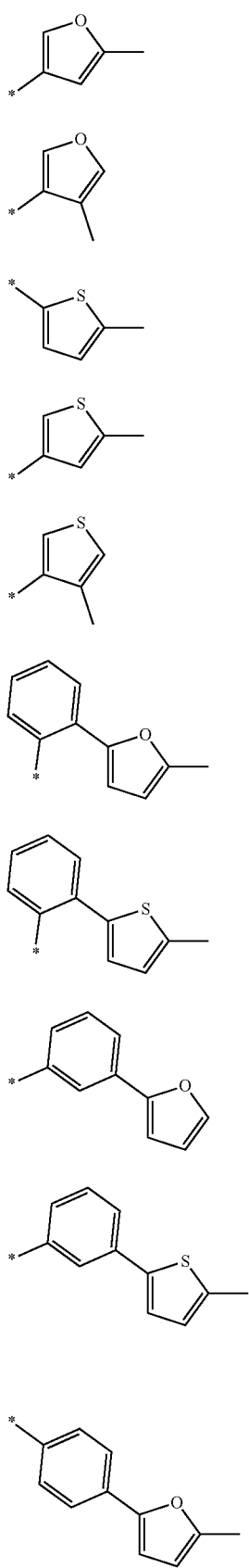
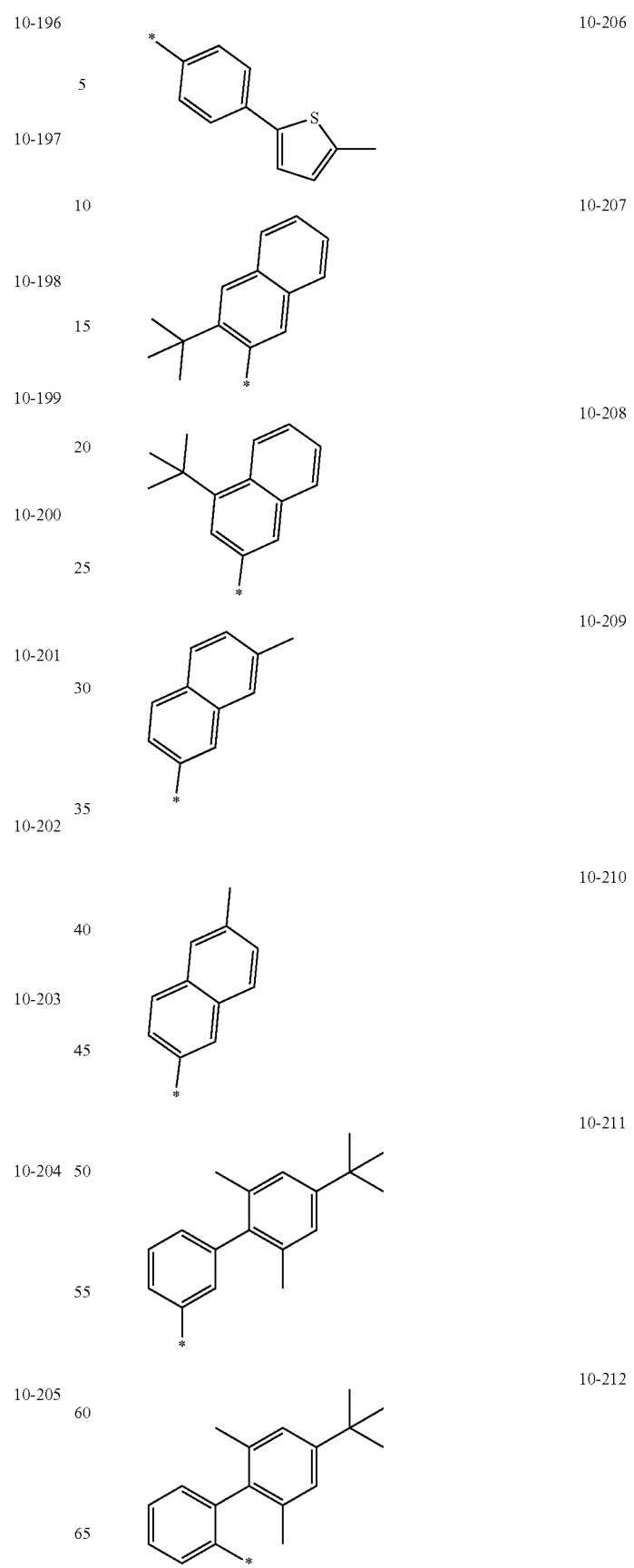

187
-continued
10-213 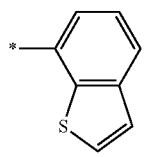
10-214 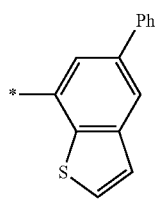
10-215 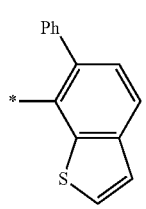
10-216 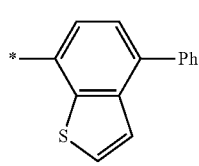
10-217 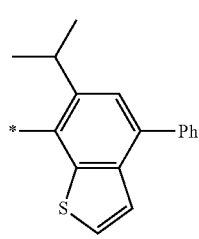
10-218 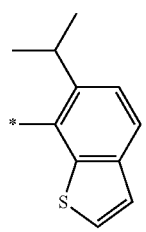
10-219 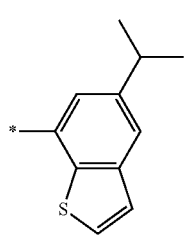
10-220 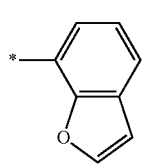
188
-continued
10-221 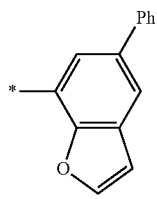
10-222 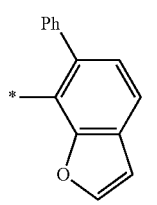
10-223 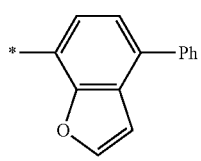
10-224 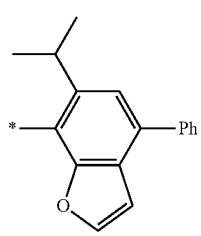
10-225 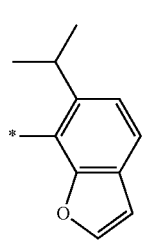
10-226 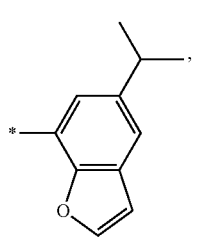
wherein, in Formulae 9-1 to 9-19 and 10-1 to 10-226, * indicates a binding site to a neighboring atom, "Ph" indicates a phenyl group, and "TMS" indicates a trimethylsilyl group.

8. An organometallic compound of Compounds 3 to 4 and 6 to 72:
3
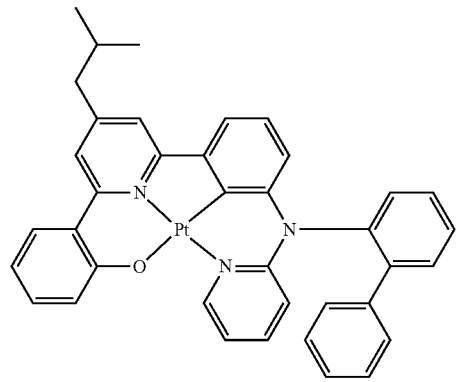
4
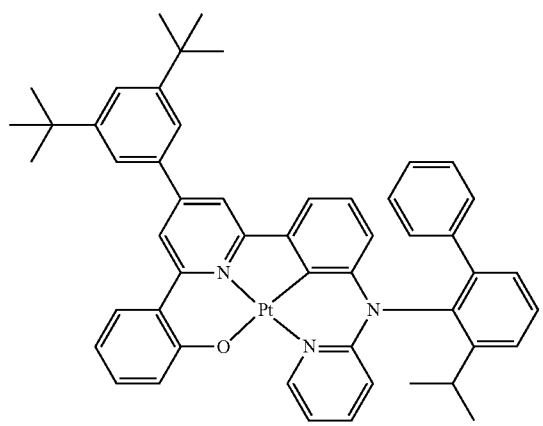
6
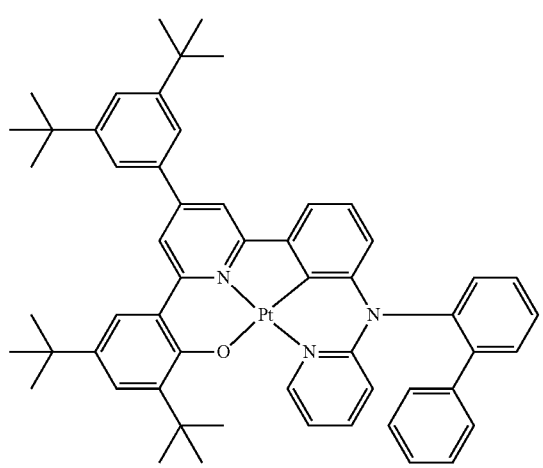
7
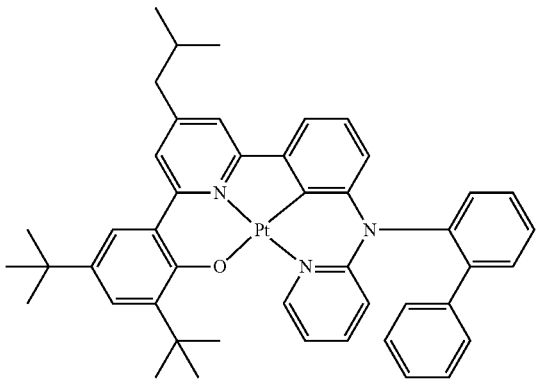
8
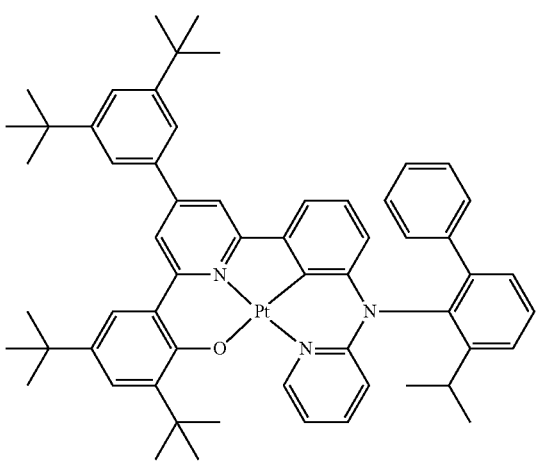
9
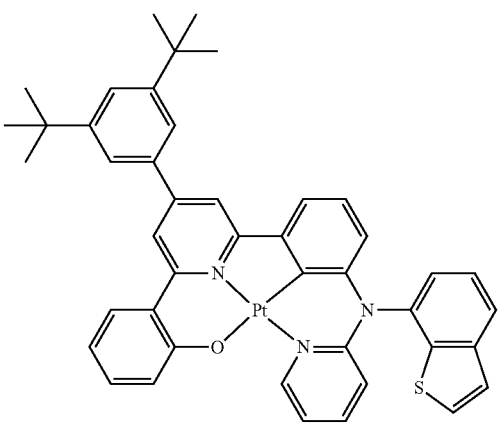

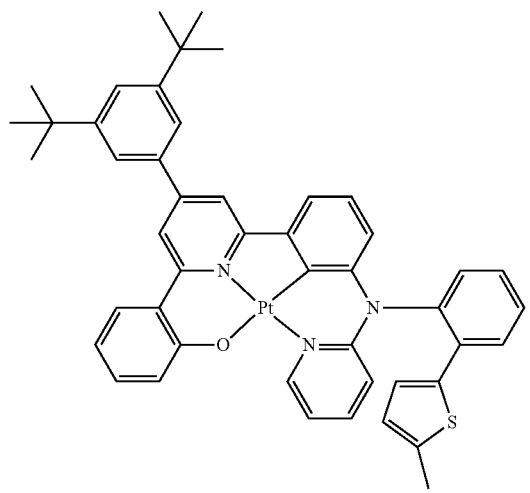
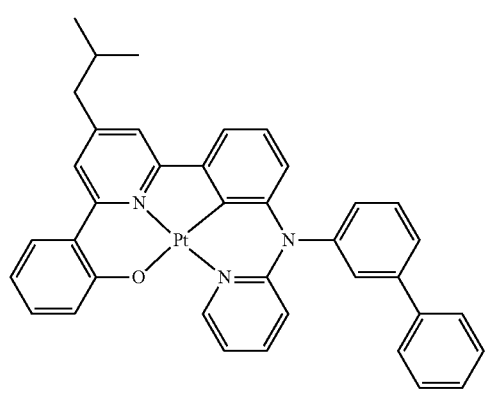
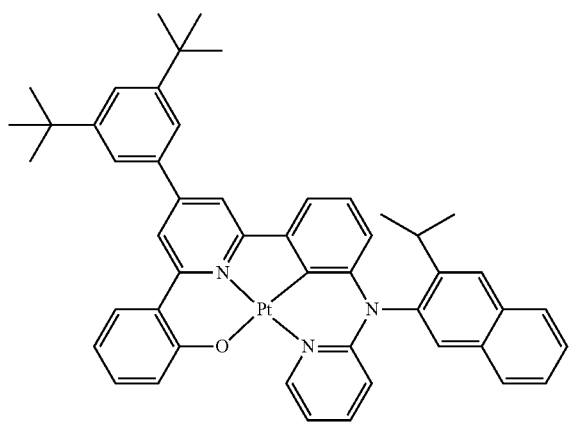
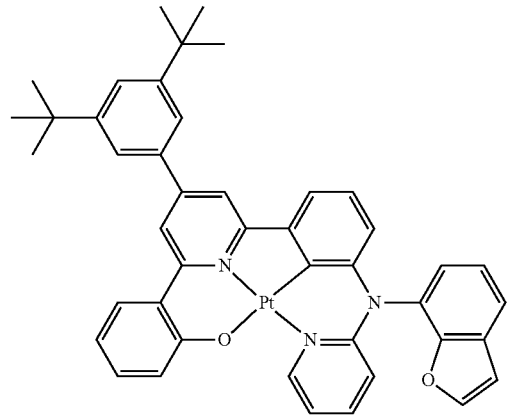
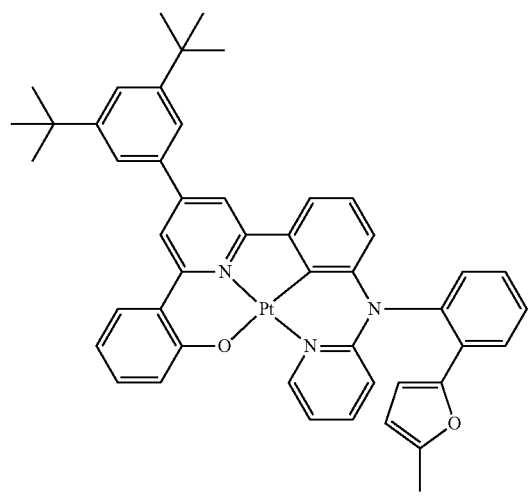

16
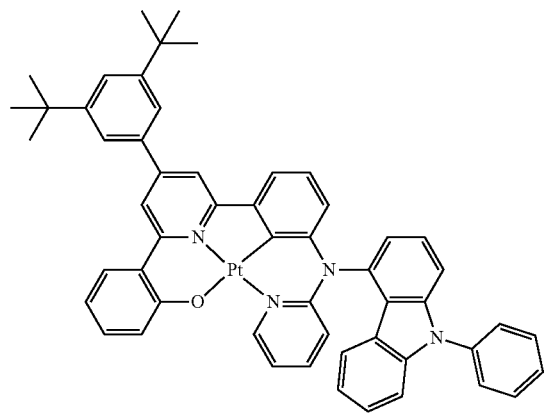
17
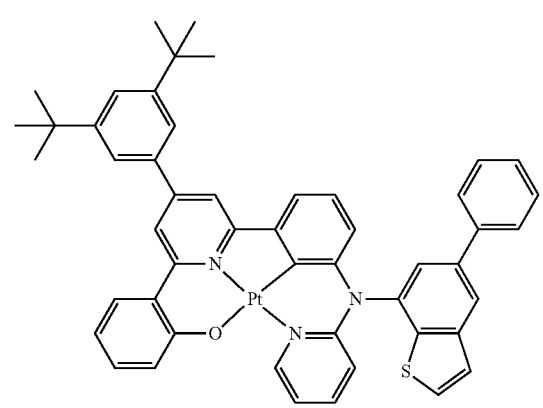
18
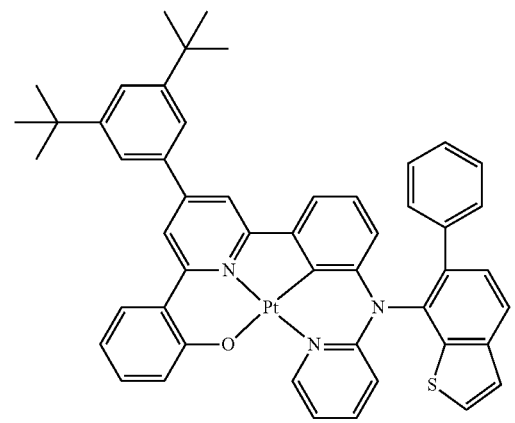
19
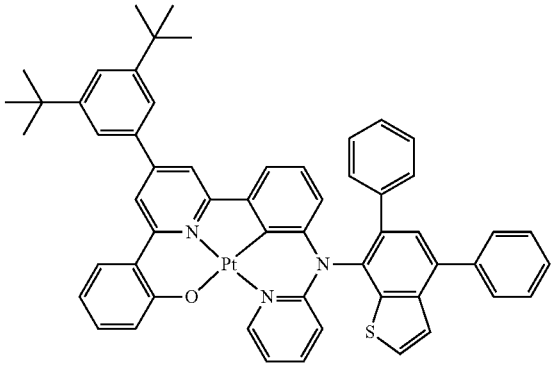
20
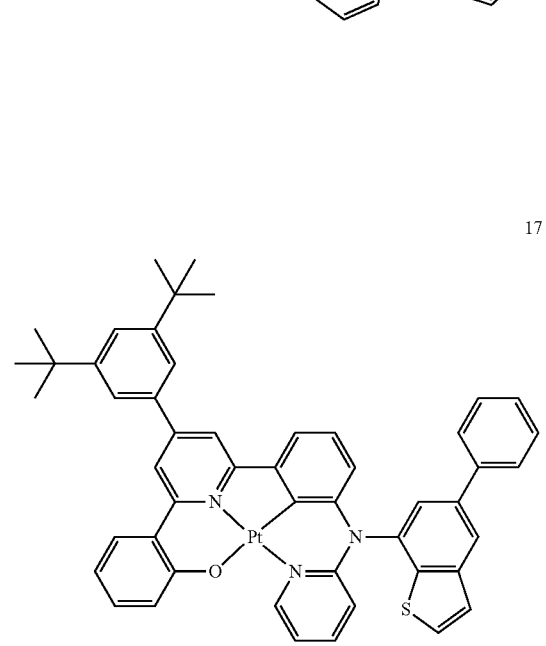
21
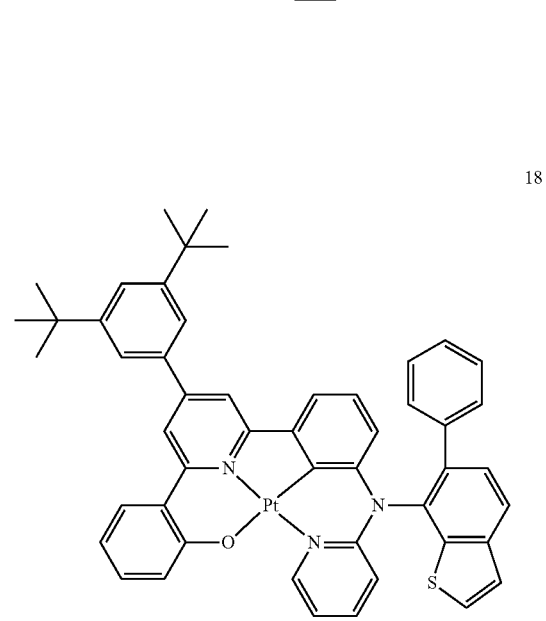
22
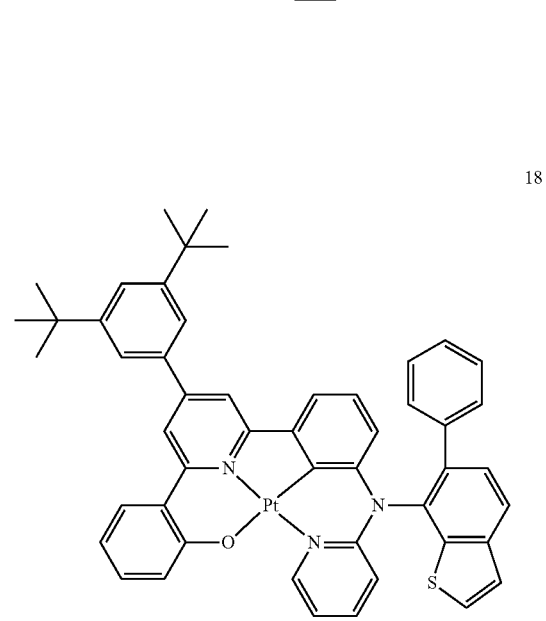

23
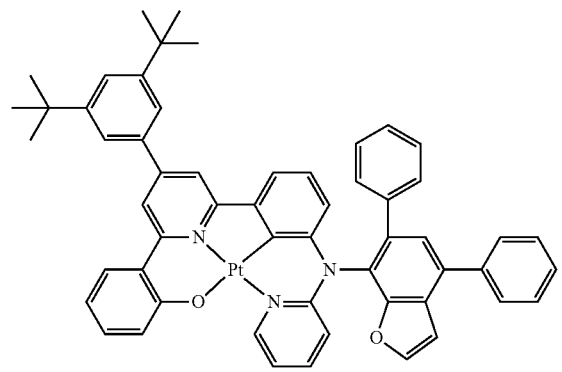
24
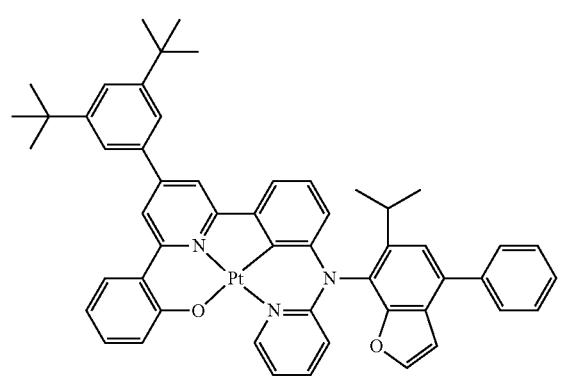
25
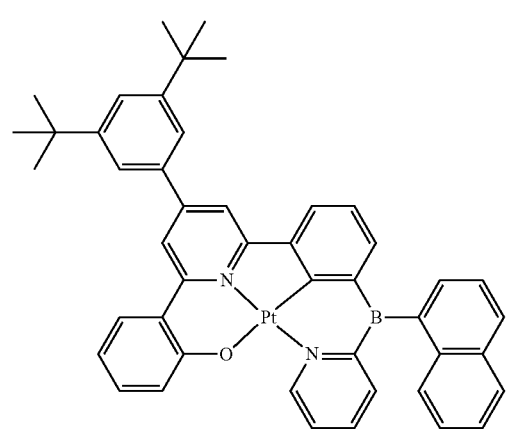
26
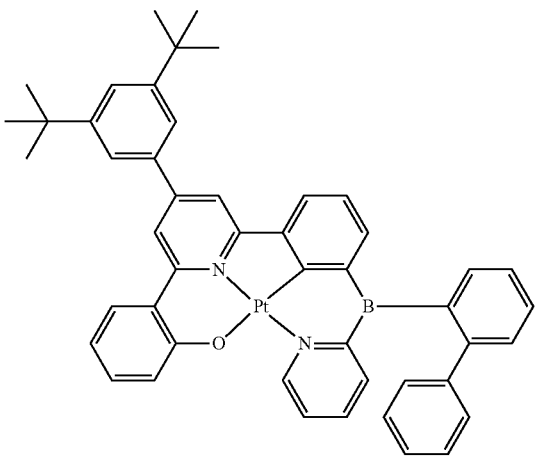
27
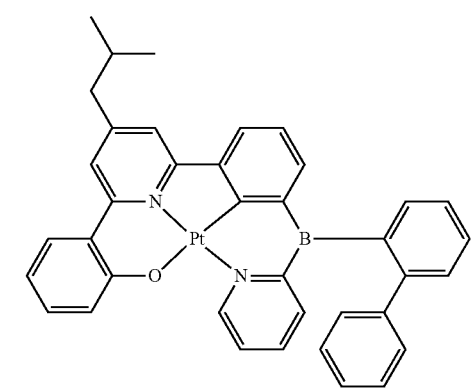
28

-continued
29
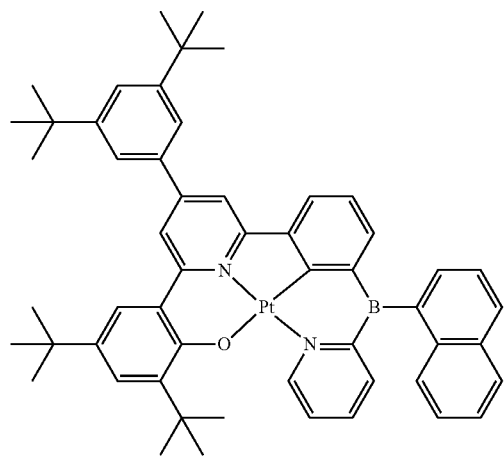
30
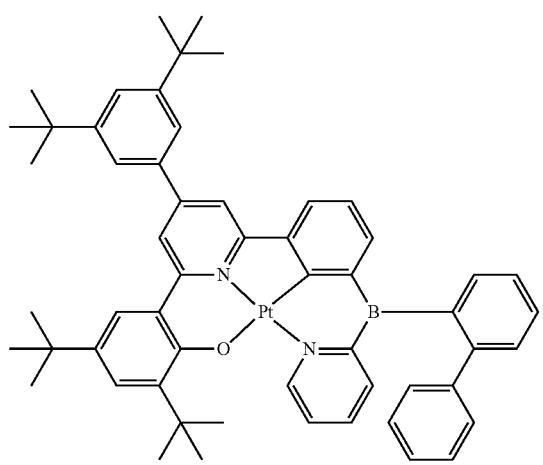
31
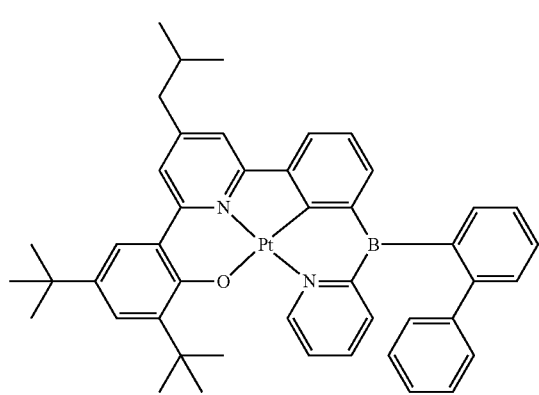
-continued
32
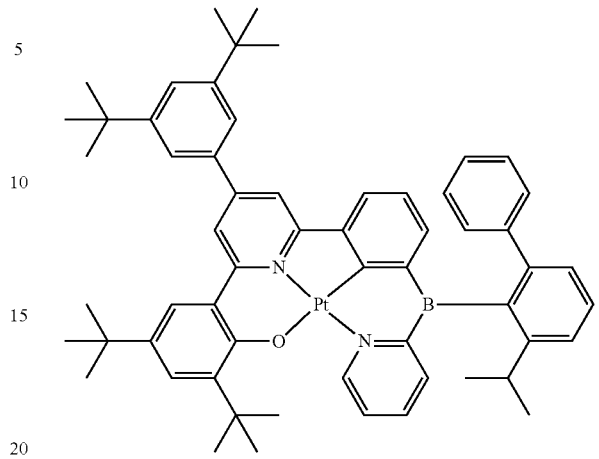
33
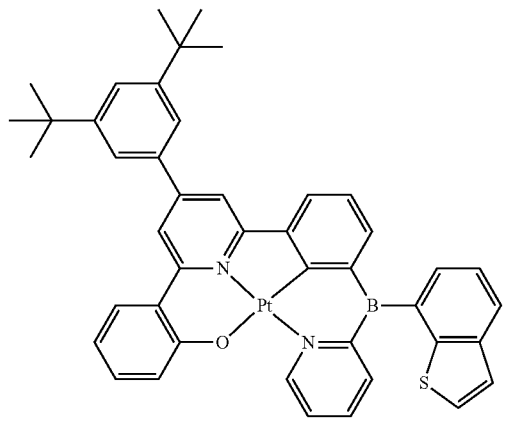
34
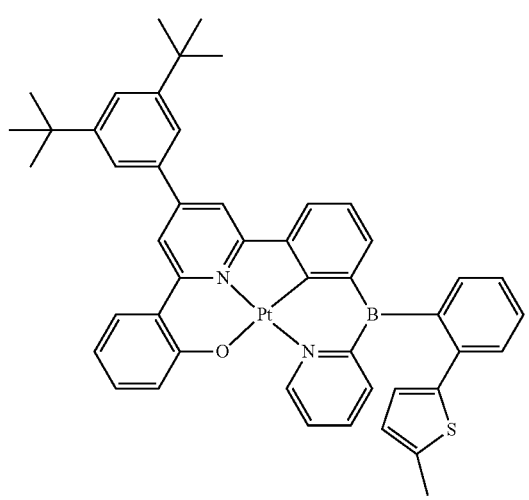

199
-continued
35
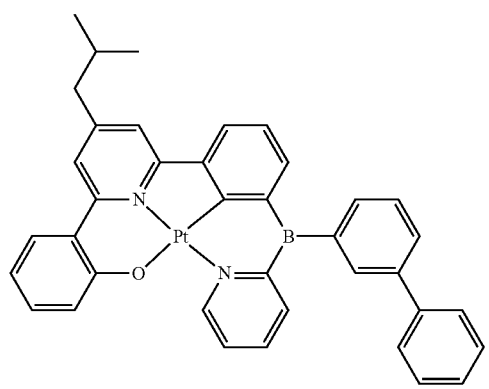
36
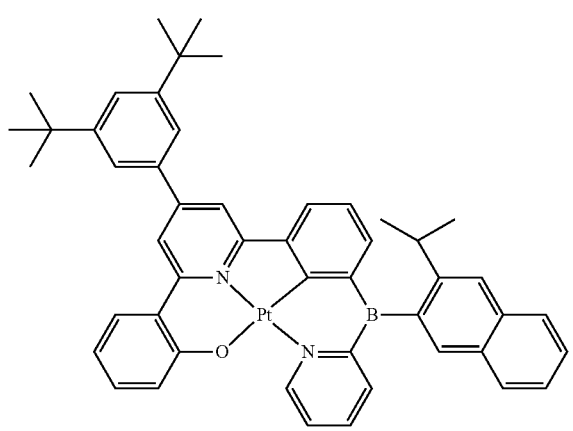
37
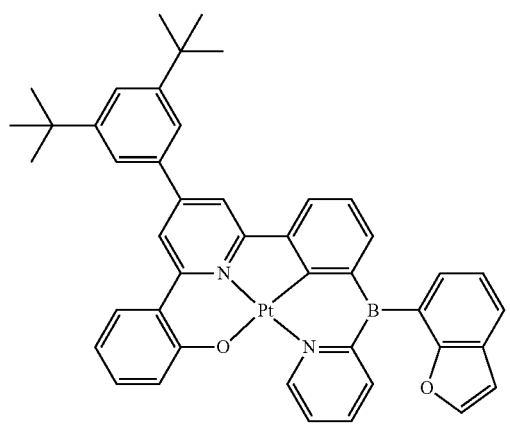
200
-continued
38
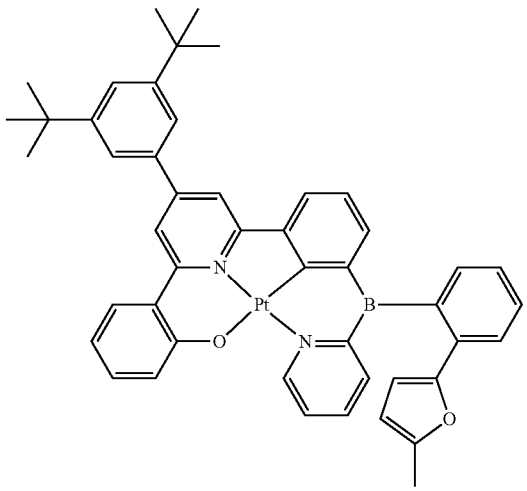
39
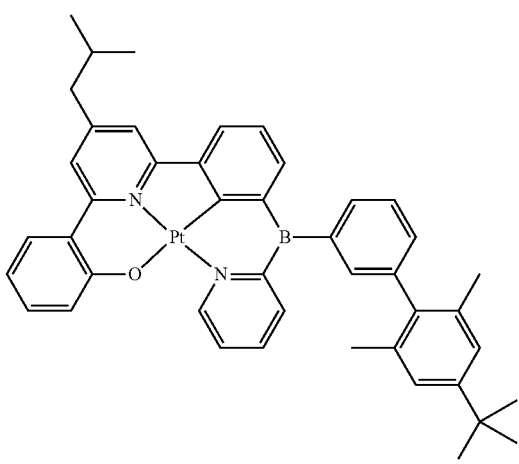
40
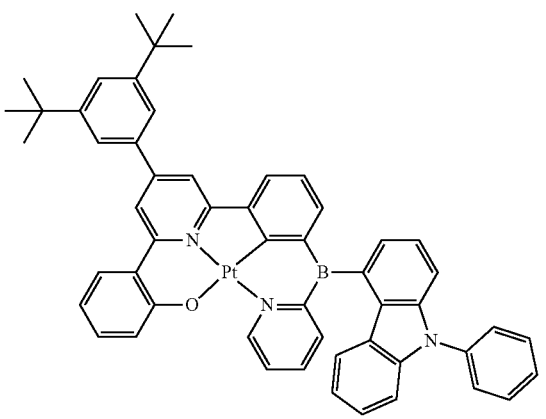

41
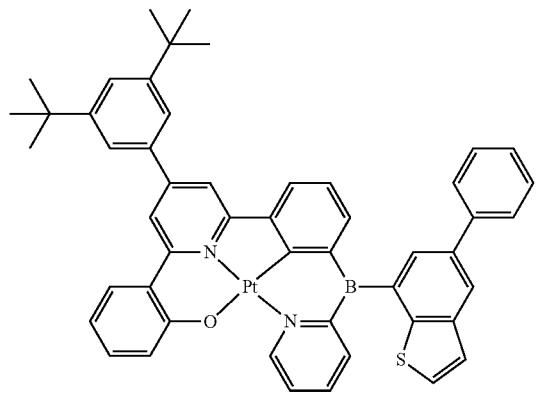
42
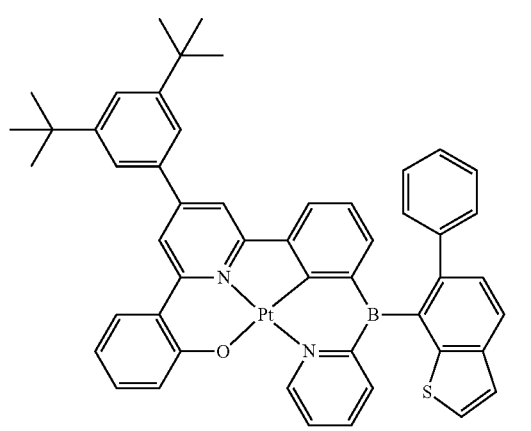
43
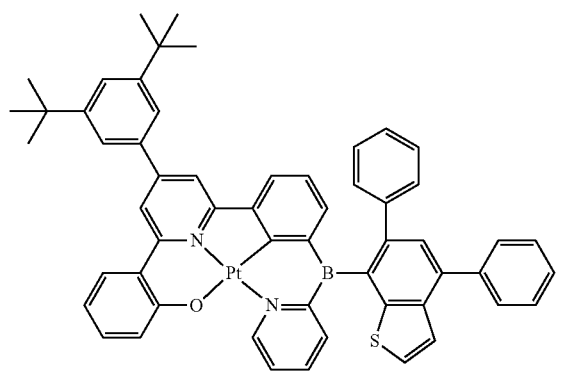
44
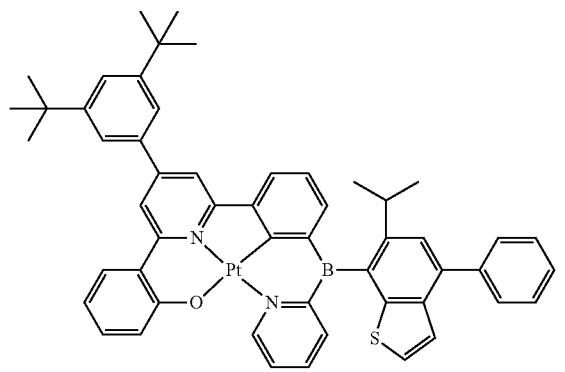
45
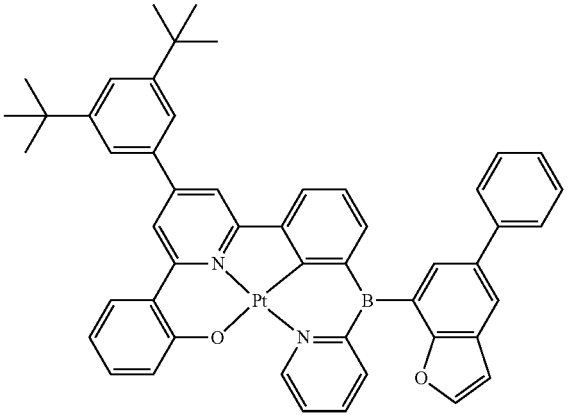
46
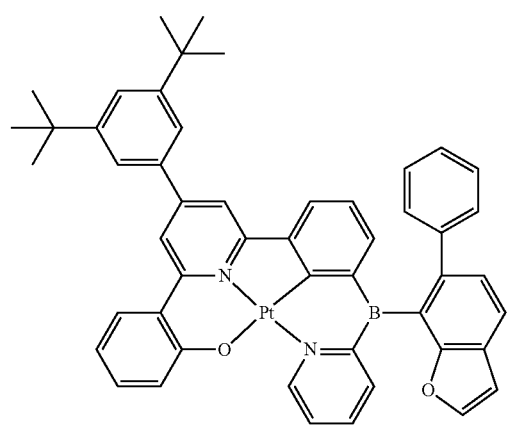
47
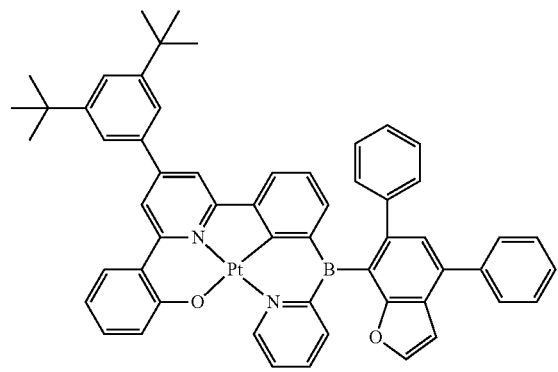
48
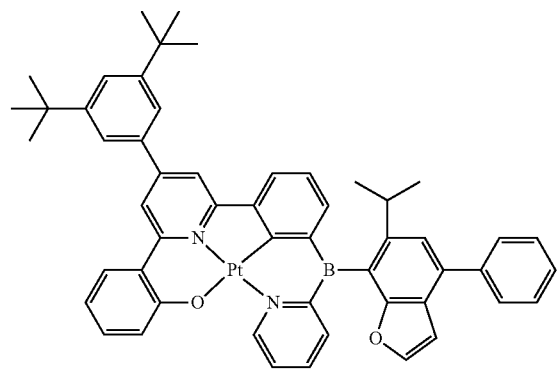

49
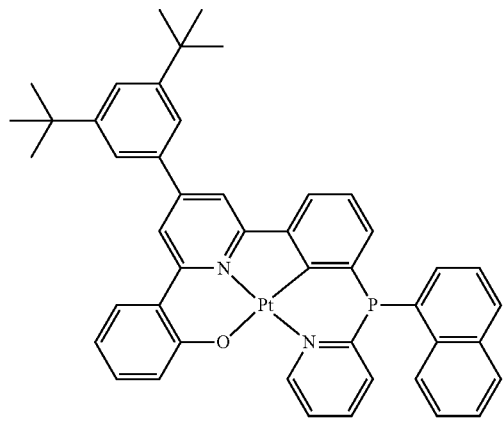
50
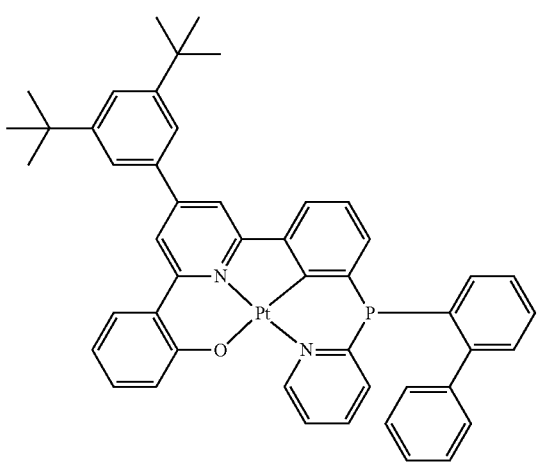
51
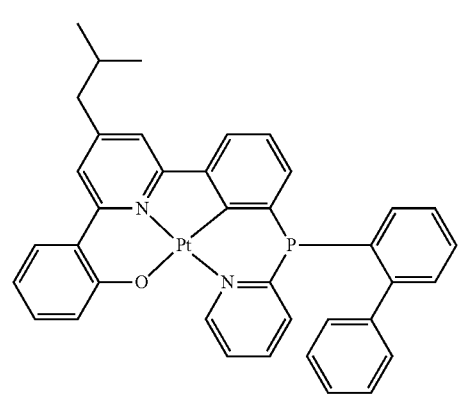
52
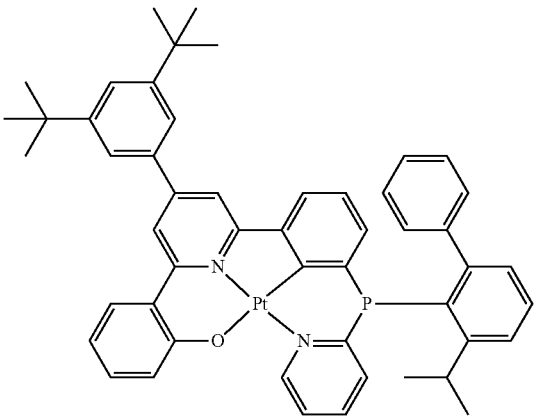
53
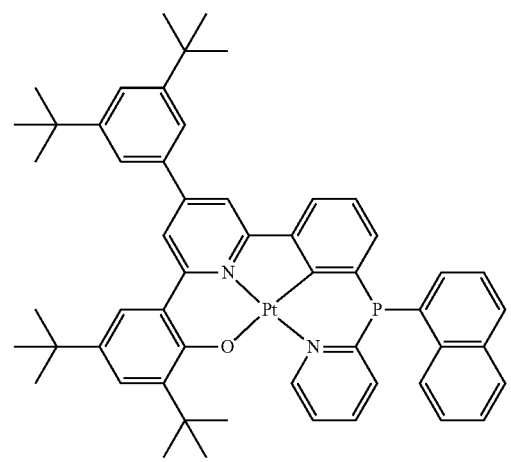
54
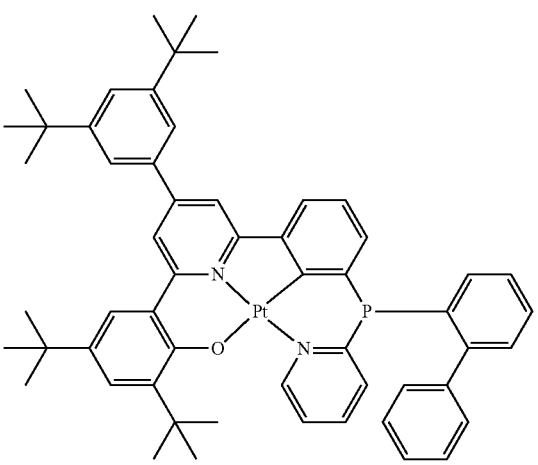

205
55
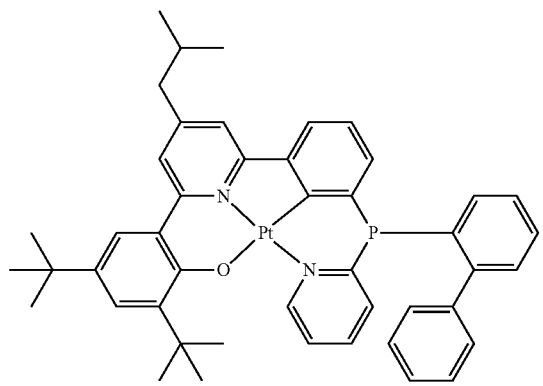
56
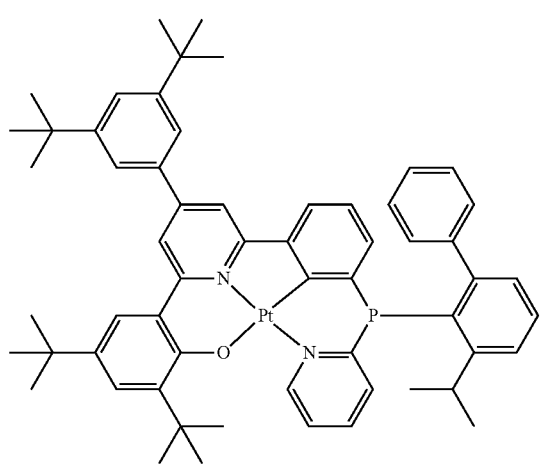
57
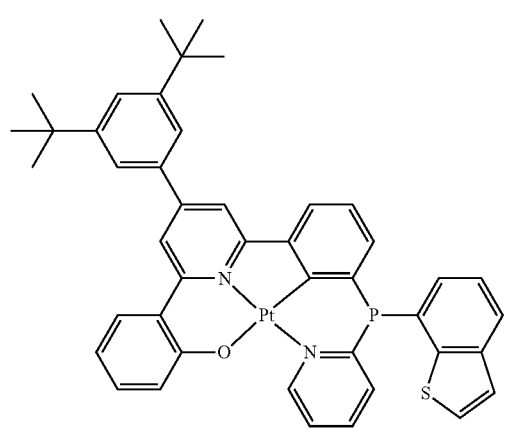
206
58
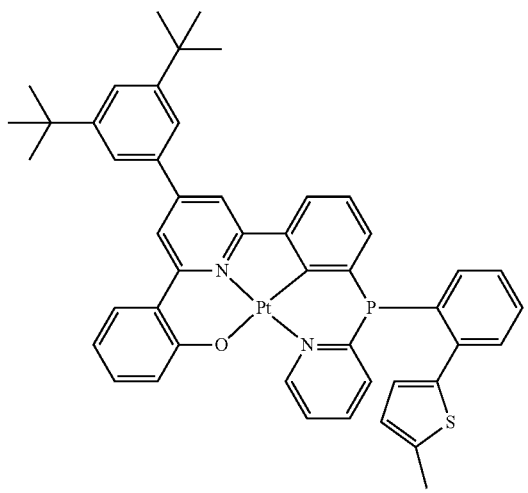
59
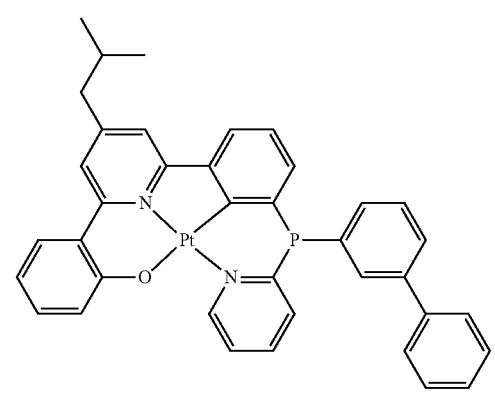
60
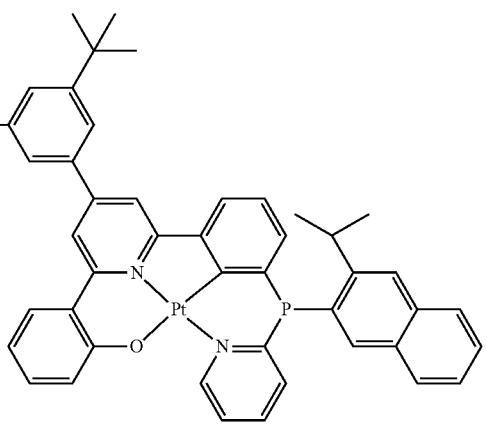

207
-continued
61
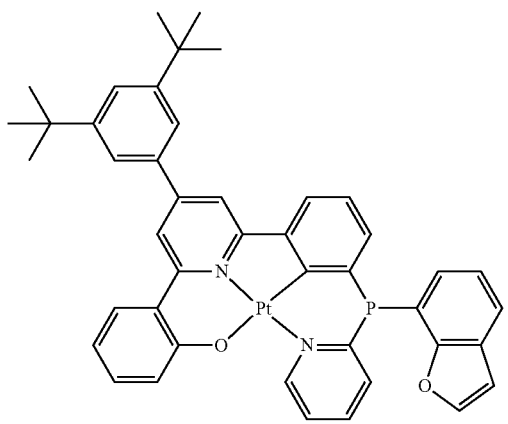
62
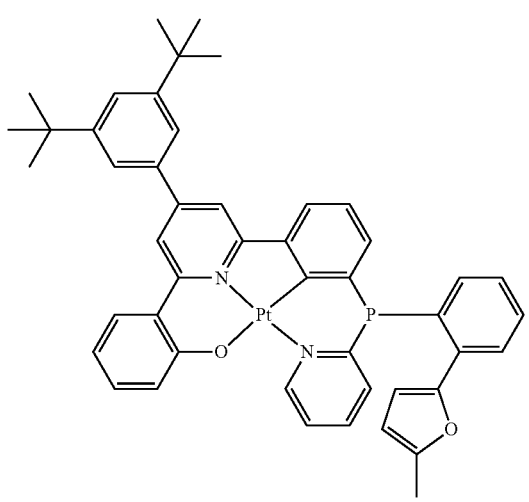
63
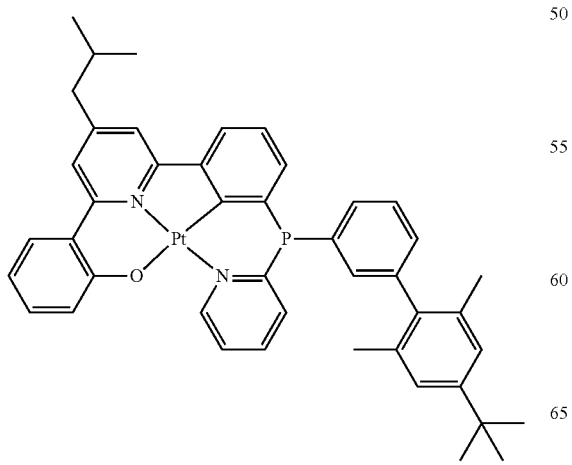
208
-continued
64
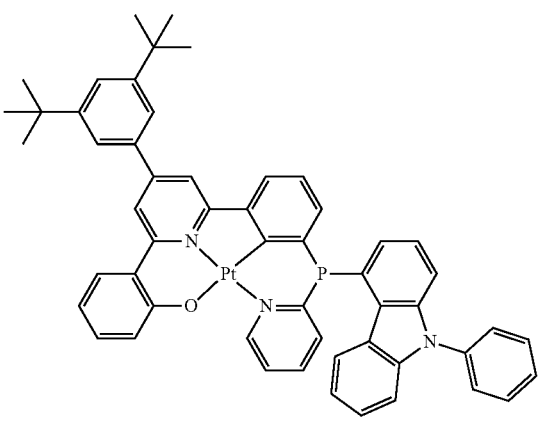
65
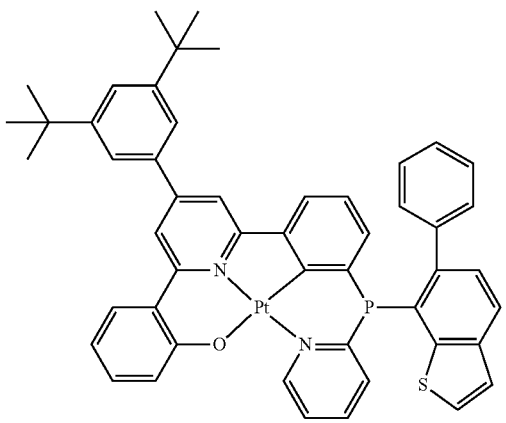
66

209
-continued

67
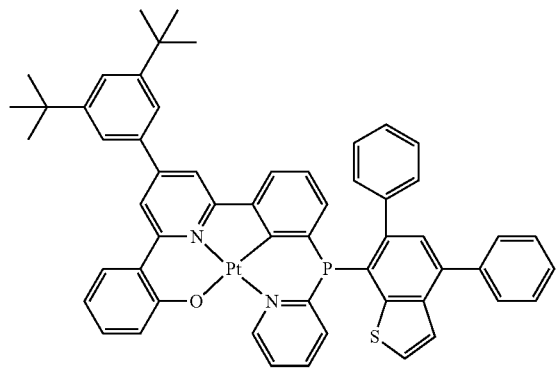

68
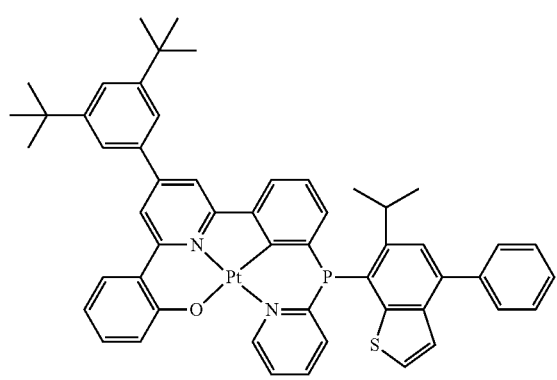

69
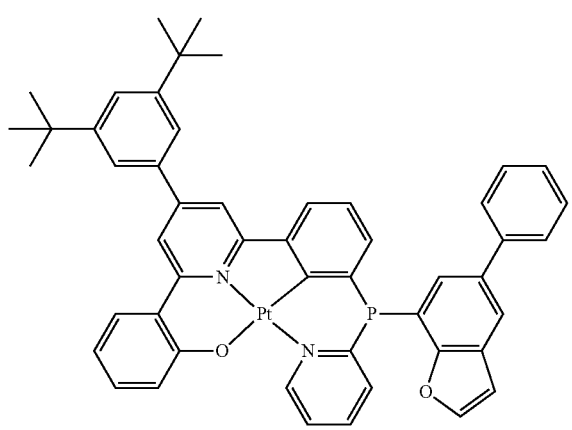

70
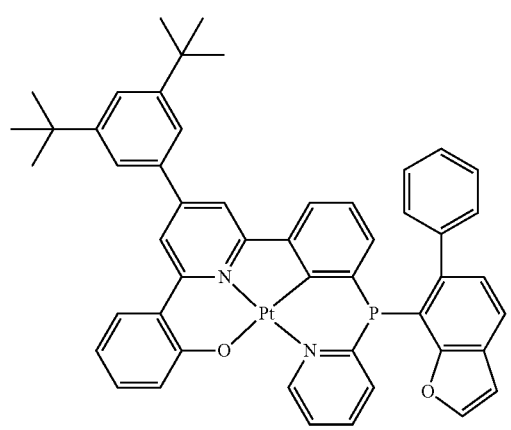

210
-continued

71
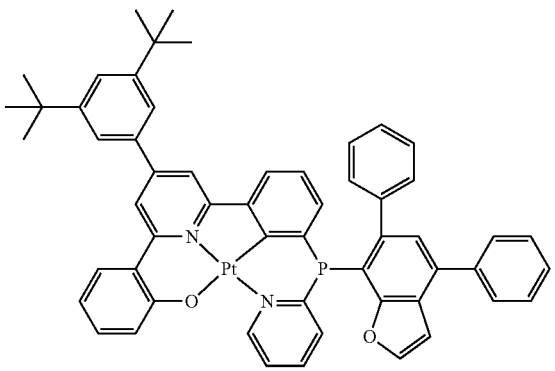

72
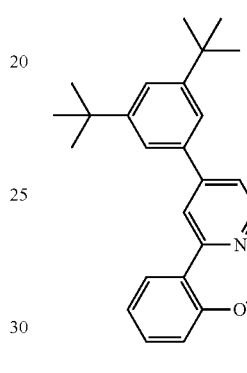

9. An organic light-emitting device comprising:
a first electrode;
a second electrode; and
an organic layer disposed between the first electrode and the second electrode,
wherein the organic layer comprises an emission layer and at least one organometallic compound of claim 1.

10. The organic light-emitting device of claim 9, wherein
the first electrode is an anode,
the second electrode is a cathode,
the organic layer further comprises a hole transport region disposed between the first electrode and the emission layer and an electron transport region disposed between the emission layer and the second electrode,
wherein the hole transport region comprises a hole injection layer, a hole transport layer, an electron blocking layer, or any combination thereof, and
wherein the electron transport region comprises a hole blocking layer, an electron transport layer, an electron injection layer, or any combination thereof.

11. The organic light-emitting device of claim 9, wherein the emission layer comprises the at least one organometallic compound.

12. The organic light-emitting device of claim 11, wherein the emission layer further comprises a host, and
an amount of the host is larger than an amount of the organometallic compound.

13. A diagnostic composition comprising at least one organometallic compound of claim 1.

* * * * *